(12) United States Patent
Hugon et al.

(10) Patent No.: US 10,794,974 B2
(45) Date of Patent: *Oct. 6, 2020

(54) METHODS AND APPARATUS FOR MAGNETIC FIELD SHIMMING

(71) Applicant: Hyperfine Research, Inc., Guilford, CT (US)

(72) Inventors: Cedric Hugon, Guilford, CT (US); Michael Stephen Poole, Guilford, CT (US); Tyler S. Ralston, Clinton, CT (US)

(73) Assignee: Hyperfine Research, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/746,736

(22) Filed: Jan. 17, 2020

(65) Prior Publication Data

US 2020/0150202 A1    May 14, 2020

Related U.S. Application Data

(63) Continuation of application No. 15/466,500, filed on Mar. 22, 2017, now Pat. No. 10,613,168.

(Continued)

(51) Int. Cl.
  *G01R 33/383*     (2006.01)
  *G01R 33/24*      (2006.01)
  (Continued)

(52) U.S. Cl.
  CPC ......... *G01R 33/383* (2013.01); *G01R 33/243* (2013.01); *G01R 33/381* (2013.01);
  (Continued)

(58) Field of Classification Search
  USPC ...................................................... 324/320
  See application file for complete search history.

(56) References Cited

U.S. PATENT DOCUMENTS 5,621,324 A * 4/1997 Ota ..................... A61B 5/055
                                                              324/319
5,623,207 A   4/1997 Weissenberger et al.
(Continued)

FOREIGN PATENT DOCUMENTS

CN    1534306 A    10/2004
CN    1606100 A     4/2005
(Continued)

OTHER PUBLICATIONS

Invitation to Pay Additional Fees for International Application No. PCT/US17/23583 dated Jun. 2, 2017.
(Continued)

*Primary Examiner* — Rodney E Fuller
(74) *Attorney, Agent, or Firm* — Wolf, Greenfield & Sacks, P.C.

(57) ABSTRACT

A method of producing a permanent magnet shim configured to improve a profile of a $B_0$ magnetic field produced by a $B_0$ magnet is provided. The method comprises determining deviation of the $B_0$ magnetic field from a desired $B_0$ magnetic field, determining a magnetic pattern that, when applied to magnetic material, produces a corrective magnetic field that corrects for at least some of the determined deviation, and applying the magnetic pattern to the magnetic material to produce the permanent magnet shim. According to some aspects, a permanent magnet shim for improving a profile of a $B_0$ magnetic field produced by a $B_0$ magnet is provided. The permanent magnet shim comprises magnetic material having a predetermined magnetic pattern applied thereto that produces a corrective magnetic field to improve the profile of the $B_0$ magnetic field.

52 Claims, 24 Drawing Sheets

Related U.S. Application Data

(60) Provisional application No. 62/311,821, filed on Mar. 22, 2016.

(51) Int. Cl.
*G01R 33/38* (2006.01)
*G01R 33/381* (2006.01)
*G01R 33/3873* (2006.01)
*G01R 33/44* (2006.01)
*H01F 7/02* (2006.01)
*H01F 7/06* (2006.01)
*H01F 13/00* (2006.01)

(52) U.S. Cl.
CPC ..... *G01R 33/3806* (2013.01); *G01R 33/3873* (2013.01); *G01R 33/445* (2013.01); *H01F 7/0278* (2013.01); *H01F 7/064* (2013.01); *H01F 13/003* (2013.01); *G01R 33/3802* (2013.01)

(56) References Cited

U.S. PATENT DOCUMENTS

| | | | |
|---|---|---|---|
| 5,635,839 A | 6/1997 | Srivastava et al. | |
| 6,023,165 A | 2/2000 | Damadian et al. | |
| 6,075,364 A | 6/2000 | Damadian et al. | |
| 6,150,820 A | 11/2000 | Damadian et al. | |
| 6,225,805 B1 | 5/2001 | Damadian et al. | |
| 6,288,546 B1 | 9/2001 | Damadian et al. | |
| 6,373,251 B1 | 4/2002 | Damadian et al. | |
| 6,400,156 B1 | 6/2002 | Damadian et al. | |
| 6,445,185 B1 | 9/2002 | Damadian et al. | |
| 6,507,192 B1 | 1/2003 | Damadian et al. | |
| 6,522,145 B1 | 2/2003 | Damadian et al. | |
| 6,621,267 B1 | 9/2003 | Damadian et al. | |
| 6,693,428 B2 | 2/2004 | Udo et al. | |
| 6,906,606 B2 * | 6/2005 | Jacobs | G01R 33/3873 324/319 |
| 7,148,890 B2 | 12/2006 | Rice et al. | |
| 7,417,426 B2 | 8/2008 | Race et al. | |
| 7,714,578 B2 | 5/2010 | Weiss | |
| 7,760,059 B2 * | 7/2010 | Higuchi | H01F 7/0278 335/306 |
| 7,843,196 B2 | 11/2010 | Teklemariam et al. | |
| 8,203,341 B2 | 6/2012 | Teklemariam et al. | |
| 8,624,599 B2 | 1/2014 | Kamlowski et al. | |
| 8,666,473 B2 | 3/2014 | Gleich | |
| 9,182,465 B2 | 11/2015 | Kimmlingen et al. | |
| 9,188,652 B2 | 11/2015 | Besio et al. | |
| 9,222,998 B2 | 12/2015 | Teklemariam et al. | |
| 9,255,978 B2 | 2/2016 | Fallone et al. | |
| 9,285,441 B1 | 3/2016 | McDowell | |
| 9,541,616 B2 | 1/2017 | Rothberg et al. | |
| 9,547,057 B2 | 1/2017 | Rearick et al. | |
| 9,625,543 B2 | 4/2017 | Rearick et al. | |
| 9,625,544 B2 | 4/2017 | Poole et al. | |
| 9,638,773 B2 | 5/2017 | Poole et al. | |
| 9,645,210 B2 | 5/2017 | McNulty et al. | |
| 9,709,643 B2 | 7/2017 | Fautz et al. | |
| 9,797,971 B2 | 10/2017 | Rearick et al. | |
| 9,817,093 B2 | 11/2017 | Rothberg et al. | |
| 10,139,464 B2 | 11/2018 | Rearick et al. | |
| 10,145,913 B2 | 12/2018 | Hugon et al. | |
| 10,145,922 B2 | 12/2018 | Rothberg et al. | |
| 10,222,434 B2 | 3/2019 | Poole et al. | |
| 10,222,435 B2 | 3/2019 | Mileski et al. | |
| 10,241,177 B2 | 3/2019 | Poole et al. | |
| 10,274,561 B2 | 4/2019 | Poole et al. | |
| 10,281,540 B2 | 5/2019 | Mileski et al. | |
| 10,281,541 B2 | 5/2019 | Poole et al. | |
| 10,295,628 B2 | 5/2019 | Mileski et al. | |
| 10,310,037 B2 | 6/2019 | McNulty et al. | |
| 10,324,147 B2 | 6/2019 | McNulty et al. | |
| 10,330,755 B2 | 6/2019 | Poole et al. | |
| 10,353,030 B2 | 7/2019 | Poole et al. | |
| 10,371,773 B2 | 8/2019 | Poole et al. | |
| 10,379,186 B2 | 8/2019 | Rothberg et al. | |
| 10,416,264 B2 | 9/2019 | Sofka et al. | |
| 10,444,310 B2 | 10/2019 | Poole et al. | |
| 10,466,327 B2 | 11/2019 | Rothberg et al. | |
| 10,488,482 B2 | 11/2019 | Rearick et al. | |
| 10,495,712 B2 | 12/2019 | Rothberg et al. | |
| 10,520,566 B2 | 12/2019 | Poole et al. | |
| 10,527,692 B2 | 1/2020 | McNulty et al. | |
| 10,534,058 B2 | 1/2020 | Sofka et al. | |
| 10,539,637 B2 | 1/2020 | Poole et al. | |
| 10,545,207 B2 | 1/2020 | Poole et al. | |
| 10,551,452 B2 | 2/2020 | Rearick et al. | |
| 10,564,239 B2 | 2/2020 | Poole et al. | |
| 10,591,561 B2 | 3/2020 | Sacolick et al. | |
| 10,613,168 B2 | 4/2020 | Hugon et al. | |
| 2004/0183536 A1 * | 9/2004 | Huang | G01R 33/3873 324/320 |
| 2004/0183636 A1 * | 9/2004 | Chapman | G01R 33/383 335/306 |
| 2005/0077899 A1 | 4/2005 | Jacobs | |
| 2005/0280487 A1 * | 12/2005 | Huang | G01R 33/3873 335/296 |
| 2008/0106263 A1 | 5/2008 | Fey et al. | |
| 2011/0175694 A1 | 7/2011 | Fallon et al. | |
| 2011/0260727 A1 | 10/2011 | Punchard et al. | |
| 2012/0249146 A1 | 10/2012 | Kimmlingen et al. | |
| 2014/0009152 A1 | 1/2014 | Sakakibara | |
| 2014/0132262 A1 | 5/2014 | Fautz et al. | |
| 2014/0229141 A1 | 8/2014 | Fallone et al. | |
| 2016/0069968 A1 | 3/2016 | Rothberg et al. | |
| 2016/0069970 A1 | 3/2016 | Rearick et al. | |
| 2016/0069971 A1 | 3/2016 | McNulty et al. | |
| 2016/0069972 A1 | 3/2016 | Poole et al. | |
| 2016/0069975 A1 | 3/2016 | Rothberg et al. | |
| 2016/0128592 A1 | 5/2016 | Rosen et al. | |
| 2016/0131727 A1 | 5/2016 | Sacolick et al. | |
| 2016/0169992 A1 | 6/2016 | Rothberg et al. | |
| 2016/0169993 A1 | 6/2016 | Rearick et al. | |
| 2016/0223631 A1 | 8/2016 | Poole et al. | |
| 2016/0231399 A1 | 8/2016 | Rothberg et al. | |
| 2016/0231402 A1 | 8/2016 | Rothberg et al. | |
| 2016/0231403 A1 | 8/2016 | Rothberg et al. | |
| 2016/0231404 A1 | 8/2016 | Rothberg et al. | |
| 2016/0299203 A1 | 10/2016 | Mileski et al. | |
| 2016/0334479 A1 | 11/2016 | Poole et al. | |
| 2017/0102443 A1 | 4/2017 | Rearick et al. | |
| 2017/0227616 A1 | 8/2017 | Poole et al. | |
| 2017/0276747 A1 * | 9/2017 | Hugon | H01F 13/003 |
| 2017/0276749 A1 | 9/2017 | Hugon et al. | |
| 2018/0024208 A1 | 1/2018 | Rothberg et al. | |
| 2018/0038931 A1 | 2/2018 | Rearick et al. | |
| 2018/0088193 A1 | 3/2018 | Rearick et al. | |
| 2018/0143274 A1 | 5/2018 | Poole et al. | |
| 2018/0143275 A1 | 5/2018 | Sofka et al. | |
| 2018/0143280 A1 | 5/2018 | Dyvorne et al. | |
| 2018/0143281 A1 | 5/2018 | Sofka et al. | |
| 2018/0144467 A1 | 5/2018 | Sofka et al. | |
| 2018/0156881 A1 | 6/2018 | Poole et al. | |
| 2018/0164390 A1 | 6/2018 | Poole et al. | |
| 2018/0168527 A1 | 6/2018 | Poole et al. | |
| 2018/0210047 A1 | 7/2018 | Poole et al. | |
| 2018/0224512 A1 | 8/2018 | Poole et al. | |
| 2018/0238978 A1 | 8/2018 | McNulty et al. | |
| 2018/0238980 A1 | 8/2018 | Poole et al. | |
| 2018/0238981 A1 | 8/2018 | Poole et al. | |
| 2019/0004130 A1 | 1/2019 | Poole et al. | |
| 2019/0011510 A1 | 1/2019 | Hugon et al. | |
| 2019/0011513 A1 | 1/2019 | Poole et al. | |
| 2019/0011514 A1 | 1/2019 | Poole et al. | |
| 2019/0011521 A1 | 1/2019 | Sofka et al. | |
| 2019/0018094 A1 | 1/2019 | Mileski et al. | |
| 2019/0018095 A1 | 1/2019 | Mileski et al. | |
| 2019/0018096 A1 | 1/2019 | Poole et al. | |
| 2019/0025389 A1 | 1/2019 | McNulty et al. | |
| 2019/0033402 A1 | 1/2019 | McNulty et al. | |
| 2019/0033414 A1 | 1/2019 | Sofka et al. | |
| 2019/0033415 A1 | 1/2019 | Sofka et al. | |

(56) References Cited

U.S. PATENT DOCUMENTS

| | | |
|---|---|---|
| 2019/0033416 A1 | 1/2019 | Rothberg et al. |
| 2019/0038233 A1 | 2/2019 | Poole et al. |
| 2019/0086497 A1 | 3/2019 | Rearick et al. |
| 2019/0101607 A1 | 4/2019 | Rothberg et al. |
| 2019/0162806 A1 | 5/2019 | Poole et al. |
| 2019/0178962 A1 | 6/2019 | Poole et al. |
| 2019/0178963 A1 | 6/2019 | Poole et al. |
| 2019/0227136 A1 | 7/2019 | Mileski et al. |
| 2019/0227137 A1 | 7/2019 | Mileski et al. |
| 2019/0250227 A1 | 8/2019 | McNulty et al. |
| 2019/0250228 A1 | 8/2019 | McNulty et al. |
| 2019/0257903 A1 | 8/2019 | Poole et al. |
| 2019/0324098 A1 | 10/2019 | McNulty et al. |
| 2019/0353720 A1 | 11/2019 | Dyvorne et al. |
| 2019/0353723 A1 | 11/2019 | Dyvorne et al. |
| 2019/0353726 A1 | 11/2019 | Poole et al. |
| 2019/0353727 A1 | 11/2019 | Dyvorne et al. |
| 2020/0011952 A1 | 1/2020 | Rothberg et al. |
| 2020/0018806 A1 | 1/2020 | Rothberg et al. |
| 2020/0022611 A1 | 1/2020 | Nelson et al. |
| 2020/0022612 A1 | 1/2020 | McNulty et al. |
| 2020/0022613 A1 | 1/2020 | Nelson et al. |
| 2020/0025846 A1 | 1/2020 | Nelson et al. |
| 2020/0025851 A1 | 1/2020 | Rearick et al. |
| 2020/0033431 A1 | 1/2020 | Schlemper et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |

FOREIGN PATENT DOCUMENTS

| | | |
|---|---|---|
| CN | 1798981 A | 7/2006 |
| CN | 1812886 A | 8/2006 |
| CN | 1841082 A | 10/2006 |
| CN | 101063707 A | 10/2007 |
| CN | 101223585 A | 7/2008 |
| CN | 100454035 C | 1/2009 |
| CN | 102456460 A | 5/2012 |
| CN | 202870284 U | 4/2013 |
| CN | 103442635 A | 12/2013 |
| EP | 0710851 A1 | 5/1996 |
| EP | 1557848 A2 | 7/2005 |
| TW | 200624787 A | 7/2006 |
| WO | WO 2015/043684 A1 | 4/2015 |
| WO | WO 2016/037028 A1 | 3/2016 |
| WO | WO 2017/165513 A1 | 9/2017 |

OTHER PUBLICATIONS

International Search Report and Written Opinion for International Application No. PCT/US17/23583 dated Jul. 26, 2017.

Extended European Search Report for European Application No. 17771054.8 dated Oct. 28, 2019.

Lopez et al., Passive shim design and a shimming approach for biplanar permanent magnetic resonance imaging magnets. IEEE transactions on magnetics. Feb. 22, 2008;44(3):394-402.

* cited by examiner

METHODS AND APPARATUS FOR MAGNETIC FIELD SHIMMING

CROSS-REFERENCE TO RELATED APPLICATIONS

This application claims the benefit under 35 U.S.C. § 120 and is a continuation application of U.S. patent application Ser. No. 15/466,500, filed Mar. 22, 2017, titled "METHODS AND APPARATUS FOR MAGNETIC FIELD SHIMMING," which claims priority under 35 U.S.C. § 119(e) to U.S. Provisional Patent Application No. 62/311,821, filed Mar. 22, 2016, titled "METHODS AND APPARATUS FOR MAGNETIC FIELD SHIMMING," each of which is hereby incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject being imaged to ionizing radiation, such as x-rays, or introducing radioactive material to the body). Additionally, MRI is capable of capturing information about structures and/or biological processes that other modalities are not well suited to acquire or are incapable of acquiring. For example, MRI is particularly well suited to provide contrast among soft tissues. However, there are a number of drawbacks to conventional MRI techniques that, for a given imaging application, may include the relatively high cost of the equipment, limited availability (e.g., difficulty and expense in gaining access to clinical MRI scanners), the length of the image acquisition process, etc.

The trend in clinical MRI has been to increase the field strength of MRI scanners to improve one or more of scan time, image resolution, and image contrast, which in turn drives up costs of MRI imaging. The vast majority of installed MRI scanners operate using at least at 1.5 or 3 tesla (T), which refers to the field strength of the main magnetic field $B_0$ of the scanner. A rough cost estimate for a clinical MRI scanner is on the order of one million dollars per tesla, which does not even factor in the substantial operation, service, and maintenance costs involved in operating such MRI scanners.

Additionally, conventional high-field MRI systems typically require large superconducting magnets and associated electronics to generate a strong uniform static magnetic field (B0) in which a subject (e.g., a patient) is imaged. Superconducting magnets further require cryogenic equipment to keep the conductors in a superconducting state. The size of such systems is considerable with a typical MRI installment including multiple rooms for the magnetic components, electronics, thermal management system, and control console areas, including a specially shielded room to isolate the magnetic components of the MRI system. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but is impractical or impossible due to the above-described limitations and as discussed in further detail below.

SUMMARY

Some embodiments include a method of producing a permanent magnet shim configured to improve a profile of a $B_0$ magnetic field produced by a $B_0$ magnet, comprising determining deviation of the $B_0$ magnetic field from a desired $B_0$ magnetic field, determining a magnetic pattern that, when applied to magnetic material, produces a corrective magnetic field that corrects for at least some of the determined deviation, and applying the magnetic pattern to the magnetic material to produce the permanent magnet shim.

Some embodiments include a permanent magnet shim for improving a profile of a $B_0$ magnetic field produced by a $B_0$ magnet, the permanent magnet shim comprising magnetic material having a predetermined magnetic pattern applied thereto that produces a corrective magnetic field to improve the profile of the $B_0$ magnetic field.

Some embodiments include a low-field magnetic resonance imaging system comprising a $B_0$ magnet configured to produce a $B_0$ magnetic field at a field strength of less than or equal to approximately 0.2 T, and at least one permanent magnet shim comprising magnetic material having a predetermined magnetic pattern applied thereto that produces a corrective magnetic field to improve a profile of the $B_0$ magnetic field.

Some embodiments include a system for producing a permanent magnet shim to improve a profile of a $B_0$ magnetic field produced by a $B_0$ magnet, the system comprising a support frame configured to accommodate magnetic material to be magnetized to produce the permanent magnet shim, at least one magnetizing head capable of producing a magnetic field sufficient to magnetize logically partitioned regions of the magnetic material, and at least one controller configured to automatically position the magnetizing head proximate the magnetic material at successive locations to magnetize the magnetic material in accordance with a desired magnetic pattern that produces a corrective magnetic field to improve the profile of the $B_0$ magnetic field.

Some embodiments include a permanent magnet shim for adjusting a $B_0$ magnetic field produced by a B0 magnet, the permanent magnet shim comprising at least one sheet of magnetic material logically partitioned into a plurality of regions, wherein the plurality of regions are selectively magnetized in accordance with a predetermined pattern to produce a magnetic field to adjust the $B_0$ magnetic field produced by the B0 magnet.

Some embodiments include a method of producing a shim from magnetic material to adjust a $B_0$ magnetic field produced by a B0 magnet, the method comprising measuring a $B_0$ magnetic field produced by the B0 magnet, determining a corrective magnetic field to improve a profile of the $B_0$ magnetic field, determining a magnetic pattern that when applied to the magnetic material produces, at least in part, the corrective magnetic field, and magnetizing regions of the magnetic material in accordance with the magnetic pattern.

Some embodiments include a system for producing a permanent magnet shim to adjust a $B_0$ magnetic field produced by a B0 magnet, the system comprising a support frame configured to accommodate magnetic material to be magnetized to produce the permanent magnet shim, at least one magnetizing head capable of producing a magnetic field sufficient to magnetize regions of the magnetic material, and at least one controller configured to automatically position the magnetizing head proximate the magnetic material at successive locations to magnetize the magnetic material in accordance with a desired pattern.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1A:
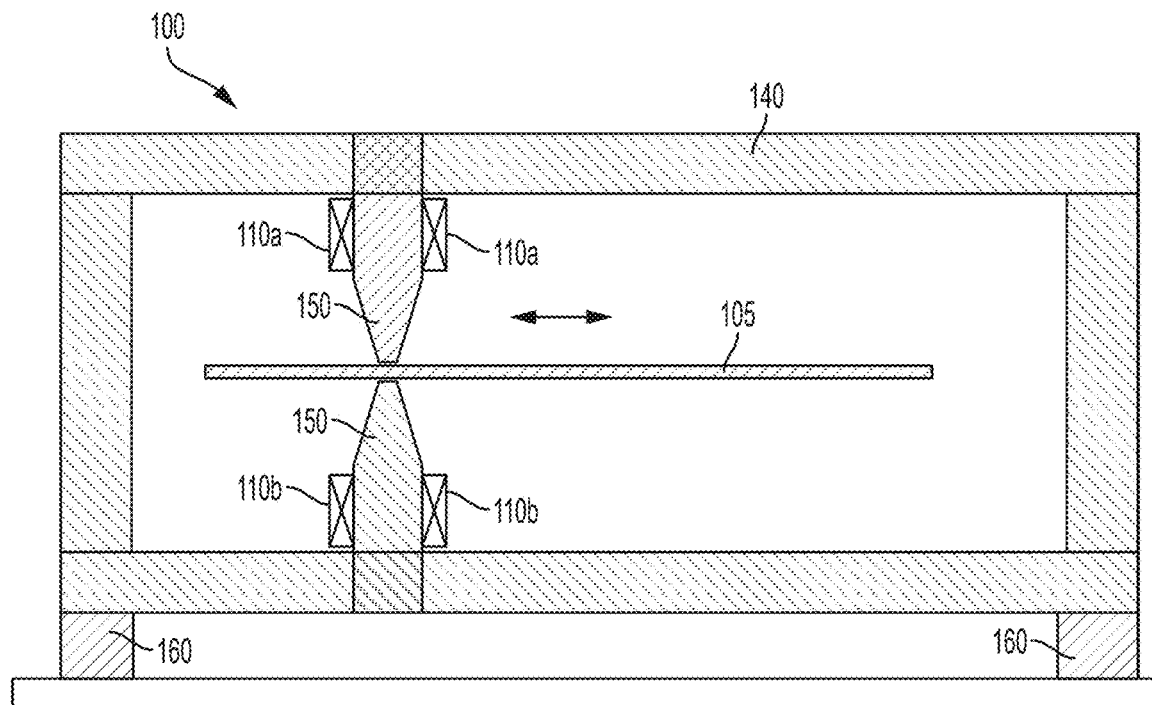
FIGS. 1A and 1B illustrate side and top views, respectively, of an automated device for magnetizing material according to a desired pattern, in accordance with some embodiments.

In general, a $B_0$ magnet requires some level of shimming to produce a $B_0$ magnetic field with a profile (e.g., a B0 magnetic field at the desired field strength and/or homogeneity) satisfactory for use in MRI. Shimming refers to any of various techniques for adjusting, correcting and/or improving a magnetic field, often the $B_0$ magnetic field of a magnetic resonance imaging device. Similarly, a shim refers to something (e.g., an object, component, device, system or combination thereof) that performs shimming (e.g., by producing, altering or otherwise modifying a magnetic field). Conventional techniques for shimming are relatively time and/or cost intensive, often requiring significant manual effort by an expert in order to adjust the $B_0$ magnetic field so that it is suitable for its intended purpose. The inventors have developed a number of techniques that, according to some embodiments, facilitate more efficient and/or cost effective shimming for a $B_0$ magnet for MRI. Some embodiments are suitable for use in low-field MRI, but the techniques described herein are not limited for use in the low-field context The MRI scanner market is overwhelmingly dominated by high-field systems, and particularly for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ magnetic field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ magnetic field of less than or equal to approximately 0.2 T, though systems having a $B_0$ magnetic field of between 0.2 T and approximately 0.3 T have sometimes been characterized as low-field as a consequence of increased field strengths at the high end of the high-field regime. Within the low-field regime, low-field MRI systems operating with a $B_0$ magnetic field of less than 0.1 T are referred to herein as "very low-field" and low-field MRI systems operating with a $B_0$ magnetic field of less than 10 mT are referred to herein as "ultra-low field."

The appeal of high-field MRI systems includes improved resolution and/or reduced scan times relative to lower field systems, motivating the push for higher and higher field strengths for use in clinical and medical MRI applications. As discussed above, however, increasing the field strength of MRI systems increases the cost and complexity of MRI scanners, thus limiting their availability and preventing their use as a general-purpose and/or generally-available imaging solution. As discussed above, significant contributors to the high cost of high-field MRI are expensive superconducting wires and the cryogenic cooling systems needed to keep the wires in a superconducting state. For example, the $B_0$ magnet for high field MRI systems frequently employ superconducting wire that is not only itself expensive, but requires expensive and complicated cryogenic equipment to maintain the superconducting state.

Low-field MRI presents an attractive imaging solution, providing a relatively low cost, high availability alternative to high-field MRI that can eliminate many of the factors contributing to the expense, complexity and lack of availability of high-field MRI. A relatively significant factor contributing to the high cost of high-field MRI includes the expense of post-production field correction of the B0 magnetic field. In particular, conventional shimming techniques used after manufacture and assembly of a $B_0$ magnet to adjust the magnetic field produced by the $B_0$ magnet are time consuming and expensive. More particularly, when a $B_0$ magnet is manufactured, it will typically not produce a $B_0$ magnetic field with the desired profile (e.g., desired field homogeneity) to the level of precision required. In particular, factors including design, manufacturing tolerances, environment, etc., give rise to field variation that generally ensures that the $B_0$ magnetic field will have an unsatisfactory profile after assembly.

As a result, correction of the $B_0$ magnetic field produced by a $B_0$ magnet is generally required before the MRI system can be deployed and operated. To correct the $B_0$ magnetic field, conventional shimming techniques typically employ a manual shimming process requiring substantial time on the part of an expert, which in turn, incurs significant costs. For example, conventional shimming techniques typically involve an iterative process by which the $B_0$ magnetic field is measured, the necessary corrections are determined and deployed, and the process repeated until a satisfactory $B_0$ magnetic field is produced. This iterative process is conventionally performed with substantial manual involvement, requiring expertise and significant time (e.g., a day at a minimum, and more typically, longer).

Another shimming technique involves providing an array of correction coils or shim coils (e.g., radio frequency magnetic coils) arranged in space relative to the field of view of the MRI system. Based on the measured $B_0$ magnetic field of an assembled $B_0$ magnet and the field correction computed therefrom, appropriate currents are computed and applied to the corresponding correction coils to adjust the $B_0$ magnetic field so that a satisfactory $B_0$ magnetic field is produced. While this solution is relatively straightforward and reduces the time needed to perform $B_0$ magnetic field correction, the array of correction coils takes up space, consumes power and increases cost. In particular, correction coils typically require current supplies with strict stability requirements. Such current supplies are generally expensive and consume relatively significant amounts of power. Additionally, correction coils and the associated current supplies typically also must be designed to withstand potentially high voltages induced by gradient coils during operation. As a result, shimming via correction coils typically involves these drawbacks, making them a less attractive solution for some systems, though suitable for some as well.

As discussed above, conventional shimming techniques used, for example, in high-field MRI often involve significant expert contribution. One such technique, referred to as passive shimming, involves adding pieces of steel to adjust the $B_0$ magnetic field as needed to correct the main magnetic field, typically by meticulously arranging the steel pieces about the bore of the MRI device at positions calculated by an expert. For example, an MRI device may be produced with a series of trays arranged to hold steel "tokens" (i.e., pieces of steel that, when magnetized, produce a known magnetic field) that can be manually placed at specific locations to adjust the B0 magnetic field to produce a satisfactory field profile. The steel tokens are magnetized by the main magnetic field of the system without requiring further power input.

However, the process of manually placing tokens proximate the $B_0$ magnet (e.g., about the bore) is time consuming and generally requires an expert to be available to perform this shimming process. A further drawback of such passive shimming techniques, particularly in the high-field context, is that $B_0$ magnetic field adjustment is limited to the direction of the $B_0$ magnetic field. Specifically, as discussed above, such passive shims are magnetized by $B_0$ magnetic field and therefore produce a magnetic field in the same direction. Magnetic field contributions are generally not possible in other directions because, for example, if pre-magnetized shims of typical materials were provided to produce magnetic fields in other directions, the relatively high field strengths of conventional MRI systems generally provide sufficient coercive force to realign the magnetic fields of such passive shims in the direction of the $B_0$ magnetic field. Accordingly, the technique of positioning ferromagnetic material proximate the $B_0$ magnet in conventional MRI systems is generally limited to corrective fields oriented in the same direction as the main $B_0$ magnetic field.

Furthermore, in addition to conventional passive shimming techniques being time consuming and expensive, there are further challenges for their use, particularly in the low-field context. In particular, at the low-fields characteristic of low-field MRI, frequently used material for passive shims (e.g., steel) may not be driven to saturation by the low field strengths of the target $B_0$ magnetic field (e.g., field strength in the 10-50 mT range, as a non-limiting example), resulting in non-linear magnetic behavior that complicates the shimming process and/or makes it difficult (or potentially impossible) to employ satisfactorily. Thus, conventional passive shimming techniques may be unsuitable for low-field MRI for this additional reason.

The inventors have appreciated that permanent magnet shims may be utilized in many low-field contexts in any orientation, providing a measure of flexibility and precision in correcting the $B_0$ magnetic field of a low-field MRI device. Such passive shimming techniques are generally not available in the high-field context due to the high magnetic field strengths produced by the $B_0$ magnet that, for example, aligns the magnetization of magnetic material in the direction of the $B_0$ magnetic field. A permanent magnet refers to any object or material that maintains its own persistent magnetic field once magnetized. Materials that can be magnetized to produce a permanent magnet are referred to herein as ferromagnetic, or simply magnetic, and include, as non-limiting examples, iron, nickel, cobalt, neodymium (NdFeB) alloys, samarium cobalt (SmCo) alloys, alnico (AlNiCo) alloys, strontium ferrite, barium ferrite, etc. Permanent magnet material (e.g., magnetizable material that has been driven to saturation by a magnetizing field) retains its magnetic field when the driving field is removed. The amount of magnetization retained by a particular material is referred to as the material's remanence. The strength of a magnetic field in the opposing direction needed to demagnetize material once it has been driven to saturation is referred to as the coercivity of the material.

Because the low field strengths characteristic of some exemplary low-field MRI systems are typically insufficient to exceed the coercivity of most commonly used magnetic material, permanent magnet shims can be arranged in orientations other than along the B0 magnetic field without being demagnetized or re-magnetized in alignment with the $B_0$ magnetic field. For example, permanent magnet shims can be used to adjust the $B_0$ magnetic field of a low-field MRI system in the direction of the $B_0$ magnetic field, opposite the $B_0$ magnetic field, parallel or transverse to the $B_0$ magnetic field, or in directions or orientations between, significantly expanding the space of solutions for correcting the $B_0$ magnetic field. According to some embodiments, at least one permanent magnet shim is arranged to produce a magnetic field that is not aligned with the $B_0$ magnetic field to facilitate correction of the $B_0$ magnetic field produced by a low-field MRI system. This technique is not limited to the low-field context to the extent that the strength of the $B_0$ magnetic field remains insufficient to re-magnetize the shim in the direction of the $B_0$ magnetic field.

As discussed above, many conventional shimming techniques require extensive manual involvement in assessing and correcting unsatisfactory magnetic field variation produced by the B0 magnet of an MRI system (e.g., an uncorrected $B_0$ magnet post-production). The inventors have developed techniques to minimize the manual effort involved in correcting the $B_0$ magnetic field produced by a $B_0$ magnet, for example, correcting at least some field inhomogeneity resulting from imperfect manufacturing processes. In particular, the inventors have developed automated techniques for patterning magnetic material to provide field correction to the $B_0$ magnetic field produced by a $B_0$ magnet. The term automated or automatically refers to processes that perform the substance of a given act or function substantially without human involvement. While a human may be involved in an automated process, e.g., by having programmed a device to perform given act(s) or function(s), or by providing data to the device, instructing or engaging the device to perform the automated process, the substantive of the automated process, act or function is performed by the device and not by a human. A number of exemplary automated processes for automatically applying a magnetic pattern to magnetic material to produce, at least in part, a permanent magnetic shim are discussed in further detail below.

According to some embodiments, an un-magnetized sheet of material is magnetized in a pattern configured to improve the profile of a $B_0$ magnetic field produced by an MRI system (e.g., a low-field MRI system). For example, the sheet of un-magnetized material may be magnetized by an automated magnetizing head that can be programmed to magnetize the material in a desired pattern to produce a magnetic field that improves the profile of a $B_0$ magnetic field (e.g., improve $B_0$ magnetic field homogeneity) produced by a $B_0$ magnet of the MRI system. In some embodiments, the un-magnetized regions (i.e., regions outside the magnetization pattern) remain as-is and their magnetization in the $B_0$ magnetic field, to the extent that it occurs, is taken into account when determining the magnetic pattern to apply to the material via the automated magnetizing head. In other embodiments, the un-magnetized regions are removed (e.g., via cutting) prior to incorporating the resulting shim into the system, for example, a low-field MRI system.

According to other embodiments, a desired pattern of magnetization is achieved by an automated magnetizing head that operates on a magnetized piece of material to orient the magnetic field at discrete locations so that the resulting magnetic pattern produces a magnetic field that improves the profile of a $B_0$ magnetic field produced by a B0 magnet of an MRI system. For example, a piece of material may be initially magnetized with alternating polarization at a high spatial frequency so that the magnetic fields produced cancel out at short distances from the material. Thus, while maximally magnetized (e.g., saturated), the magnetized material will appear un-magnetized in the region of interest of the $B_0$ magnetic field (e.g., within the field of view of an MRI system). To apply a desired magnetic pattern to the material, an automated magnetizing system may control a magnetizing head to magnetize the material in accordance with a desired pattern, while leaving the remaining material untouched so that the high spatial frequency polarization is retained in these regions. In this way, when the patterned shim is added to the system, these regions will not affect the magnetic field in the region of interest but, being magnetized, will be less susceptible to the influence of the $B_0$ magnetic field of the MRI system.

According to some embodiments, a magnetic pattern is applied to magnetic material using an automated subtractive process. For example, magnetic material may be patterned using automated cutting techniques (e.g., using a computer numerical control (CNC) router, laser cutter, etc.) to produce a pattern of magnetized material that improves the profile of a $B_0$ magnetic field produced by a $B_0$ magnet of an MRI system. For example, instead of magnetizing permanent magnetic material according to a desired pattern, pre-magnetized material may be cut in accordance with the magnetic pattern so that remaining material produces a desired magnetic field to facilitate correction of the $B_0$ magnetic field produced by a B0 magnet (e.g., a B0 magnet of a low-field MRI device). Alternatively, the magnetic material may be magnetized after the magnetic material has been patterned by cutting the magnetic material in accordance with the determined pattern configured to improve the profile of the $B_0$ magnetic field produced by the $B_0$ magnet. Other automated subtractive processes include any of various subtractive 3D printing process, etc.

In some circumstances, a magnetic pattern determined to improve the profile of a B0 magnetic field may be disconnected so that the resulting material, after cutting or otherwise removing material, has a plurality of separate unconnected regions. To address these circumstances, the magnetic material may first be bonded to a substrate layer that is not cut, or not fully cut, during the process of patterning the magnetic material such that unconnected regions maintain their relationship to each other so that the desired corrective magnetic field is produced. Alternatively, the same pattern to which the magnetic material is cut may be traced onto a substrate (e.g., an adhesive substrate) and the machined pieces may be affixed to the substrate at the position of the corresponding trace. Other techniques for allowing unconnected pieces of magnetic material to be arranged according to the determined pattern may also be used, as the aspects are not limited in this respect.

According to some embodiments, a magnetic pattern determined to improve the profile of a $B_0$ magnetic field may be applied to magnetic material to produce a permanent magnet shim using one or more automated additive processes. For example, a magnetic pattern may be applied to magnetic material using any of various additive 3D printing techniques that apply magnetic material at locations and in amounts in accordance with the magnetic pattern. Another example of an automated additive process includes any number of spraying techniques such as cold spraying, thermal spraying (e.g., plasma spraying, arc spraying etc.), etc., that are capable of depositing magnetic material on a substrate in accordance with the desired magnetic pattern. For example, using cold spraying, also known as gas dynamic spraying, magnetic material (e.g., a ferromagnetic powder) may be deposited on a substrate via a gas jet to coat the substrate in accordance with the magnetic pattern. It should be appreciated that a combination of additive and subtractive techniques may be used as well, as the aspects are not limited in this respect.

According to some embodiments, a permanent magnet shim is produced for use with an ultra low-field MRI system having a $B_0$ magnetic field less than 10 mT (e.g., greater than or equal to approximately 6.5 mT and less than or equal to approximately 10 mT). According to some embodiments, a permanent magnet shim is produced for use with a very low-field MRI system having a $B_0$ magnetic field greater than or equal to approximately 10 mT and less than or equal to approximately 20 mT. According to some embodiments, a permanent magnet shim is produced for use with a very low-field MRI system having a $B_0$ magnetic field greater than or equal to approximately 20 mT and less than or equal to approximately 50 mT. According to some embodiments, a permanent magnet shim is produced for use with a very low-field MRI system having a $B_0$ magnetic field greater than or equal to approximately 50 mT and less than or equal to approximately 0.1 T. According to some embodiments, a permanent magnet shim is produced for use with a low-field MRI system having a $B_0$ magnetic field greater than or equal to approximately 0.1 T and less than or equal to approximately 0.2 T. According to some embodiments, a permanent magnet shim is produced for use with an MRI system having a $B_0$ magnetic field greater than or equal to approximately 0.2 T and less than or equal to approximately 0.3 T. According to some embodiments, a permanent magnet shim is produced for use with an MRI system having a $B_0$ magnetic field greater than 0.3 T, for example, up to 0.5 T. According to some embodiments, a permanent magnet shim is produced for use with an MRI system having a $B_0$ magnetic field greater than 0.5 T, for example, for a mid-field or high-field MRI system.

Following below are more detailed descriptions of various concepts related to, and embodiments of, shimming techniques for use in, for example, improving the profile of a $B_0$ magnetic field of an MRI system. While some of the techniques described herein are well suited for low-field MRI, the techniques described herein are not limited for use in the low-field context. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 1B:
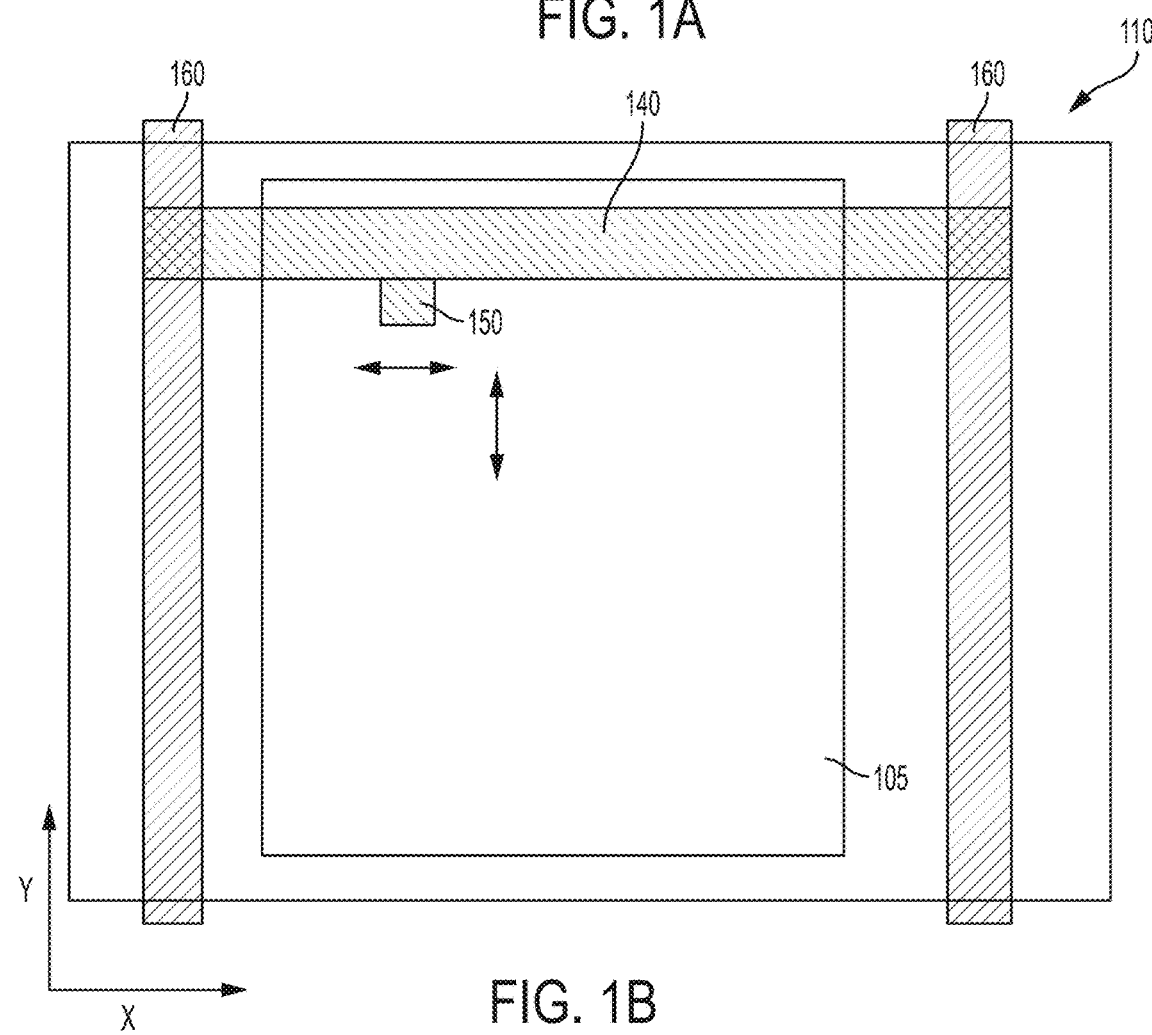

FIGS. 1A and 1B illustrate side and top views, respectively, of an automated system for magnetizing material in a desired pattern, in accordance with some embodiments. System 100 may be used, for example, to produce a permanent magnet shim to correct the $B_0$ magnetic field produced by an MRI system, for example, a low-field MRI system. In FIGS. 1A and 1B, system 100 includes a magnetizing head 150 magnetically coupled to magnetic coils 110, each configured to produce a magnetic field that is channeled through magnetizing head 150 to magnetize material 105 (e.g., a sheet of permanent magnet material such as hard ferrite, rare earth magnets or other suitable material that is initially not magnetized, or pre-magnetized with high spatial frequency, as discussed in further detail below) at locations between the tips (also referred to herein as "poles") of magnetizing head 150. Magnetization of material 105 should be localized to the gap between the tips of the magnetizing head 150 to avoid magnetizing unintended portions of the material 105. To achieve this, frame 140, constructed of any suitable magnetic material, forms a magnetic circuit to provide a return path for the magnetic flux and operates to confine the magnetic fields generated by coils 110. The magnetic circuit includes the magnetizing head 150, formed with a pole gap, that focuses the magnetic fields to provide enhanced flux density between the poles of the magnetizing head 150 sufficient to magnetize the material in the localized region provided there between.

To magnetize a material, it is generally recommended to apply a magnetizing field at least three times the coercive field for the particular material used. The inventors have recognized that the low field strengths involved in some exemplary low-field MRI system facilitate the use of materials needing a weaker magnetic field to magnetize, thus eliminating constraints on the types of material that can be used. For example, material such as neodymium (NdFeB) may be used, though such material usually require fields in excess of 3 T. Additionally, hard ferrites such as strontium or barium ferrites, which can be magnetized at field strengths of ~1 T (which are more easily generated), may be utilized in the low-field context. These materials are widely available, relatively inexpensive and can be produced in various forms, including flexible sheets that are relatively easy to cut and form into desired geometries, making them attractive permanent magnet material in this respect. However, any suitable material may be used, as the techniques described herein are not limited for use with any particular type or types of magnetic material.

According to some embodiments, to facilitate the use of stronger magnetic materials (e.g., materials with higher coercivity and remanence values), the material may be heated to reduce the strength of the magnetic field needed to magnetize the material. For example, the material may be heated locally (e.g., via laser or induction heating) so that the magnetizing head can magnetize the material in the heated region using a reduce strength magnetic field. Alternatively, the entire sheet of material may be heated, as the aspects are not limited in this respect. As a result, materials that may not be suitable at regular temperatures due to the high magnetic field strengths required, may be utilized via heat assisted magnetizing techniques.

The magnetizing head 150 may be movably coupled to the frame 140 so that the head can be translated over the surface of material 105 as desired (see e.g., the direction arrows illustrated in FIG. 1B). For example, magnetizing head 150 may be translated using one or more linear stages so that control of the magnetizing head can be automated. According to some embodiments, a desired pattern for the magnetizing head can be input to the system and a control program can control the one or more linear stages to translate the magnetizing head so that it traces the desired pattern over the surface of material 105. Magnetizing head 150 may also be controlled in the vertical direction to increase the distance between the poles (e.g., to move the poles away from material 105) to prevent magnetization of material 105 at certain locations as the magnetizing head is translated. This allows for desired locations to be skipped over, permitting the magnetization of patterns that are not continuous. Alternatively, the magnetization process may also be ceased at desired locations by controlling the coils 110 so that they do not generate magnetic fields when the magnetizing head is positioned at locations where no magnetization is desired. According to some embodiments, none, one or both of these techniques may be used to produce a desired pattern of magnetization on material 105.

Figure 2:
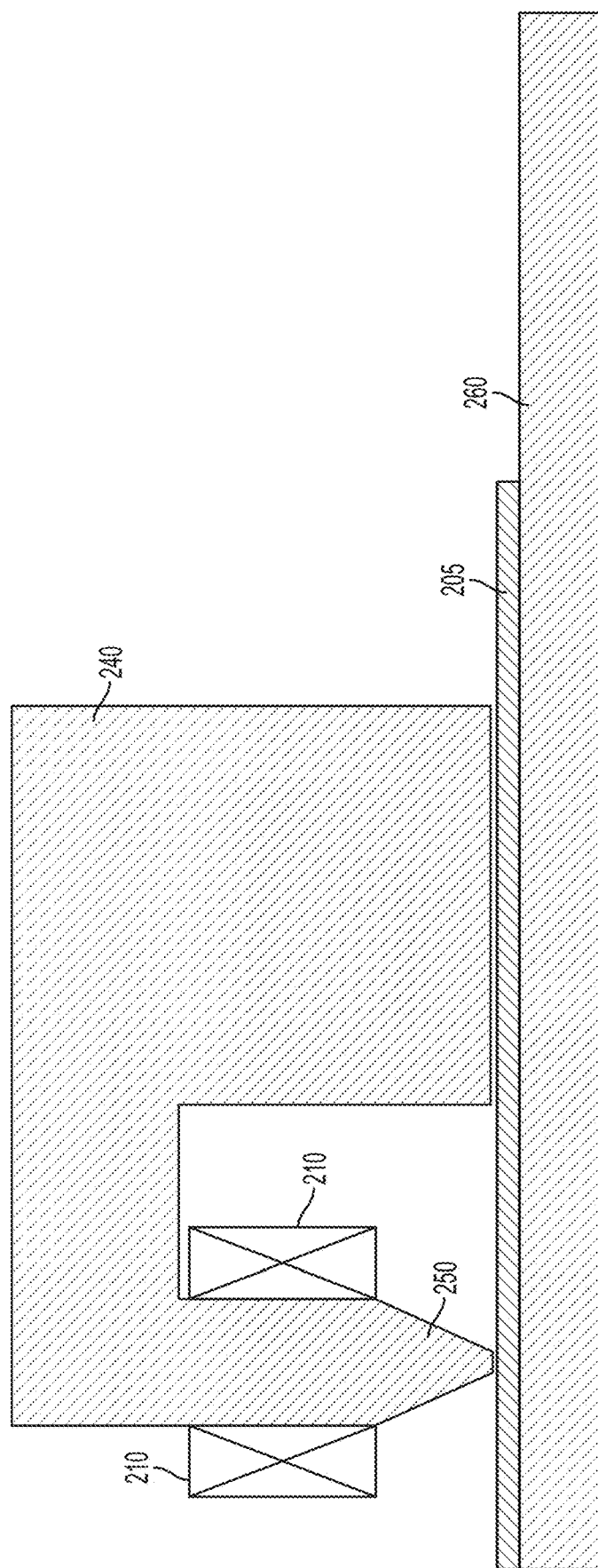
FIG. 2 illustrates another configuration for an automated device for magnetizing material according to a desired pattern, in accordance with some embodiments.

FIG. 2 illustrates another configuration for an automated magnetization system, in accordance with some embodiments. System 200 includes a magnetizing head 250 having a single tip. Magnetizing head 250 is coupled to and/or integral with an extended portion 240. A plate 260 of ferromagnetic material, such as steel, is provided to support material 205. Coils 210 provide a magnetic field whose flux is provided through material 205 at the location underneath the tip, with plate 260 and extended portion 240 providing a return path for the magnetic flux. Using this geometry, the flux density at the tip of the magnetizing head is strong enough to magnetize material 205, but spreads out sufficiently along the return path via plate 260 such that the flux density is insufficient to magnetize material 205 elsewhere. As a result, material 205 is magnetized only at locations underneath the tip of the magnetizing head 205. Magnetizing head 250 and extended portion 240 may be mounted to linear stages to allow the magnetizing head to be moved over the surface of material 205 to magnetize the material in a desired pattern. As discussed in connection with FIGS. 1A and 1B, to skip over locations on material 205, the magnetizing head 250 may be moveable in the vertical direction (Z-direction) to lift the head away from material 205, and/or the magnetic coils 210 may be cycled on and off, so that desired locations of material 205 remain un-magnetized.

Alternatively (or additionally), plate 260 and/or material 205 may be translated in the XY plane (i.e., the plane of material 205) so that the tip of magnetizing head 205 remains fixed and magnetizes desired portions of material 205 as material 205 passes underneath the pole of the magnetizing head 250. For example, plate 260 may be place on, or may itself be, a translation table capable of being moved in the XY plane.

Figure 3:
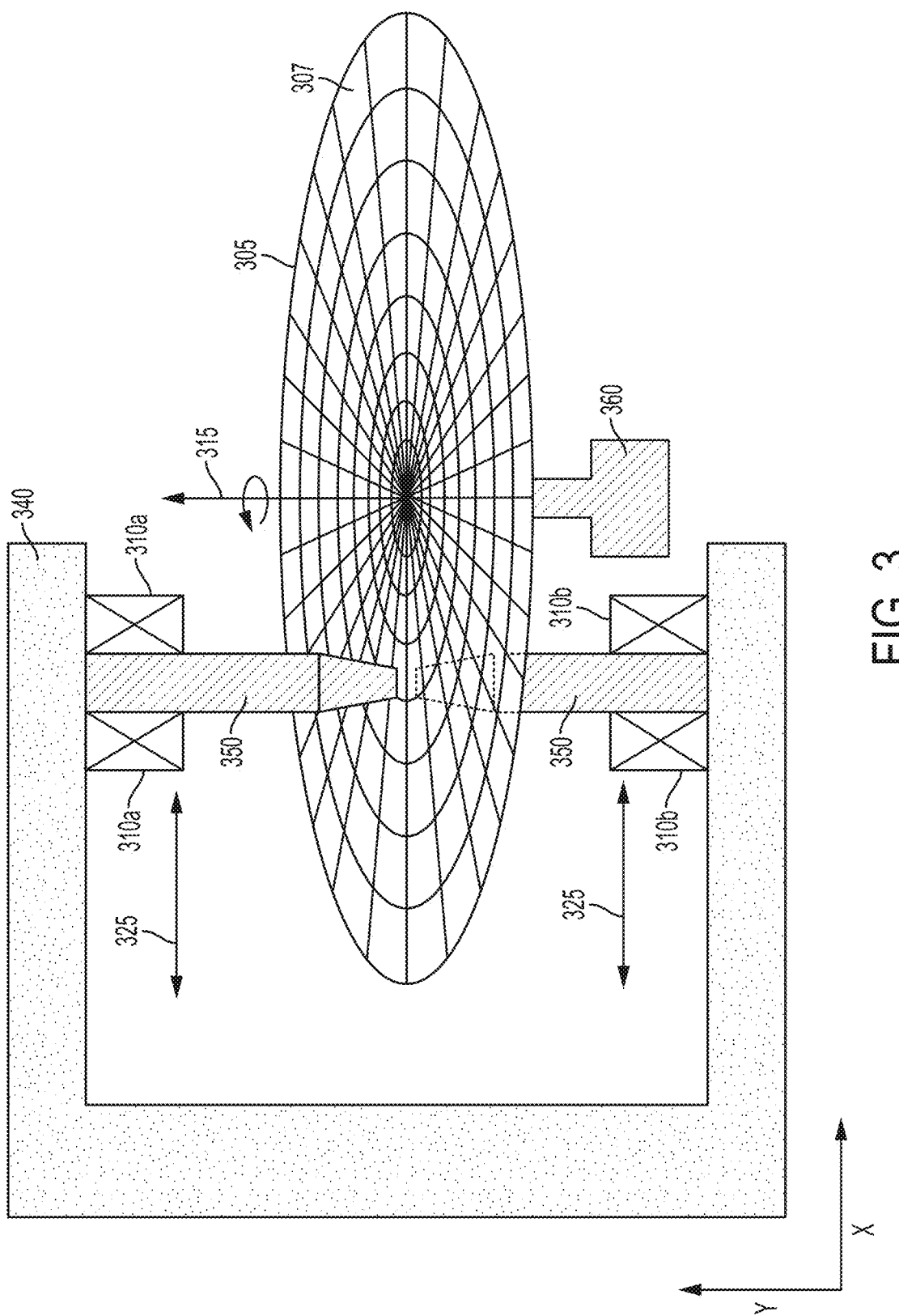
FIG. 3 illustrates another configuration for an automated device for magnetizing material according to a desired pattern, in accordance with some embodiments.

FIG. 3 illustrates yet another exemplary configuration for an automated magnetization system, in accordance with some embodiments. In the configuration of FIG. 3, material 305 is supported by a rotatable component, illustrated schematically as rotatable component 360 that can be caused to rotate about a central axis 315 (e.g., via one or more motors), thus causing material 305 to rotate or spin about this same axis. According to some embodiments, the rate at which the rotatable component spins may also be controlled. It should be appreciated that the rotatable component may be a platform on which material 305 generally sits and can be secured, or a piece to which material 305 can be otherwise attached or affixed so that rotation of component 360 causes a corresponding rotation of material 305. Any component suitable for this purpose may be used, as the aspects are not limited in this respect.

Magnetization head 350 and coils 310 (if present) are configured to translate in the X-direction as indicated by arrows 325 (e.g., via one or more linear stages). A control component may be coupled so as to coordinate rotation of material 305 (e.g., via rotatable component 360) and translation of the magnetizing head so as to magnetize desired regions of material 305. In particular, based on the magnetic field correction determined for a given $B_0$ magnetic field produced by a B0 magnet after manufacture and assembly, a control program can be provided to rotate material 305 while magnetization head 350 is translated in the X-direction (i.e., in a radial direction with respect to material 305) to magnetize material 305 in a pattern that produces a corrective magnetic field. In this way, the magnetization head 350 may be simplified as it need only be moveable along a single access.

It should be appreciated that any combination of translation and/or rotation of any one or combination of the magnetizing head, magnetic material and/or component provided to support the magnetic material may be employed to allow the magnetic material to be magnetized at desired locations to produce a magnetic pattern configured to improve the profile of the $B_0$ magnetic field of a $B_0$ magnet (e.g., a B0 magnet for use by a low-field MRI device, though not limited to such devices), as the techniques are not limited for use in this respect.

According to some embodiments, the magnetizing head (e.g., magnetizing head 150, 250, 350) is formed by a permanent magnet. Accordingly, in some implementations using a permanent magnet head, the magnetic coils (e.g., magnetic coils 110, 210, 310) may be unnecessary. In particular, the magnetizing head may be constructed of magnetic material capable of producing a magnetic field sufficient to magnetize regions of the magnetic material to which a magnetic pattern is to be applied. In embodiments that utilize permanent magnets for the magnetizing head, it may be beneficial to provide two permanent magnetizing heads, each magnetized in the opposite direction as the other so that regions of the magnetic material may be magnetized in either direction. However, the use of permanent magnetizing heads is not limited in this respect.

According to some embodiments, magnetic coils may be used in combination with a permanent magnet magnetizing head to facilitate providing increased magnetizing field strengths at the same power levels as using magnetic coils alone, or less power can be used to provide the same magnetizing field strengths. It should be appreciated that magnetic coils and/or a permanent magnet magnetizing head can be used alone or in any combination to achieve an automated magnetizing system having desired operating characteristics capable of suitably magnetizing magnetic material of interest to produce permanent magnet shims. It should be further appreciated that the magnetizing head, when fixed at a given location, can be configured to magnetize a region of any desired volume. For example, the magnetization head may be chosen so that a volume of 1 cm$^3$ is magnetized when the magnetization head is positioned at a given location. However, it should be appreciated that any size magnetization head may be used, as the aspects are not limited in this respect. Use of a smaller magnetization head allows for a magnetization pattern having finer features to be applied to the magnetic material. Use of a larger magnetization head allows for a given magnetization pattern to be magnetized in less time.

Figure 4:
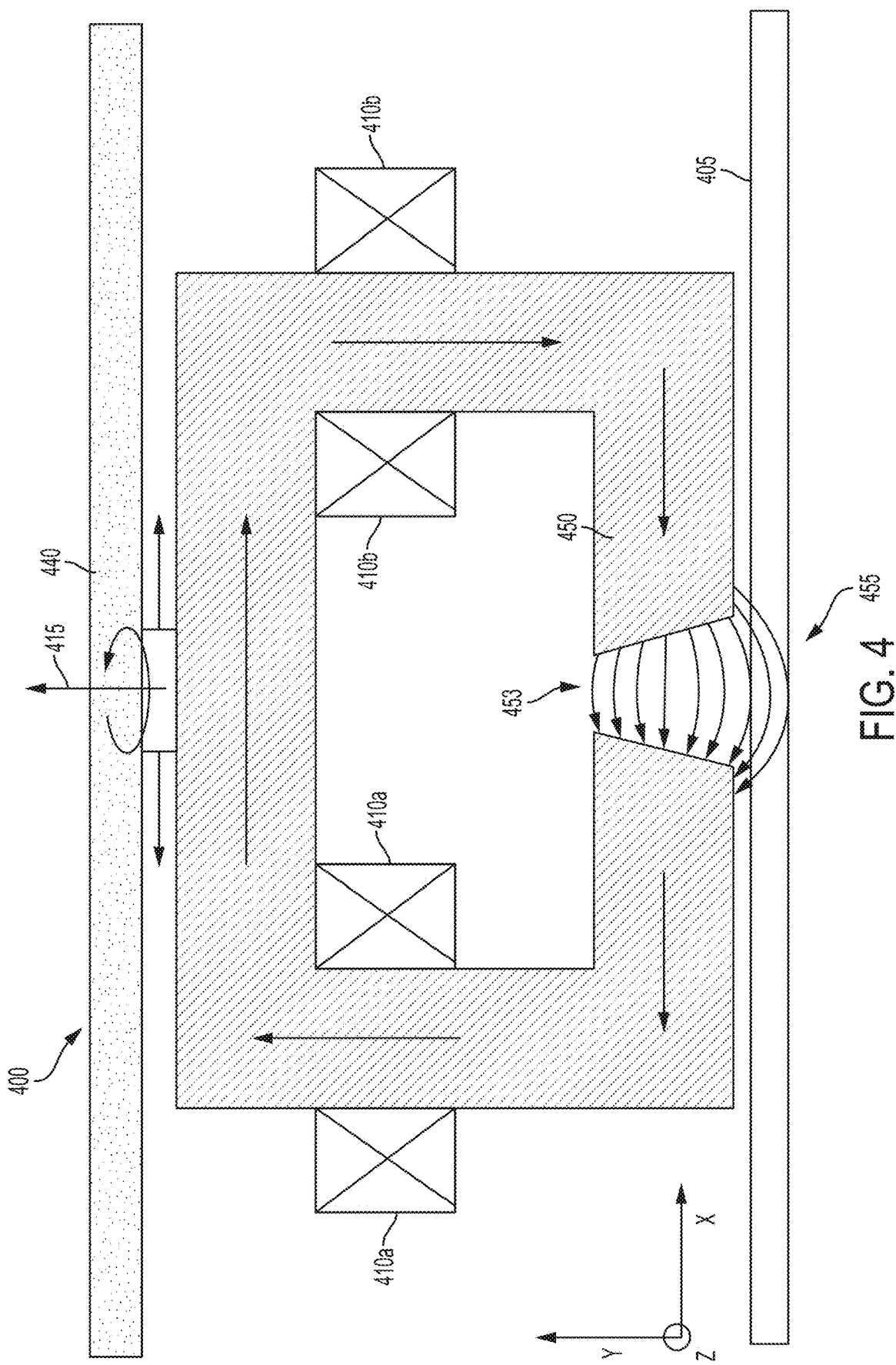
FIG. 4 illustrates a further configuration for an automated device for magnetizing material according to a desired pattern, in accordance with some embodiments.

FIG. 4 illustrates a further configuration of a device for magnetizing a permanent magnet shim in directions parallel or transverse to the $B_0$ magnetic field for which correction is desired, in accordance with some embodiments. Magnetizing device 400 comprises coils 410a and 410b for producing a magnetic field to magnetize desired regions of magnetic material 405. The magnetic flux is channeled through magnetizing head 450 in the direction indicated by the arrows, which can be produced in the opposing direction by driving coils 410a and 410b with current flowing in the opposite direction. Magnetic flux 455 across gap 453 magnetizes material 405 in the region below the gap in a direction that is substantially in the plane of material 405. In this manner, material 405 can be magnetized in directions substantially parallel to the plane of material 405. For a B0 magnet having a bi-planar or single-sided geometry, material 405 can be magnetized in directions transverse (e.g., substantially perpendicular) to the $B_0$ magnetic field for which correction is desired. For a B0 magnet having a cylindrical geometry (e.g., a solenoid or Halbach-type magnet), material 405 can be magnetized in directions substantially parallel (e.g., aligned and/or anti-aligned) with the $B_0$ magnetic field.

Magnetizing head 450 may be coupled to frame 400 via one or more linear stages that allow the magnetizing head 450 to be moved in the X-direction and/or Z-direction so that that the magnetizing head 450 can be positioned above desired regions of magnetic material 405 to apply a magnetic pattern to material 405 to produce a magnetic field that improves the profile of a $B_0$ magnetic field of a $B_0$ magnet, for example, a $B_0$ magnet configured for use in a low-field MRI device. As one example, magnetizing head 450 may be coupled via linear stages that allow the magnetizing head to be controlled in the X-direction and Z-direction so that the magnetizing head can be moved to desired locations in the XZ plane of material 405. Alternatively, magnetizing head 450 may be coupled to allow for control in along the X-axis (i.e., in the X and −X directions) while material 405 is rotated (e.g., via a rotatable component as described in connection with FIG. 3) so that the magnetizing head can be positioned over desired regions of material 405. Other ways of positioning magnetizing head 450 may also be used, as the aspects are not limited in this respect.

According to some embodiments, magnetizing head 450 may be rotatably coupled to frame 400 to allow the magnetizing head to be swiveled about axis 415. In this way, regions of material 405 can be magnetized in any desired direction in the plane of magnetic material 405. It should be appreciated, however, that the ability to rotate magnetizing head 450 is not a requirement and the magnetizing head 450 may be fixed in orientation in some embodiments.

In some circumstances, it may be desirable to have the ability to apply a magnetic pattern wherein regions can be magnetized substantially in alignment, substantially in anti-alignment and/or substantially in directions transverse to the $B_0$ magnetic field being corrected. Thus, according to some embodiments, an automated device for applying a magnetic pattern to produce a permanent magnet shim may be provided with dual magnetizing heads, allowing for regions of the permanent magnet shim to be magnetized in directions substantially parallel and substantially perpendicular to the $B_0$ magnetic field. According to some embodiments, a first magnetizing head is provided to magnetize regions of the permanent magnet shim in directions substantially parallel to the $B_0$ magnetic field (e.g., in alignment or anti-alignment with the $B_0$ magnetic field), and a second magnetizing head is provided to magnetize regions of the permanent magnet shim in directions substantially perpendicular to the $B_0$ magnetic field (e.g., in directions transverse to the $B_0$ magnetic field). According to some embodiments, the dual magnetizing heads are provided in close proximity (e.g., side-by-side).

To magnetize a region in a desired direction, the respective magnetizing head may be operated (e.g., by providing current to operate coil(s) coupled to the selected magnetizing head) while the other magnetizing head remains non-operational (e.g., by not providing current to respective coil(s) and/or by moving the magnetizing head away from the magnetic material being magnetized). According to some embodiments, a first pass over the permanent magnet shim is performed using the first magnetizing head and a second pass over the permanent magnet shim is performed using the second magnetizing head, or vice versa, to reduce the amount of switching between operating the respective magnetizing heads.

Figure 5:
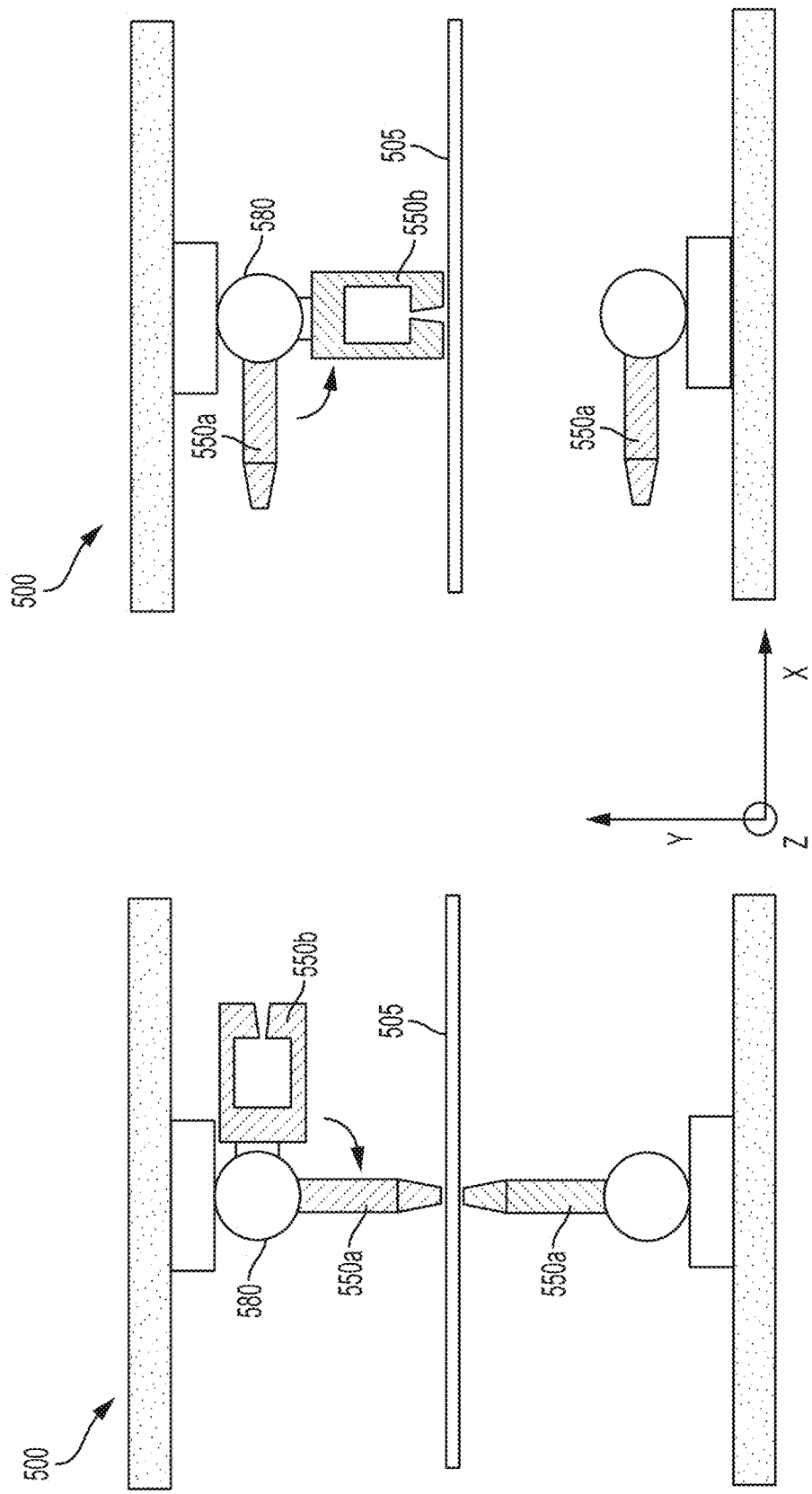
FIGS. 5A and 5B illustrate an automated device having dual magnetizing heads for magnetizing material according to a desired pattern, in accordance with some embodiments.

FIGS. 5A and 5B illustrate a device for applying a magnetic pattern to a permanent magnet shim having dual magnetizing heads, in accordance with some embodiments. Device 500 comprises a first magnetizing head 550a configured to magnetize regions of magnetic material 505 in the Y and −Y directions (e.g., in directions substantially parallel to the $B_0$ magnetic field of a bi-planar or single-sided B0 magnet), and a second magnetizing head 550b configured to magnetize regions of magnetic material 505 in directions in the XZ plane (e.g., in directions substantially perpendicular to the $B_0$ magnetic field of a bi-planar or single-sided B0 magnet). For example, magnetizing head 550a may be similar to the magnetizing heads illustrated in FIGS. 1 and 3, or may be any other suitable magnetizing head, and magnetizing head 550b may be similar to the magnetizing head illustrated in FIG. 4 or any other suitable magnetizing head. The dual magnetizing heads may be constructed using electromagnet coils (not shown in FIG. 5) as described in connection with FIGS. 1-4, using permanent magnet material, or a combination of both, as the aspects are not limited in this respect.

Magnetizing head 550a (upper) and magnetizing head 550b are coupled to a rotatable component 580 that allows the respective magnetizing heads to be selectively rotated into place depending on the direction of magnetization desired, as illustrated by the two positions shown in FIGS. 5a and 5b, respectively. The dual magnetizing heads can be positioned at desired locations relative to magnetic material using any of the techniques described herein (e.g., linear stages, motors, rotating tables, etc.) to apply a desired magnetic pattern to magnetic material 505. As discussed above, magnetizing a permanent magnet shim in accordance with a desired pattern may be performed in two passes, or may be performed in a single pass. Switching between magnetizing head 550a and 550b may be controlled in an automated way (e.g., under control of the device using motors or other automated means), may be manually switched, or both. Lower magnetizing head 550a may also be coupled to a component that allows the head to be rotated (e.g., as illustrated in FIG. 5B) or otherwise positioned away (e.g., to be raised and lowered) from magnetic material 505 when the magnetizing head is not being operated. As with magnetizing head 450 illustrated in FIG. 4, wherein the magnetization head may be rotatably coupled to frame 400 to allow the magnetizing head to be swiveled about axis 415 to magnetize regions of magnetic material in any desired direction in the plane of magnetic material, magnetizing head 550b may be rotatably coupled to rotatable component 580 to allow regions of magnetic material 505 to be magnetized in any desired orientation with respect to a planar surface of the magnetic material.

Figure 23A:
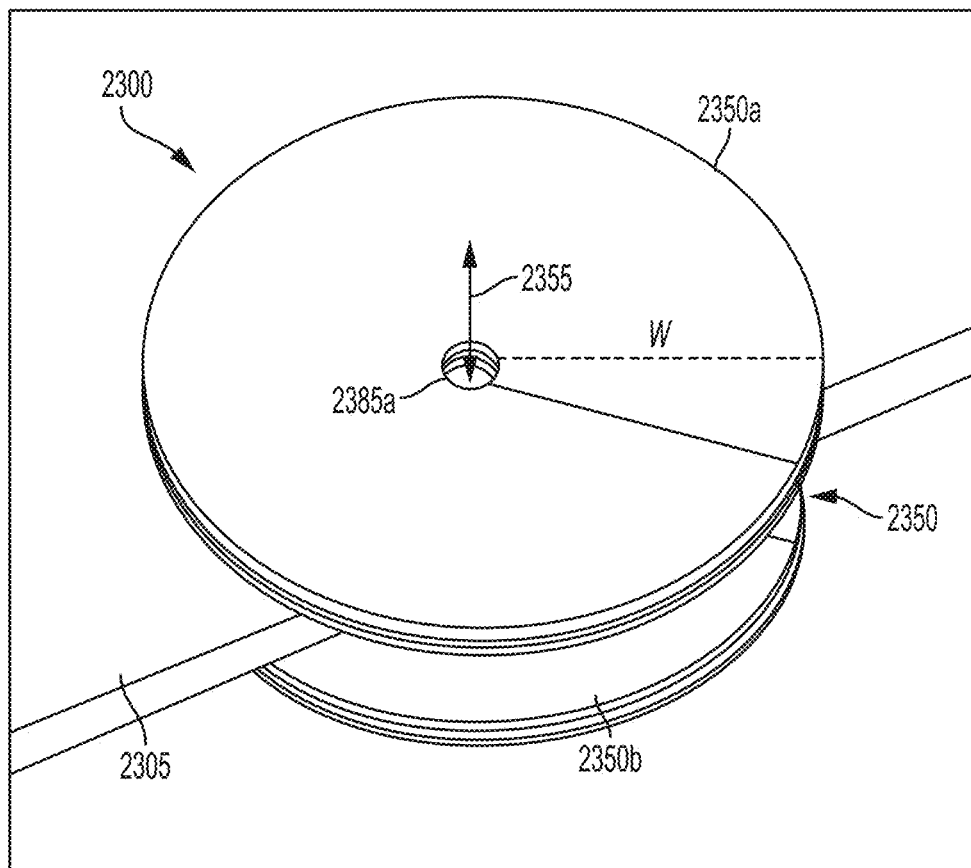
FIGS. 23A and 23B illustrate a magnetization head for magnetizing magnetic material according to a magnetic pattern to produce a permanent magnet shim, in accordance with some embodiments.
Figure 23B:
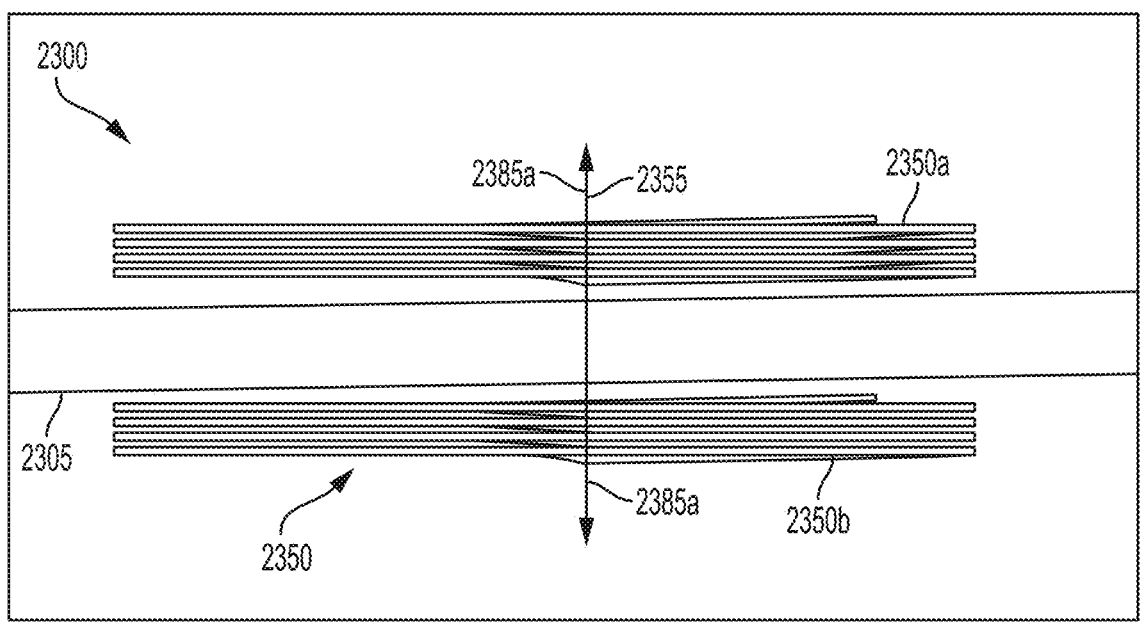

FIGS. 23A and 23B illustrate a device for magnetizing a permanent magnet shim according to a magnetic pattern, in accordance with some embodiments. As illustrated in the portion of device 2300 illustrated in FIGS. 23A and 23B, a magnetization head 2350 comprises a pair of coils 2350a and 2350b configured to generate a magnetic field sufficient to selectively magnetize regions of magnetic material 2305. Coils 2350a and 2350b may be copper or another suitable conductive material arranged in a number of turns about respective center portions 2385a and 2385b, respectively. Coils 2350a and 2350b may be formed of conductive ribbon (e.g., copper), or sheets, disks or plates of conductive material manufactured in a generally helical geometry. To magnetize a region of magnetic material 2305, a current pulse is applied to coils 2350a and 2350b. For example, a relatively high amperage (e.g., 10,000 amps) current is applied for a relatively brief interval of time (e.g., approximately 1 ms) to produce a strong magnetic field at the center.

Due to the geometry of the coils, a relatively strong magnetic field is produced through centers 2385a and 2385b in either direction indicated by arrow 2355 depending on which direction the current pulse is applied. Each turn of the conductor has a relatively wide surface of conductive material in the radial direction (e.g., a relatively large radial width w) that provides a measure of shielding that substantially limits magnetic field production to the diameter of the center portions of the coils (e.g., center portions of approximately 5 mm in diameter). Specifically, a strong magnetic field is generated at the center where most of the current pulse circulates while eddy currents generated at increasing distances from the center resist magnetic field production outside or in the close vicinity of the boundary of center portions 2385a and 2385b, providing improved spot magnetization of magnetic material 2305. That is, when a current pulse is applied, eddy currents generated at increasing radial distances from the center prevent the magnetic fields from diffusing outwards, confining magnetic fields of sufficient strength to magnetize the magnetic material 2305 substantially to the diameter of center portions 2385a and 2385b. If the duration of the current pulse is chosen appropriately, each current pulse applied to magnetize a given region of magnetic material 2305 subsides before the eddy currents have dissipated enough to permit production of a magnetic field strong enough to magnetize the magnetic material outside the center portion. As a result, magnetization of magnetic material 2305 is localized substantially to the boundary of the center portions. In this manner, a localized magnetizing field can be produced by magnetization head 2350 to magnetize magnetic material 2305 in accordance with a desired magnetic pattern to produce a permanent magnet shim.

It should be appreciated that magnetization head 2350 may be produced without using steel or other ferromagnetic materials. Magnetization head 2350 may be controlled to traverse magnetic material 2305 using any of the example linear stage and/or radial techniques discussed in the foregoing, or using any other suitable means to control magnetization head 2350. It should be appreciated that magnetization head 2350 may be used to produce a single polarity or a dual polarity magnetic pattern.

Figure 6:
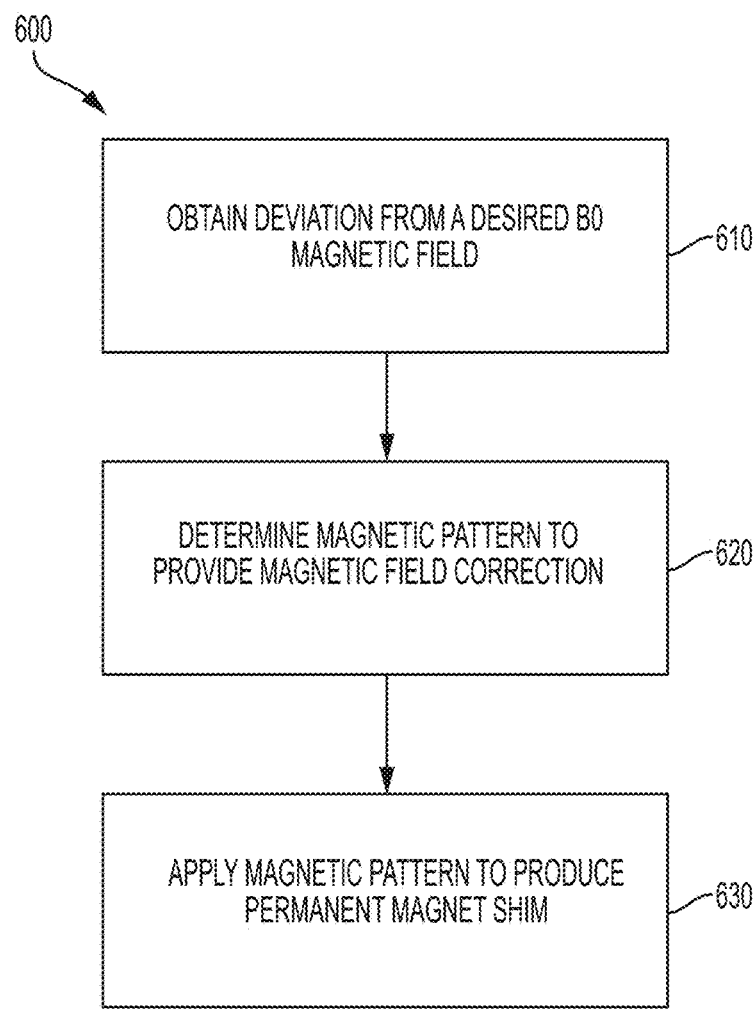
FIG. 6 illustrates a method of producing a permanent magnet shim configured to improve a profile of a $B_0$ magnetic field, in accordance with some embodiments.

FIG. 6 illustrates a method of producing a permanent magnet shim, in accordance with some embodiments. Method 600 may be performed to improve the profile of the $B_0$ magnetic field produced by any type of $B_0$ magnet, including a permanent $B_0$ magnet, a $B_0$ electromagnet or any combination thereof. For example, method 600 may be performed to correct non-uniformities and/or offsets in the field strength of the $B_0$ magnetic field produced by the exemplary electromagnets and exemplary permanent magnets discussed in further detail below (e.g., in connection with FIGS. 17-19), and/or any of the exemplary B0 magnets described in U.S. patent application Ser. No. 14/845,652 ('652 application), titled "Low Field Magnetic Resonance Imaging Methods and Apparatus," and filed Sep. 4, 2015 and/or U.S. patent application Ser. No. 14/846,255 ('255 application), titled "Ferromagnetic Augmentation for Magnetic Resonance Imaging," and filed on Sep. 4, 2015.

According to some embodiments, method 600 may be performed to produce generally planar permanent magnet shims that can be arranged proximate one or both of the bi-planar $B_0$ magnets in open magnet arrangements. In this respect, a permanent magnet shim may be produced and arranged on both sides of the field of view of a bi-planar $B_0$ magnet, or on a single side of a bi-planar $B_0$ magnet. In embodiments where multiple permanent magnet shims are used (e.g., a pair of permanent magnet shims associated with respective sides of a bi-planar B0 magnet), the permanent magnet shims may be produced having different or the same magnetic pattern provided thereon. According to some embodiments, method 600 may be used to produce a permanent magnet shim for other geometries (e.g., cylindrical geometries), for example, by applying a magnetic pattern to flexible material that can be shaped or otherwise formed to a particular geometry, as discussed in further detail below.

Multiple permanent magnet shims may also be used to provide different corrective magnetic fields to improve the profile of the B0 magnet. For example, one or more permanent magnet shims may correct for non-uniformities resulting from manufacturing tolerances (e.g., variability in production processes) and/or non-uniformities resulting from a ferromagnetic yoke used to increase the magnetic flux density in the field of view of a $B_0$ magnet (e.g., an asymmetric yoke as discussed in further detail below). One or more permanent magnet shims may be used to raise or lower the field strength of the $B_0$ magnetic field produced by the $B_0$ magnet to correct for a $B_0$ offset. It should be appreciated that multiple types of corrections (e.g., improved homogeneity, $B_0$ offset, etc.) may be provided by a single permanent magnet shim, or using a combination of permanent magnet shims produced either independently or concurrently, as the aspects are not limited in this respect.

In act 610, deviation of a $B_0$ magnetic field from a desired $B_0$ magnetic field of a $B_0$ magnet is obtained. In particular, $B_0$ magnets are designed to produce a uniform $B_0$ magnetic field at a specific field strength. Deviation of a $B_0$ magnetic field from uniform, referred to herein as non-uniformities or inhomogeneity, degrades the performance of an MRI system incorporating the B0 magnet (e.g., by causing a proportional reduction in the signal-to-noise ratio (SNR) for the system by degrading MR signal excitation and/or detection performance, causing image distortion, etc.). Deviation of a $B_0$ magnetic field from the desired field strength, referred herein to as a $B_0$ offset, shifts the Larmor frequency of the $B_0$ magnet, causing a mismatch between the Larmor frequency and the intended operating frequency of the MRI system that, if not corrected, also degrades the performance. Thus, in act 610, deviation of the $B_0$ magnetic field, either non-uniformities and/or $B_0$ offsets are determined. The determined deviation may be represented in any suitable way. For example, spherical harmonics (or any other suitable series of basis functions) may be used to provide a representation of magnetic field variation to limit the number of parameters needed to characterize the magnetic field and/or to improve numerical stability.

Practical $B_0$ magnet designs are not able to achieve perfect uniformity at exactly a desired field strength. Thus, some deviation of a $B_0$ magnetic field from a desired profile is inherent in the design of the system. In addition, variability in manufacturing processes cause further deviation of a $B_0$ magnetic field produced by a $B_0$ magnet from its desired uniformity and/or field strength, which typically varies in extend for each production of a $B_0$ magnet. Further, the design of the $B_0$ magnet itself may introduce deviations of the $B_0$ magnetic field from a desired profile. For example, a ferromagnetic yoke designed to increase the magnetic flux in the region of interest may in some circumstances introduce non-uniformities in the $B_0$ magnetic field, as discussed in further detail below. Deviation of a $B_0$ magnetic field inherent in or introduced by the design of the $B_0$ magnet and/or introduced by the manufacturing processes may be determined by performing act 610.

Deviation from a desired $B_0$ magnetic field may be obtained in a number of ways. For example, in act 610, the $B_0$ magnetic field produced by a $B_0$ magnet configured for use in MRI system may be measured in a region of interest. To measure the $B_0$ magnetic field, magnetic field sensors may be arranged spatially to measure or map the magnetic field generated by the B0 magnet within the relevant field of view of a the MRI device. Alternatively, a sensor or an array of sensors can be moved about a region of interest to measure the magnetic field produced by the B0 magnet. Any number or type of sensors may be utilized that allow the profile of the $B_0$ magnetic field to be suitably characterized. For example, Hall probes, NMR probes, fluxgate sensors, solid state magnetometers or any other sensor capable of detecting magnetic fields to capture relatively small variations may be utilized.

Deviation from a desired $B_0$ magnetic field may also be obtained in act 610 by computing the deviation based on properties of the design. In particular, deviation inherent in the design of the $B_0$ magnet may be evaluated based on the known design specification. For example, non-uniformities introduced by a yoke can be determined from the known properties of the yoke and the known relationship between the yoke and the $B_0$ magnet. Performance of act 610 should be able to sufficiently characterize deviation of the $B_0$ magnetic field so that unsatisfactory degrees of inhomogeneity and/or $B_0$ offset can be detected and corrected via one or more permanent magnet shims. Deviation from a desired $B_0$ magnetic field may also be obtained by retrieving and/or receiving a previously determined deviation, for example, a deviation determined from a previous measurement or a deviation determined from a previous computation. As such, according to some embodiments, act 610 may be performed without necessarily determining the deviation.

In act 620, a magnetic pattern configured to produce a corrective magnetic field based on the determined deviation to improve the profile of the $B_0$ magnetic field is determined. The magnetic pattern may be determined in a number of ways. According to some embodiments, a model of a permanent magnet shim is generated, for example, a computer generated model configured to simulate properties of the permanent magnet shim. A magnet pattern that, when applied to magnetic material, provides the corrective magnetic field may be determined, for example, via an optimization scheme, examples of which are described in further detail below. For example, an optimization may be used to determine a magnetic pattern that indicates which regions of magnetic material to which the magnetic pattern is applied are to be magnetized, in what direction and/or at what field strength. Additional techniques for determining a magnetic pattern are also discussed in further detail below.

In act 630, the determined magnetic pattern is applied to magnetic material to produce one or more permanent magnet shims that contribute to and improve the B0 magnetic field produced by a B0 magnet. Applying a magnetic pattern to magnetic material refers to any technique that transfers, provides or otherwise produces magnetized material in accordance with the determined magnetic pattern, including, but not limited to using a magnetizing head to traverse and magnetize magnetic material in accordance with the magnetic pattern, cutting or removing magnetic material to produce magnetized material in accordance with the magnetic pattern, additive techniques such as 3D printing, spraying, etc. that produce or provide magnetic material in accordance with the magnetic pattern, etc.

According to some embodiments, a ferromagnetic sheet of material, initially not magnetized, or pre-magnetized at high spatial frequency, may have a determined magnetic pattern applied using an automated magnetizing system, such as those described in connection with FIG. 1A, 1B or 2. In particular, the determined magnetic pattern may be provided to a control system of the automated magnetizing system to control the magnetizing head to traverse the pattern over the surface of the magnetic material (e.g., a ferromagnetic sheet of initially un-magnetized material) to apply the magnetic pattern to the material to produce a permanent magnet shim. The permanent magnet shim may then be arranged proximate the field of view to produce, via the magnetic pattern, a magnetic field that contributes to the $B_0$ magnetic field produced by the MRI device (e.g., a low-field MRI device) to improve the field profile (e.g., by increasing the homogeneity of the $B_0$ magnetic field).

According to some embodiments, a determined magnetic pattern may be applied to magnetic material by cutting the magnetic material in accordance with the determined magnetic pattern. For example, a sheet of magnetic material may be magnetized and then subsequently patterned via cutting or removal of magnetic material (e.g., via a CNC router, laser cutter or any suitable machining process, subtractive 3D printing techniques, etc.) in accordance with the magnetic pattern. That is, regions of the magnetic material determined as not contributing to the corrective magnetic field may be removed using any suitable technique, leaving only regions corresponding to the magnetic pattern that contribute to the corrective magnetic field. Alternatively, the magnetic material may be initially un-magnetized when the magnetic material is patterned in accordance with the magnetic pattern, after which the patterned magnetic material is subsequently magnetized to produce the permanent magnet shim. The technique of cutting or removing magnetic material to apply the determined magnetic pattern may provide a simpler approach by eliminating the automated magnetizing head apparatus (e.g., eliminating the exemplary apparatus illustrated in FIGS. 1-4), reducing the cost and complexity of producing a permanent magnet shim in some circumstances. For example, magnetizing the magnetic material all at once, either before or after it has been patterned, eliminates the need for the relatively time consuming and complex process of controlling a magnetizing head to traverse and magnetize each region of the magnetic material corresponding to the determined magnetic pattern.

As discussed above, when a magnetic pattern is applied using subtractive process (e.g., cutting, subtractive 3D printing), the patterned magnetic material may be affixed or adhered to a substrate, either prior or subsequent to cutting, so that unconnected pieces of magnetic material are positioned and maintained in the correct locations relative to one another so that the determined magnetic patterned is preserved. It should be appreciated that the magnetized regions or pieces of magnetic material may be attached to the substrate in any suitable manner. In some embodiments, the substrate provides a measure of stability for the patterned magnetized material forming the permanent magnet shim. According to some embodiments, a determined magnetic pattern is applied using suitable additive processes such as additive 3D printing techniques, cold spray techniques, etc. Any other suitable techniques for applying a determined magnetic pattern may be used, as the aspects are not limited in this respect.

Figure 7A:
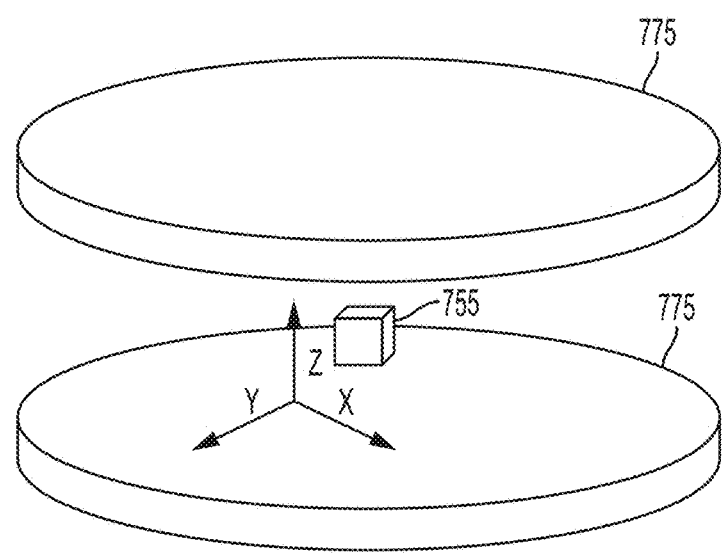
FIGS. 7A-7D illustrate techniques for measuring a $B_0$ magnetic field of a B0 magnet, in accordance with some embodiments.
Figure 7B:
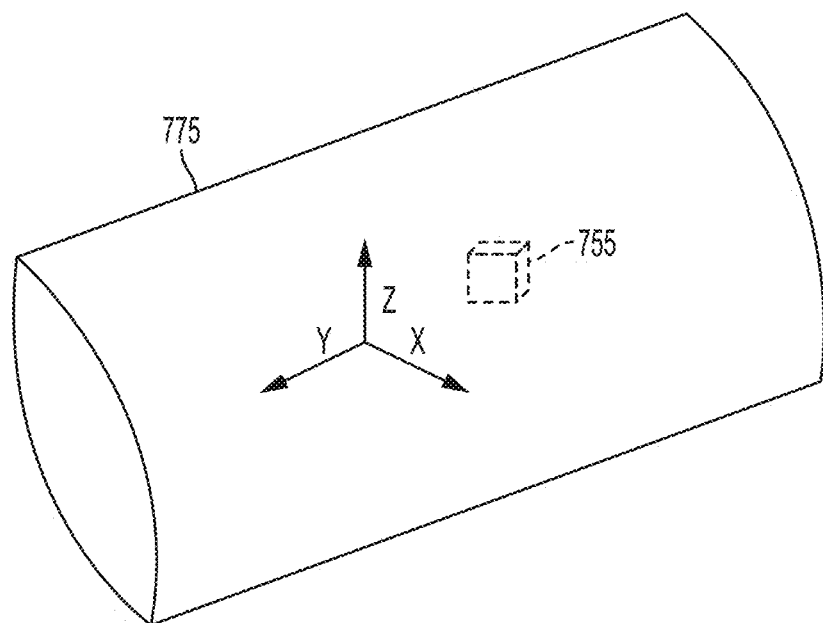

As discussed above, to determine a deviation of the $B_0$ magnetic field produced by a $B_0$ magnet subject to correction (e.g., to perform act 610 in method 600 illustrated in FIG. 6) the $B_0$ magnetic field may be measured to characterize its profile so that shimming techniques described herein can be applied. FIGS. 7A-7D illustrate exemplary approaches to measuring the $B_0$ magnetic field produced by a B0 magnetic so as to characterize the profile (e.g., the strength and/or variation) of the $B_0$ magnetic field to facilitate correction and/or improvement thereof. FIG. 7A illustrates a bi-planar B0 magnet 775 in which a sensor 755 is placed within the field produced by B0 magnet 775 and its location varied in three-dimensions so as to measure the $B_0$ magnetic field at desired locations in space. The sensor may be of any type suitable for measuring the local magnetic field produced by $B_0$ magnet, some exemplary sensors of which were discussed above in connection with method 600 illustrated in FIG. 6. The sensor may be moved to as many locations as desired to suitably characterize the magnetic field so that a correction can be computed. FIG. 7B illustrates the same technique as shown in FIG. 7A in the context of a cylindrical geometry $B_0$ magnet. It should be appreciated that measuring the magnetic field using a sensor 755 may be used with any geometry, as the technique is not limited in this respect.

Figure 7C:
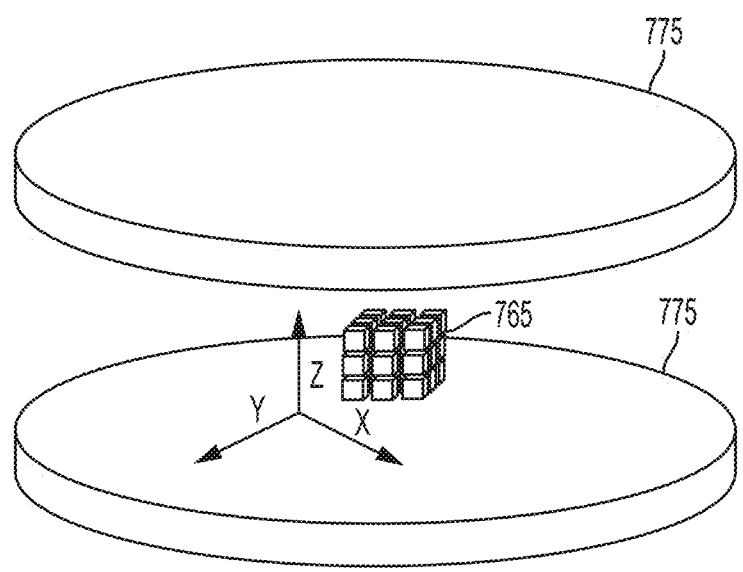
Figure 7D:
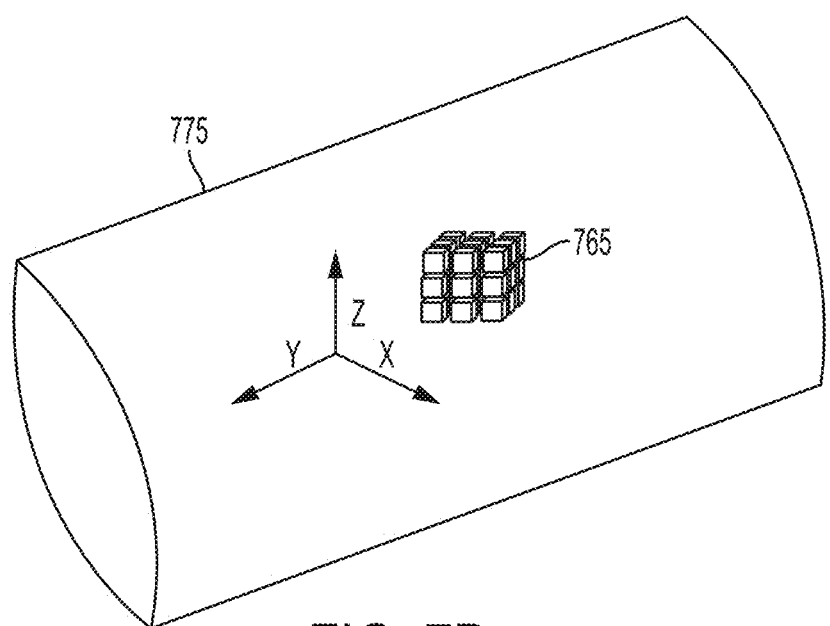

To facilitate a faster more cost effective means to measure the $B_0$ magnetic field of a subject $B_0$ magnet, an array of sensors 765 may be used as illustrated in FIGS. 7C and 7D. Sensor array 765 may include any number of sensors of any type suitable for measuring magnetic fields. Similar to the techniques described in connection with sensor 755, sensor array 765 may be moved in three dimensions to measure the $B_0$ magnetic field produced by $B_0$ magnet 775 at desired locations in space. In the schematic drawings in FIGS. 7C and 7D, the sensor array is illustrated as a rectangular array of sensors. However, the sensors in an array may be configured in any way, for example, spherically (e.g., arranged as if on the surface of a sphere and/or within a sphere), within or substantially within a plane, or in any other desired configuration or geometry, as the aspects are not limited in this respect.

The inventors have recognized that the relatively small magnetic fields generated in many low field contexts facilitates the use of relatively inexpensive solid state sensors. For example, solid state sensors may be used to form sensor array 765 illustrated in FIGS. 7C and 7D. According to some embodiments, sensor array 765 may comprise a number of solid state sensors sufficient to measure the entirety of the region of interest of a $B_0$ magnetic field in a single measurement. For example, hundreds or thousands (or more) sensors may be integrated in a sensor array capable of capturing sufficient information about the $B_0$ magnetic field in a region of interest (e.g., the entirety or substantially the entirety of the useful field of view of the $B_0$ magnet in the context of a low-field MRI device) via a single measurement by the sensors in the array (or in a relatively small number of measurements). In this manner, a $B_0$ magnetic field can be quickly and effectively characterized. It should be appreciated that a "one-shot" sensor array can be produced to measure a desired region of interest of a $B_0$ magnetic field at any desired resolution by appropriately choosing the number of sensors and spatial arrangement (e.g., spacing between sensors). It should be further appreciated that any type of sensor may be used to form a sensor array, including a one-shot sensor array, though costs associated with many sensors may render such implementations less desirable from a cost perspective.

Figure 8:
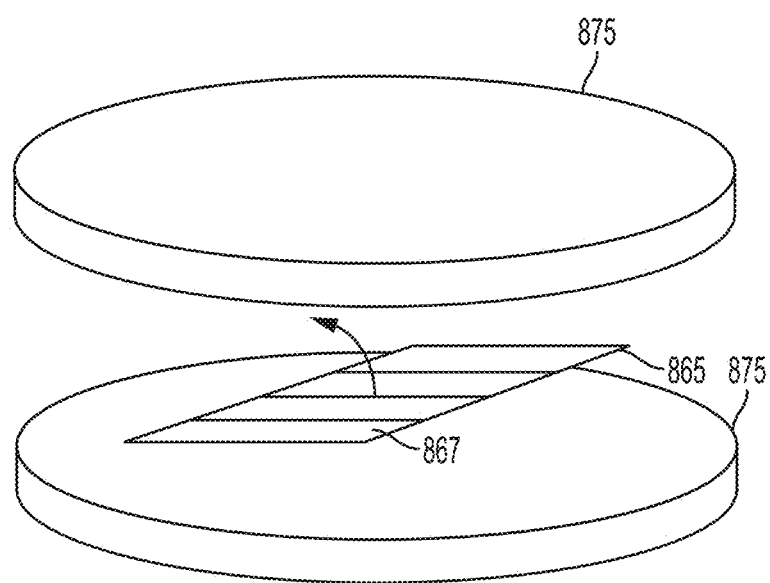
FIG. 8 illustrates a further technique for measuring a $B_0$ magnetic field of a $B_0$ magnet, in accordance with some embodiments.

FIG. 8 illustrates a further sensor arrangement that may be suitable for characterizing the $B_0$ magnetic field produced by a $B_0$ magnet, in accordance with some embodiments. In FIG. 8 a sensor 865, comprising a plurality of coils 867, is provided within the region of interest of $B_0$ magnet 875. Sensor 865 is rotated as indicated by the arrow (either about an axis along the edge of the sensor or an axis through the center of the sensor) and the flux-induced voltages from each of the coils as it rotates can be used to infer the magnetic field produced by $B_0$ magnet 875. In this manner, the magnetic field produced by a $B_0$ magnet can be measured in three dimensions via a rotating array of coils.

To assist in both determining the magnetic pattern that provides a correction to the $B_0$ magnetic field of a given $B_0$ magnet and in applying a desired magnetic pattern to magnetic material (e.g., to assist in performing acts 620 and 630 of method 600 illustrated in FIG. 6), the magnetic material that will form a permanent magnet shim may be magnetized can be logically partitioned into a plurality of regions. For example, a model of the magnetic material may be logically partitioned to spatially divide the model into the plurality of regions. According to some embodiments, the process of determining a magnetic pattern (e.g., by performing act 620 in method 600 illustrated in FIG. 6) includes determining which of the plurality of regions will be magnetized to contribute to the corrective magnetic field to be produced by the permanent magnet shim when the magnetic pattern is applied (e.g., by performing act 630 in method 600 illustrated in FIG. 6).

According to some embodiments, the process of determining a magnetic pattern includes determining the direction (e.g., polarity) of the magnetization applied to each of a plurality of regions to provide a desired corrective magnetic field to be produced by the permanent magnet shim when the magnetic pattern is applied. A magnetic pattern may indicate which regions of a logical partitioning are to be magnetized, in which direction and/or and at what field strength. According to some embodiments, a magnetic pattern indicates that at least one region is to have a magnetization oriented in a first direction (e.g., aligned with the $B_0$ magnetic field, aligned with the normal to a planar surface of the magnetic material to which the magnetic pattern is to be applied, etc.), and indicates that at least one region is to have a magnetization oriented in a second direction (e.g., anti-aligned or opposite the $B_0$ magnetic field, anti-aligned or opposite the normal to the planar surface of the magnetic material to which the magnetic pattern is to be applied, etc.). While the first and second directions may be opposite or supplementary each other (e.g., opposing polarities), the first and second directions may have other relationships to one another, such as complementary or orthogonal relationships, etc., as the aspects are not limited in this respect.

When applying a determined magnetic pattern includes using a magnetizing head that traverses magnetic material to magnetize the material in accordance with the magnetic pattern, the determined magnetic pattern may indicate which of the plurality of regions are to be magnetized and/or in what direction (e.g., either in alignment with the $B_0$ magnetic field or opposite or anti-alignment with the $B_0$ magnetic field), and/or which of the plurality of regions should be left alone (either in a magnetized or de-magnetized state depending on the implementation). For example, each region may be magnetized according to a given polarization, magnetized according to the opposite polarization or passed over by the magnetizing head. When applying a determined magnetic pattern includes using subtractive processes (e.g., cutting or subtractive 3D printing), the determined magnetic pattern may indicate which of the plurality of regions contribute to the corrective magnetic field and which of the plurality of regions are to be cut away or removed. When applying a determined magnetic pattern includes using additive processes, the determined magnetic pattern may indicate which regions magnetic material are to be added.

Figure 9A:
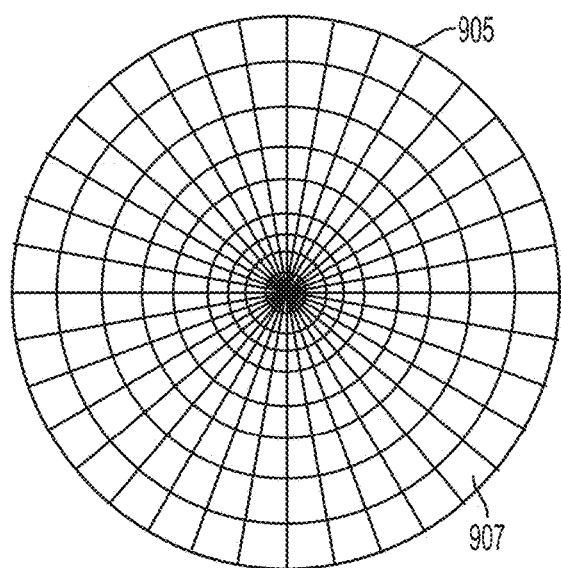
FIGS. 9A-9C illustrates exemplary techniques for logically partitioning magnetic material into a plurality of regions, in accordance with some embodiments.

As shown in FIG. 3 and FIG. 9A, a logical partitioning is formed via intersecting concentric ellipses and radial lines extending from the center of the material to points on the perimeter to form a plurality of regions 307 and 907, respectively. This logical partitioning may be particularly suitable for implementations that include an automated magnetizing head. For example, in the context of the exemplary system in FIG. 3, when applying a magnetic pattern to magnetic material to produce a corrective magnetic field to improve the profile of a $B_0$ magnetic field of a given B0 magnet, the automated magnetization system may control the magnetizing head while the material is rotated via rotatable component 360 to magnetize selected regions 307 to achieve a magnetization pattern configured to improve the profile of the $B_0$ magnetic field produced by the given $B_0$ magnet. The pattern of partitioning illustrated in FIGS. 3 and 9A results in regions that are smaller towards the center of material 305/905 and larger towards the periphery. In some $B_0$ magnet geometries (e.g., in bi-planar configuration), the influence of magnetized regions on the region of interest of the $B_0$ magnetic field (e.g., the field of view of a resulting low-field MRI system) decreases the farther the region is from the center due to the corresponding increased distance from the region of interest due to the magnetic field strength decreasing as a cube of the distance. As such, differing region sizes may make sense in such implementations, providing higher levels of granularity (e.g., higher "resolution") towards the center where magnetized regions will have the greatest impact, and less granularity towards the periphery. In embodiments in which applying the magnetic pattern includes subtractive processes (e.g., laser cutting or subtractive 3D printing), the logical partitions may form the borders along which the magnetic material is cut or removed. In embodiments in which applying the magnetic pattern includes additive processes, the logical partitions may form the boundaries of where magnetic material is added.

Figure 9B:
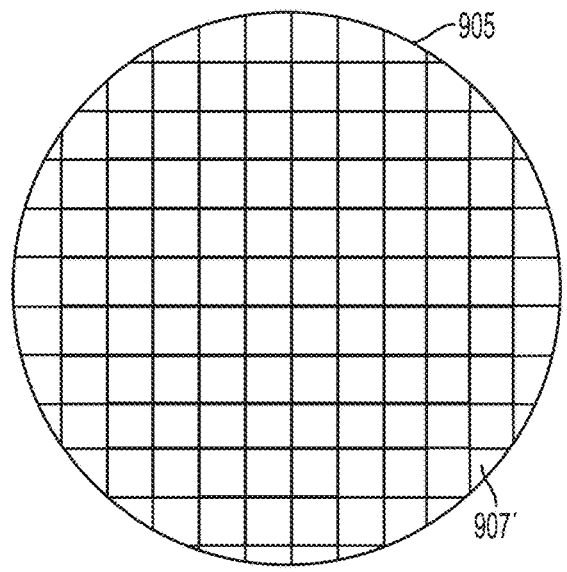
Figure 9C:
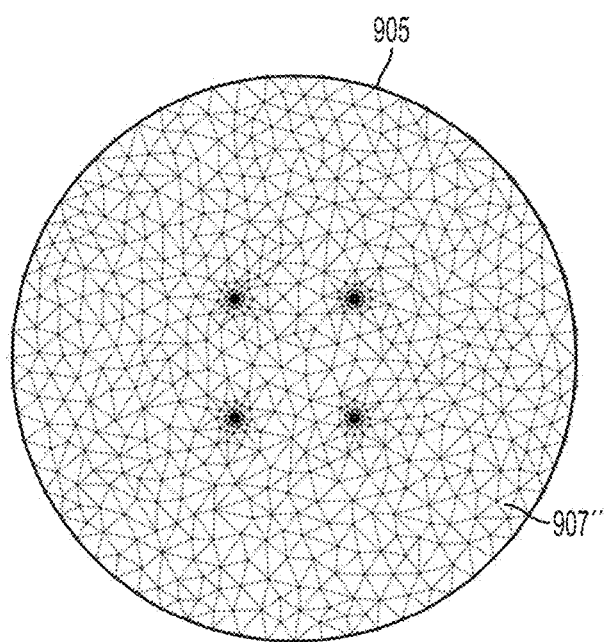

It should be appreciated that other logical partitions, as well as other shapes for the magnetic material are suitable and may be desirable for certain implementations. For example, FIG. 9B illustrates circular-shaped magnetic material 905 with a square logical partitioning, which according to some embodiments, are uniform in size, though this is not a limitation as the sizes of the partitions can be varied as desired to provide a plurality of regions 907'. FIG. 9C illustrates circular-shaped magnetic material 905 that is logically partitioned by tessellation. For example, the magnetic material 905 may be logically partitioned using a triangulated mesh to form a plurality of regions 907". It should be appreciated that magnetic material may be tessellated using polygons having any number of sides, as this technique is not limited to any specific tessellated geometry.

Figure 10A:
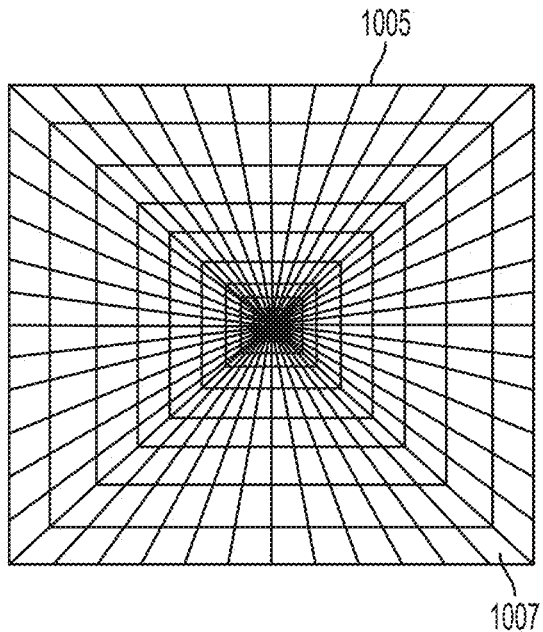
FIGS. 10A-10C illustrate exemplary techniques for logically partitioning magnetic material into a plurality of regions, in accordance with some embodiments.
Figure 10B:
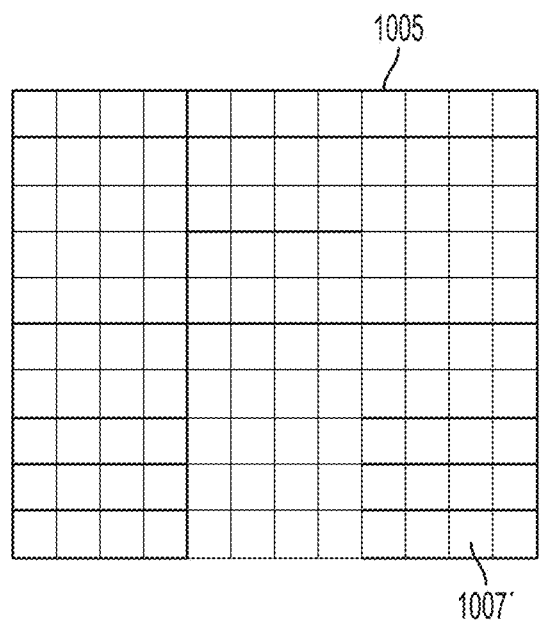
Figure 10C:
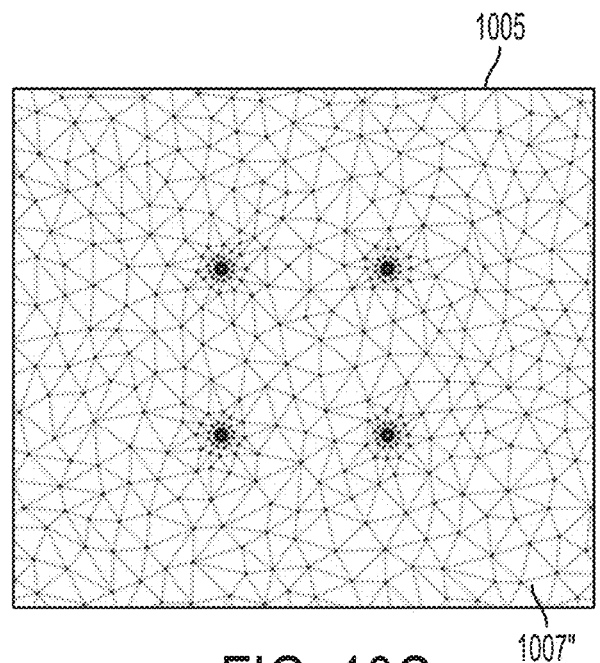
Figure 20:
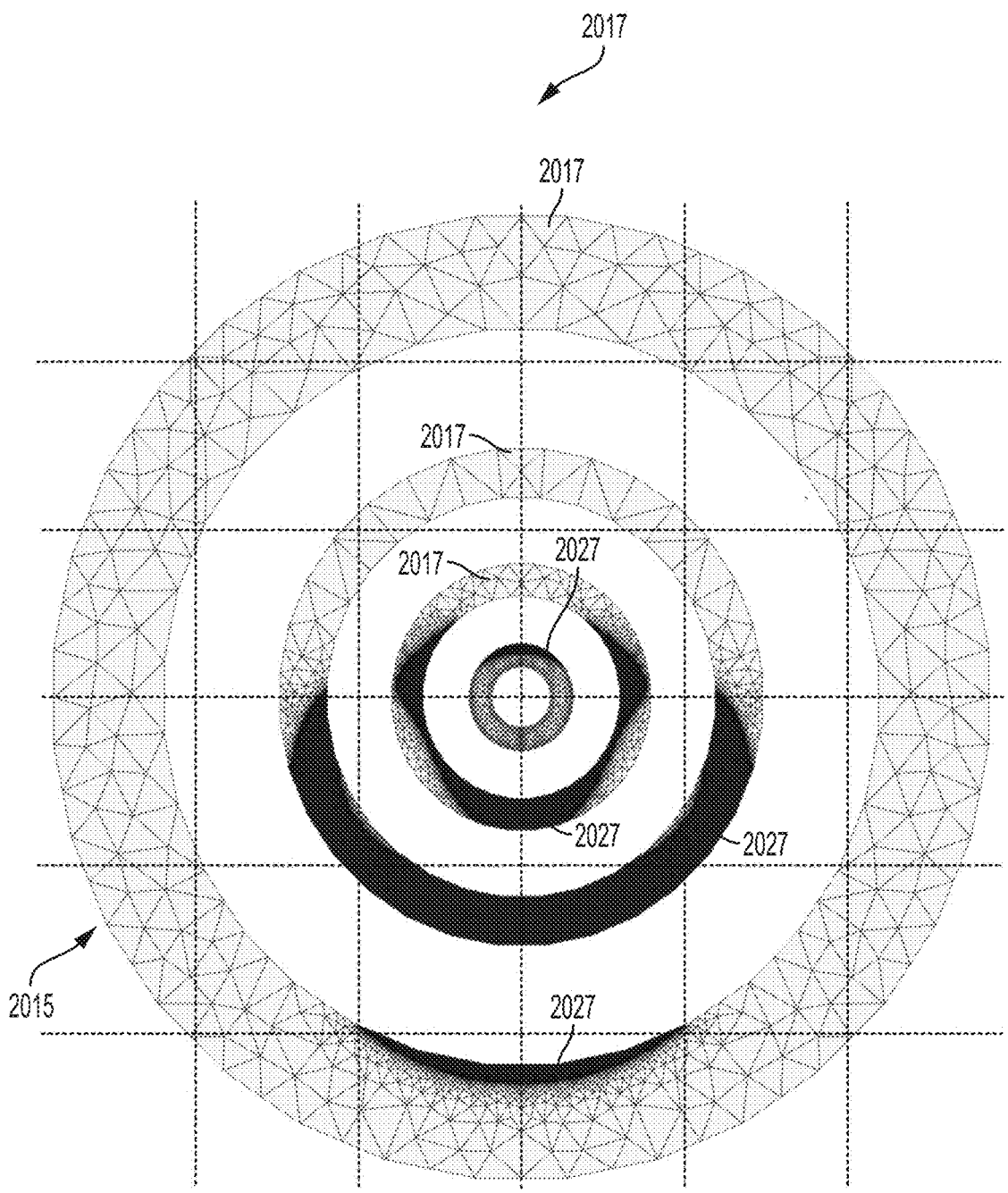
FIG. 20 illustrates a magnet pattern that, when applied to magnetic material, produces a corrective magnetic field configured to compensate for yoke effects, in accordance with some embodiments.

According to some embodiments, a tessellated mesh used to logically partition the magnetic material may be iteratively refined during an optimization process formulated to determine a magnetic pattern to be applied to produce a permanent magnet shim, examples of which are described in further detail below. FIGS. 10A-C illustrate rectangular-shaped magnetic material 1005 logically partitioned in the manner illustrated in FIGS. 9A-C, respectively, providing a plurality of regions 1007, 1007' and 1007" on a rectangular sheet of magnetic material. FIG. 20 illustrates concentric rings that constrain the region where magnetic material can provided, aligning the permanent magnet shim with, for example, permanent magnet rings of a B0 magnet, as discussed in further detail below. It should be appreciated that any size and shape may be used for the magnetic material, as well as for the logical partitioning of the material, as the techniques described herein are not limited for use in this respect.

Partitioning may also assist in the process of determining the magnetic pattern needed to provide a desired correction. According to some embodiments, a magnetic pattern is determined using a "library" of magnetic contributions or effects compiled by magnetizing regions of material and measuring the magnetic field that results. A library may be compiled in this manner for the various, shapes, sizes and materials used for magnetic shims as well as for any desired partitioning scheme. Using the exemplary magnetic material 305 illustrated in FIG. 3, for each type of material used, a single region 307 may be magnetized and the resulting magnetic field recorded. This may be repeated for each region to which the material has been partitioned so that the individual magnetic contribution or effect resulting from magnetizing each respective region is known and recorded in a corresponding library. When the deviation of a subject $B_0$ magnetic field from a desired profile is determined (e.g., by performing act 610 in method 600 illustrated in FIG. 6), the library corresponding to the type, shape and partitioning scheme of the shim being produced may be searched to locate a pattern of regions that, when magnetized, will produce the desired magnetic pattern.

Alternatively, instead of actually magnetizing regions of material and measuring the magnetic field produced, the magnetic contribution of regions of a given size and shape (i.e., according to a given partitioning scheme) for material of given type and shape may be modeled. A model may be produced for any of various desired shapes, sizes and types of materials to be used, as well as for different partitioning schemes. Thus, when the deviation from a desired profile is determined for a given $B_0$ magnetic field, the model corresponding to the type and shape of material and the partitioning scheme of the shim being produced may be used to identify a pattern of regions that will produce the desired magnetic pattern. Examples of employing a model to determine a magnetic pattern are discussed in further detail below. It should be appreciated that other techniques may be used to determine a magnetic pattern, as the aspects are not limited in this respect.

The search for a magnetic pattern that produces a desired corrective magnetic field may be performed using any technique and/or optimization scheme, in connection with either of the techniques described above (e.g., using a library, model, etc.). According to some embodiments, an optimization scheme to locate or identify a magnetic pattern suitable for generating a desired corrective magnetic field includes minimizing the total volume of material that needs to be magnetized to produce the corrective magnetic field. In this manner, a magnetic pattern may be determined that reduces or minimizes the amount of magnetization to be applied to the material, reducing the time required to produce a shim that produces the desired corrective magnetic field.

Figure 11:
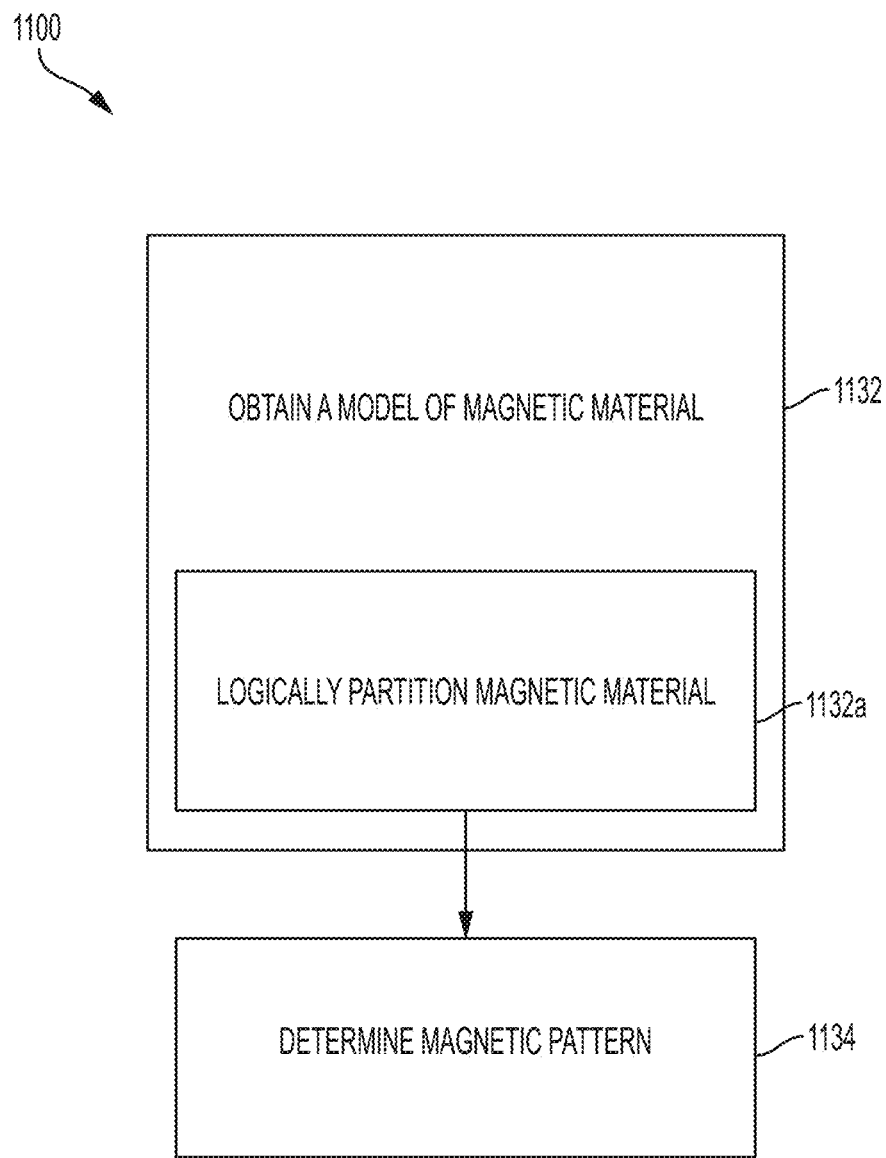
FIG. 11 is a flow chart illustrating a method for determining a magnetic pattern to apply to magnetic material to provide a permanent magnet shim, in accordance with some embodiments.

FIG. 11 is a flowchart depicting a method of determining a magnetic pattern to be applied to magnetic material, in accordance with some embodiments. Method 1100 may be performed, for example, as act 620 of method 600 illustrated in FIG. 6. In particular, once the deviation of the subject $B_0$ magnetic field from a desired profile is (e.g., by performing act 610 of method 600), method 1100 may be performed to determine a magnetic pattern to be applied to magnetic material that is adapted to provide a corrective magnetic field to compensate for the determined deviation to improve the profile of the $B_0$ magnetic field produced by a $B_0$ magnet. A magnetic pattern produced using method 1100 may be applied in any manner, including using any one or combination of a magnetizing head, subtractive processes, additive processes, etc.

In act 1132, a model of the magnetic material (e.g., a mathematical or geometric representation of relevant properties of the magnetic material to which a magnetic pattern is to be applied) is generated. A model may include the geometry of the magnetic material (size, shape, boundaries, etc.), one or more magnetic properties of the magnetic material and/or any other parameters or properties that facilitate determining a magnetic pattern that improves the profile of a $B_0$ magnetic field. Numerous software tools are available that facilitate the generation, manipulation and/or simulation of a model. According to some embodiments, the model generated in act 1132 allows for the magnetic field generated by the magnetic material to be simulated for different magnetic patterns.

Figure 12A:
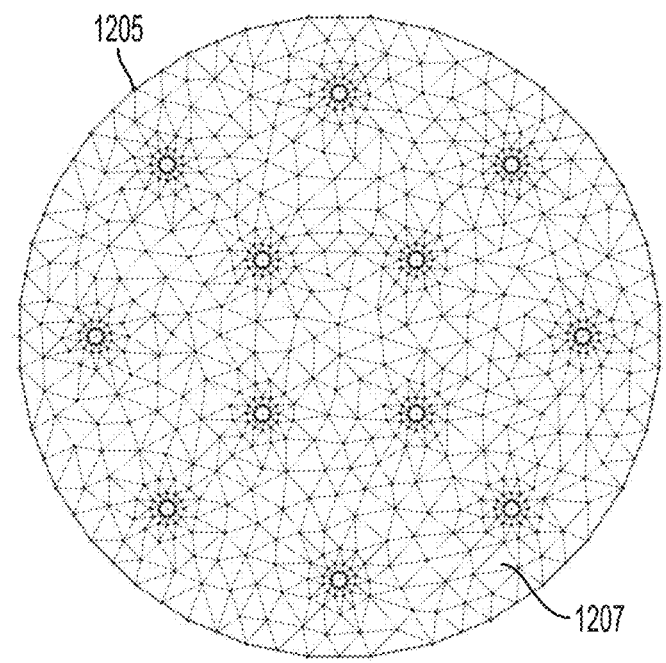
FIG. 12A illustrates an example of tessellated logical partitioning of a model of magnetic material, in accordance with some embodiments.

In act 1132a, the magnetic material is tessellated to incorporate a logical partition into the model of the magnetic material. For example, the magnetic material may be tessellated using a triangular mesh as shown in FIG. 9C or FIG. 12A. These exemplary tessellations include regions in which the logical partition is not permitted to provide a region that can be indicated as contributing to a magnetic field correction. For example, the circular regions in the mesh may designate areas that must remain free of magnetic material either to allow the resulting permanent magnet shim to be affixed to the B0 magnet, another shim, and/or to ensure that the permanent magnet shim does not interfere with other aspects of the B0 magnet design, though in some embodiments, no such regions need to be designated. It should be appreciated that magnetic material may be logically partitioned by applying any suitable partitioning of the model and may be partitioned at any desired resolution. For example, the model of the magnetic material may be tessellated at a desired resolution by selecting the number of control points (vertices) used in tessellating the model of the magnetic material. As an example, the model may be tessellated to provide 40 mm, 20 mm, 10 mm, 5 mm, 1 mm or less resolution. The higher the resolution (e.g., the smaller the tessellated partitions), the more computationally intensive the process of determining a magnetic pattern becomes, as discussed in further detail below.

In act 1134, a magnetic pattern is determined that, when applied to magnetic material, produces a corrective magnetic field that improves the profile of a B0 magnetic field. In particular, using the logical partition applied in act 1132a to partition the magnetic material into a plurality of regions (e.g., polygons), an optimization may be performed to determine which of the regions should be magnetized, in what polarity/direction and/or at what field strength to produce a corrective magnetic field that corrects, at least in part, the deviation of the $B_0$ magnetic field (e.g., as determined in act 610 of method 600). According to some embodiments, a dual state solution is utilized to produce a magnetic pattern. As one example of a dual state solution, the optimization determines a magnetic pattern that indicates whether each of the plurality of partitioned regions is to be magnetized in a given polarity or not magnetized. As another example of a dual state solution, the optimization determines whether each of the plurality of partitioned regions is to be magnetized in a given polarity or the opposite polarity.

According to some embodiments, a tri-state solution is utilized to produce a magnetic pattern. As one example of a tri-state solution, the optimization determines a magnetic pattern that indicates whether each of the plurality of partitioned regions is to be magnetized in a given polarity, magnetized in the opposite polarity, or not magnetized. According to some embodiments, additional states may be utilized in determining a magnetic pattern. For example, the optimization may determine a magnetic pattern that indicates whether each of the plurality partitioned regions is to be magnetized and in what direction, not magnetized and/or the strength of the magnetization for the respective magnetized region (i.e., different regions may be assigned different magnetic field strengths), or any combination thereof. It should be appreciated that determining a magnetic pattern is not limited for use with any particular type of solution, and any suitable method of producing a magnetic pattern that compensates for a determined deviation of a $B_0$ magnetic field may be used.

Figure 12B:
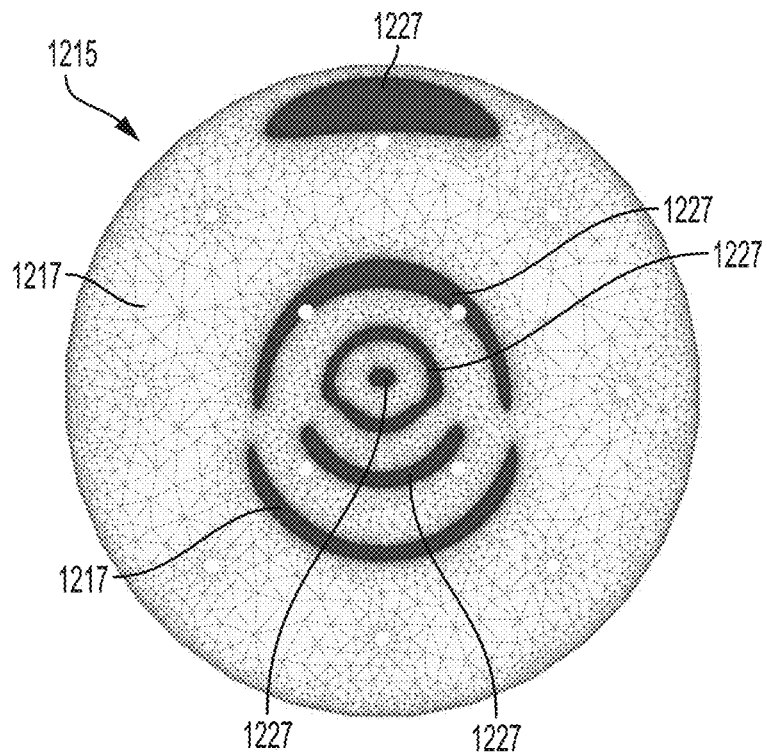
FIG. 12B illustrates an exemplary magnetic pattern determined at least in part by performing the method illustrated in FIG. 11.

FIG. 12B illustrates an exemplary magnetic pattern 1215 determined using an optimization that seeks to minimize the volume of the magnetized regions. In the exemplary magnetic pattern 1215 illustrated in FIG. 12B, the darker shaded regions indicate the portions of the magnetic material that are to be magnetized (i.e., portions of the magnetic material that contribute to the corrective magnetic field produced by the permanent magnet shim to which the magnetic pattern is applied), exemplary magnetized regions 1227 of which are labeled on the magnetic pattern 1215. The lighter shaded regions 1217 indicate portions that do not contribute to the corrective magnetic field. As discussed above, magnetic pattern 1215 may be applied to the magnetic material in any number of ways (e.g., by performing act 640 in method 600 illustrated in FIG. 6), including but not limited to using an automated magnetizing head (either on pre-magnetized or un-magnetized magnetic material), subtractive processes such as cutting away or removing portions determined as not contributing to the corrective magnetic field (either before or after magnetizing the magnetic material), additive processes such as additive 3D printing, cold spray techniques, etc. The resulting permanent magnet shim may then be arranged or positioned proximate the $B_0$ magnet to assist in correcting the $B_0$ magnetic field.

Numerous optimization methodologies may be used to determine a magnetic pattern and the aspects are not limited for use with any particular optimization scheme. According to some embodiments, an optimization scheme may be configured to minimize the volume of magnetized regions. According to some embodiments, an optimization scheme may be configured to maximize the volume of magnetized regions. One exemplary technique of which may be formulated as follows. The effect of all of the regions resulting from the logical partitioning (e.g., the triangulated mesh illustrated in FIG. 12A) are evaluated based on the model (e.g., based on the size, shape, magnetic properties, etc., of the magnetic material being modeled). The optimization problem to be solved can be expressed as follows.

$$\text{minimze} \sum_i w_i |x_i|$$
$$\text{subject to } C_l \le AX \le C_u$$
$$B_l \le X \le B_u$$

In this formulation, the optimization seeks to minimize the volume of magnetic material that is magnetized (i.e., that contributes to the magnetic field correction) in the magnetic pattern. It should be appreciated that the volume of magnetic material that is magnetized may be maximized (e.g., by maximizing the summation in the above formulation), which may have some benefits in some circumstances, as discussed in further detail below. The variables $x_i$ represent the values that are assigned to the i regions of the logical partition of the model of the magnetic material, which are allowed to take on values between a lower bound $B_l$ and an upper bound $B_u$. For example, the values $x_i$ may be allowed to take on values from a lower bound of zero, indicating that the corresponding region does not contribute a magnetic field correction, to an upper bound of one, indicating that the corresponding region produces a maximum magnetic field contribution. The weights $w_i$ correspond to any one or combination of weights that may be applied to the variables $x_i$, for example, area, volume, etc. For example, the normalized contribution of each region i may be weighted according to the area or volume of the region according to the logical partition. The weights $w_i$ may also be used to, for example, favor one or more other properties of each region, for example, the location of the region, connectedness of the region with other regions, etc. Thus, X represents a magnetic pattern indicating, inter alia, which of the plurality of regions contribute to the magnetic field correction. Matrix A is a magnetic model of the magnetic material that, when applied to X, produces a representation of a corrective magnetic field that would be produced if the magnetic pattern X were applied to the magnetic material. Accordingly, the exemplary optimization determines a magnetic field correction AX that sufficiently compensates for the determined deviation of the subject $B_0$ magnetic field from a desired profile using a minimum number of contributing regions. As with the determined deviation, matrix A may represent the magnetic field using an appropriate set of basis functions, such as spherical harmonics, or any other suitable representation.

Stated differently, the exemplary optimization determines a magnetic field correction AX that, when applied to the magnetic material, produces a corrective magnetic field that satisfactorily counteracts the determined deviation, thus bringing the $B_0$ magnetic field nearer the desired profile. Provided there are sufficient degrees of freedom and, more particularly, that the logical partitioning is at a high enough resolution to provide a sufficient number of regions, the minimization will drive the values $x_i$ to the bounds $B_l$, $B_u$. For example, in the exemplary formulation where Bl=0 and Bu=1, provided the optimization is performed at a high enough resolution, the minimization constraint will drive the values $x_i$ to the bounds of 0 or 1. Thus, the resulting magnetic pattern will indicate which of the regions of the logical partition contribute to the magnetic field correction and which regions do not, thereby providing a dual state solution.

As another example, Bl=−1 and Bu=1 so that the optimization determines a magnetic pattern that indicates which of the regions are to have a magnetization of a first polarity and which of the regions are to have a magnetization of the opposite polarity, providing another example of a dual state solution. This formulation may have the advantage that each region of the logical partition contributes to the magnetic field correction, either via a magnetization of a given polarity or via a magnetization of the opposite polarity, thus facilitating the elimination of the step of cutting away or otherwise removing regions of magnetic material that do not contribute to the corrective magnetic field. According to some embodiments, an optimization may be configured so that the resulting magnetic pattern indicates which regions contribute to the magnetic field correction and at which polarity and also indicates which regions do not contribute to the magnetic field correction (e.g., regions may be assigned a −1, 0 or −1), thus provide a tri-state solution. It should be appreciated that numerous other formulations may be used to determine a magnetic pattern that, when applied to magnetic material, produces a corrective magnetic field that improves the profile of a B0 magnetic field, as the aspects are not limited in this respect. Any suitable technique may be used to solve the optimization problem (e.g., the minimization or maximization problem) discussed above, including, but not limited to gradient descent, simulated annealing, Monte Carlo, linear programming, etc., as the aspects are not limited in this respect.

Figure 13:
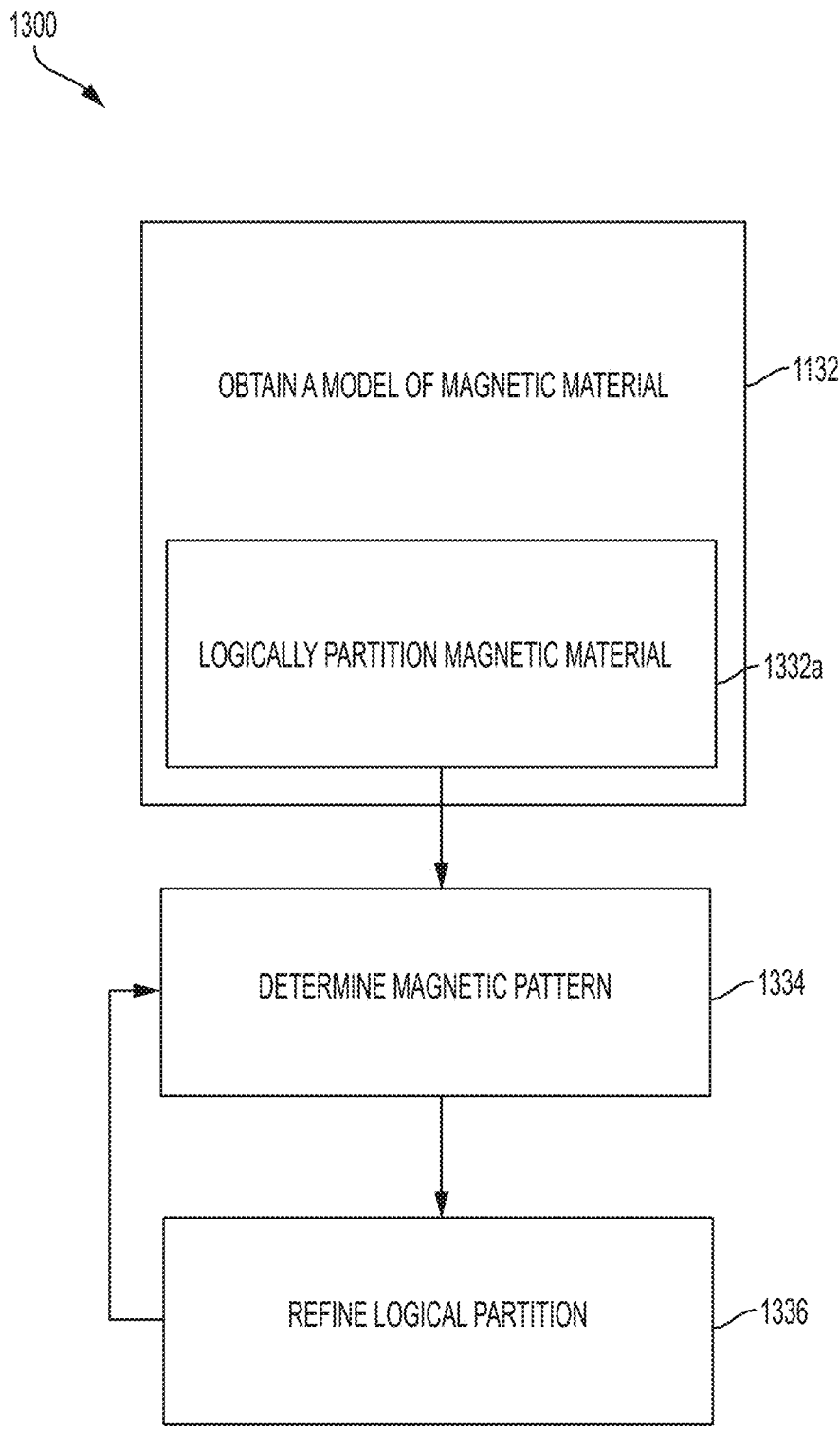
FIG. 13 is a flowchart illustrating a method of determining a magnetic pattern using an adaptive logical partitioning, in accordance with some embodiments.

As discussed above, a magnetic pattern may be determined at a resolution to produce a suitable or desired magnetic field correction (e.g., a correction that improves homogeneity, produces a $B_0$ offset, etc.). However, increasing the resolution of the magnetic pattern also increases the time and complexity needed to compute the magnetic pattern. The inventors have developed an iterative approach that begins with a relatively low resolution optimization process followed by one or more subsequent iterations at increasingly higher resolutions. The magnetic pattern from each iteration can be used to refine the logical partitioning for the subsequent iteration primarily at or limited to locations where further resolution is needed or desired, thereby reducing the computational burden while achieving desired resolution. FIG. 13 is a flowchart illustrating a method 1300 of iteratively determining a magnetic pattern to apply to magnetic material to produce a permanent magnet shim, in accordance with some embodiments.

Figure 14A:
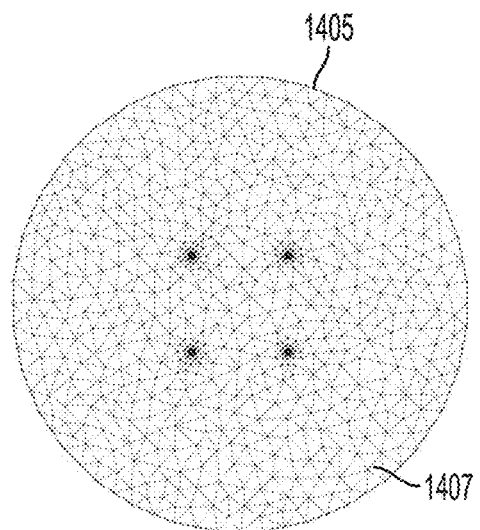
FIG. 14A illustrates an exemplary logical partitioning of magnetic material, in accordance with some embodiments.

In act 1332, a model of the magnetic material to which the determined magnetic pattern is to be applied is obtained (e.g., in a manner similar to act 1132 of method 1100 illustrated in FIG. 11). In act 1332a, the magnetic material is logically partitioned by, for example, incorporating a tessellation of the magnetic material into the model as described in connection with act 1132a above. According to some embodiments, the partitioning is performed at a lower resolution than the target resolution for the final magnetic pattern to be applied to produce a permanent magnet shim. For example, the model may be triangulated at a resolution of approximately 40 mm, which is schematically illustrated in FIG. 14A. By initially partitioning the magnetic material at a relatively low resolution, the computation time to produce an initial magnetic pattern can be significantly reduced.

Figure 14B:
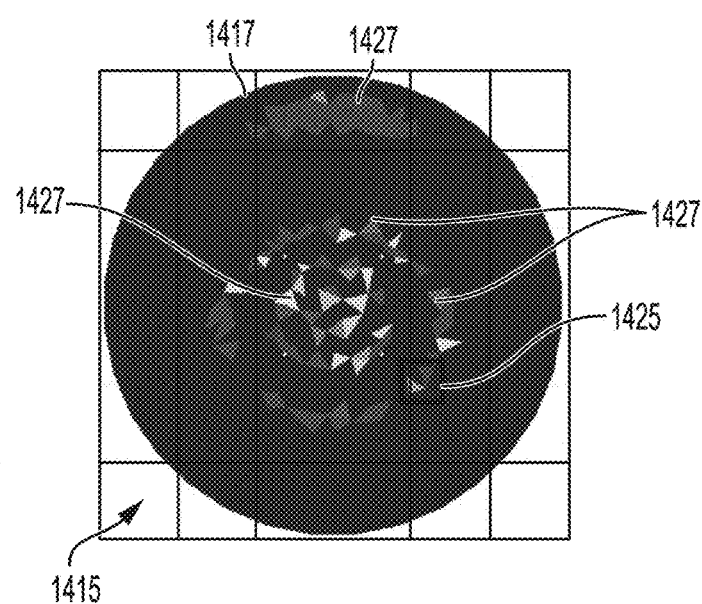
FIG. 14B illustrates a magnetic pattern determined during a first iteration using a first logical partitioning, in accordance with some embodiments.

In act 1334, a magnetic pattern is determined, for example, by performing an optimization that determines a magnetic pattern that, when applied to magnetic material, produces a corrective magnetic field that improves the profile of the $B_0$ magnetic field (e.g., a magnetic pattern that corrects for the deviation computed in act 610 of method 600 illustrated in FIG. 6). For example, the optimization discussed above may be used to determine a magnetic pattern using the logical partition provided in act 1332a. FIG. 14B illustrates an example of a magnetic pattern determined by performing act 1334. In this exemplary embodiment, the optimization permits each region to take on any value between 0 and 1, though other bounds and ranges may be used. As discussed in connection with the exemplary optimization above, when sufficient variables are present (e.g., sufficient control points), the values assigned to the plurality of regions will be driven to the boundaries (0 or 1) because the optimization can be formulated to prefer the boundary values. However, due to the relatively low resolution at which the first iteration is performed, many of the regions are assigned values in between 0 and 1.

It should be appreciated that the magnetic pattern generated in the first iteration may operate as the final magnetic pattern depending on how the magnetic pattern is applied to the magnetic material. For example, 3D printing techniques allow for differing amounts of magnetic material to be applied at different locations, allowing the magnetic field contribution to vary from region to region in accordance with the values between zero and one assigned to corresponding regions of the logical partition. However, for a permanent magnet shim having a uniform thickness, further refinement of the magnetic pattern may be required.

In act 1336, the logical partitioning of the magnetic material is refined. For example, the logical partitioning may be refined by increasing the resolution (e.g., by increasing the number of control points) in regions where the optimization assigned non-zero values, or alternatively, increasing the resolution in regions assigned relatively significant values in the previous iteration (e.g., values above a predetermined threshold). In this manner, the resolution may be increased only in areas where the magnetic pattern contributes to the corrective magnetic field, reducing computation time while achieving greater resolution. According to some embodiments, the logical partitioning is refined by adding control points along the boundaries of regions contributing to the magnetic field correction. For example, additional control points may be provided along the boundary of each region that was assigned a non-zero value, as illustrated in FIG. 14C.

Figure 14C:
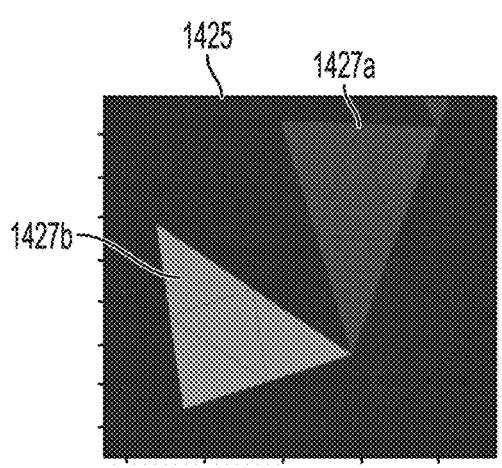
FIG. 14C illustrates a portion of the magnetic pattern illustrated in FIG. 14B that has been re-partitioned based on the determined magnetic pattern.

FIG. 14C illustrates an magnified view of portion 1425 of the magnetic pattern illustrated in FIG. 14B showing two partitioned regions 1427a and 1427b that were assigned non-zero values by the optimization. To refine the logical partition, a control point may be added at the mid-point of each edge forming the boundary between zero and non-zero regions. As shown in FIG. 14C, the result of tessellating the model of the magnetic material with the additional control points produces smaller partitioned regions in the area proximate to regions 1427a and 1427b than the regions produced using the initial tessellation, as illustrated in FIG. 14B. According to some embodiments, instead of refining the logical partition about each region assigned a non-zero value by the optimization, the partitioned regions may first be re-assigned either a zero or one value based on a comparison to a threshold value to further reduce the area that undergoes refinement. For example, all regions assigned a value less than 0.5 by the optimization may be assigned a zero and all regions assigned a value greater than or equal to 0.5 may be assigned a value of one. After thresholding using any desired threshold value, refinement of the logical partition may be implemented by adding control points to the boundary between zero-valued and one-valued regions in the manner discussed above. By reducing the number of regions that are refined (e.g., by adding control points to boundary edges), the resolution may be increased in these areas without unsatisfactorily increasing the computation time. It should be appreciated that the above techniques are merely exemplary and a logical partition may be refined in any suitable way, as the aspects are not limited in this respect.

Figure 14D:
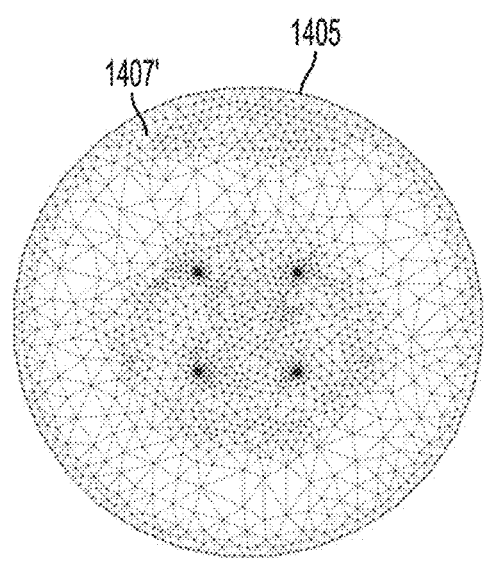
FIG. 14D illustrates an adapted logical partitioning produced by increasing the resolution of the logical partition in areas indicated by the magnetic pattern illustrated in FIG. 14B as contributing to the corrective magnetic field.

FIG. 14D illustrates a refined logical partition of the magnetic material determined by performing act 1336. As shown, the partitioned regions at a boundary between regions that contribute to the magnetic field correction and regions that do not contribute to the magnetic field correction in the magnetic pattern determined in the first iteration are of a higher resolution (e.g., approximately 20 mm), while partitioned regions that are not at boundaries between contributing and non-contributing regions remain substantially at the lower resolution (e.g., approximately 40 mm). A magnetic pattern may then be determined using the refined logical partitioning determined in act 1336, for example, by again performing act 1334 on the refined logical partitioning. This iterative process (repeating acts 1334 and 1336) of determining a magnetic pattern at increasingly higher resolutions may be repeated any number times to achieve a suitable magnetic pattern to apply, using any suitable technique, to produce a permanent magnet shim.

Figure 15A:
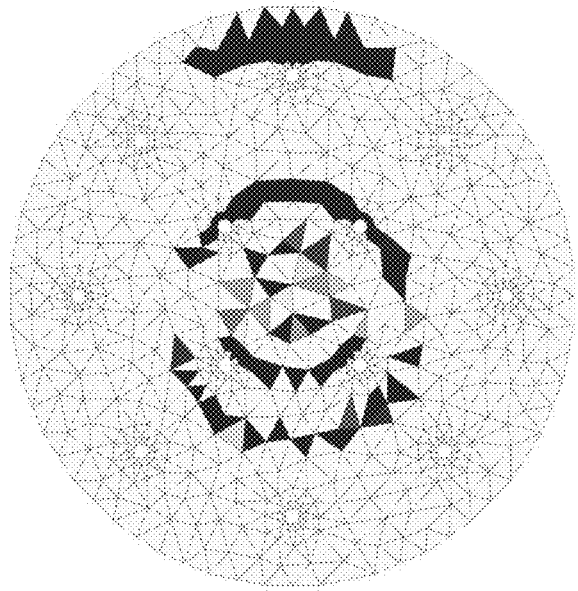
FIGS. 15A-15E illustrate magnetic patterns determined on each of a plurality of iterations that refine the logical partitioning based on the magnetic pattern determined in the previous iteration, in accordance with some embodiments.
Figure 15B:
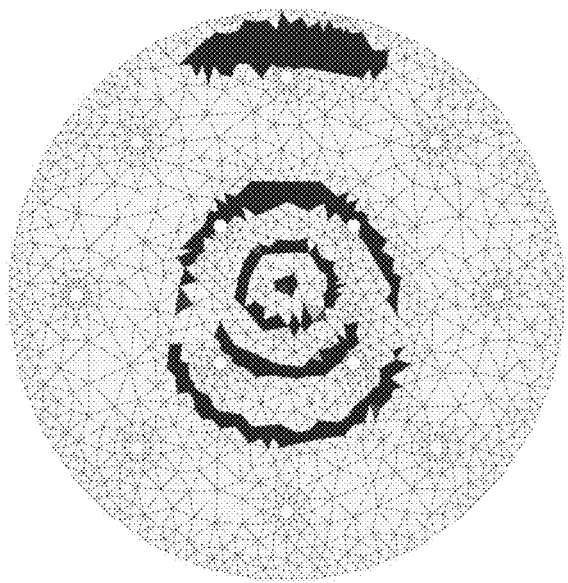
Figure 15C:
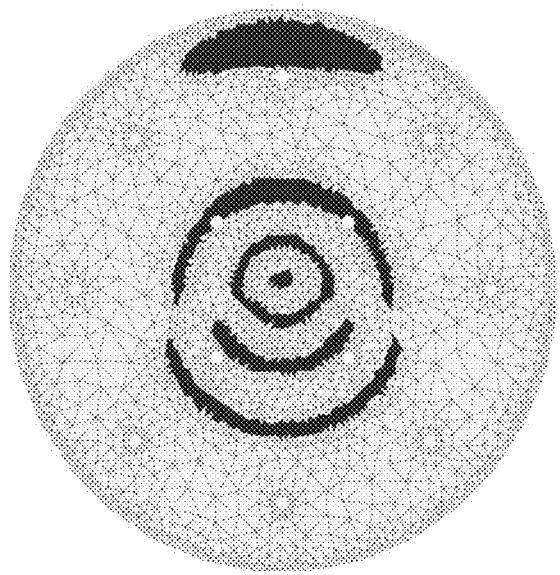
Figure 15D:
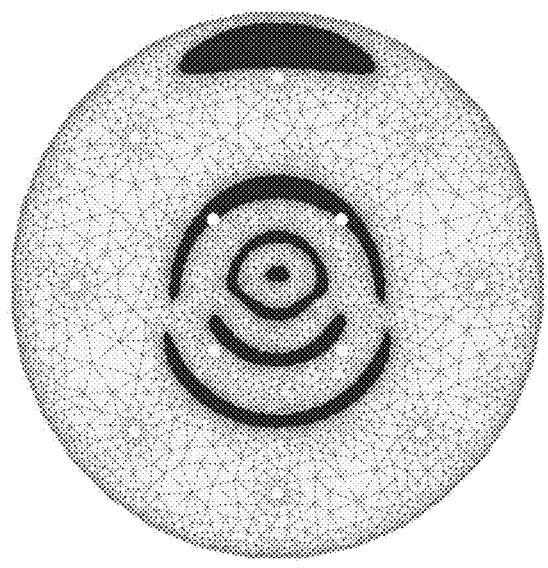
Figure 15E:
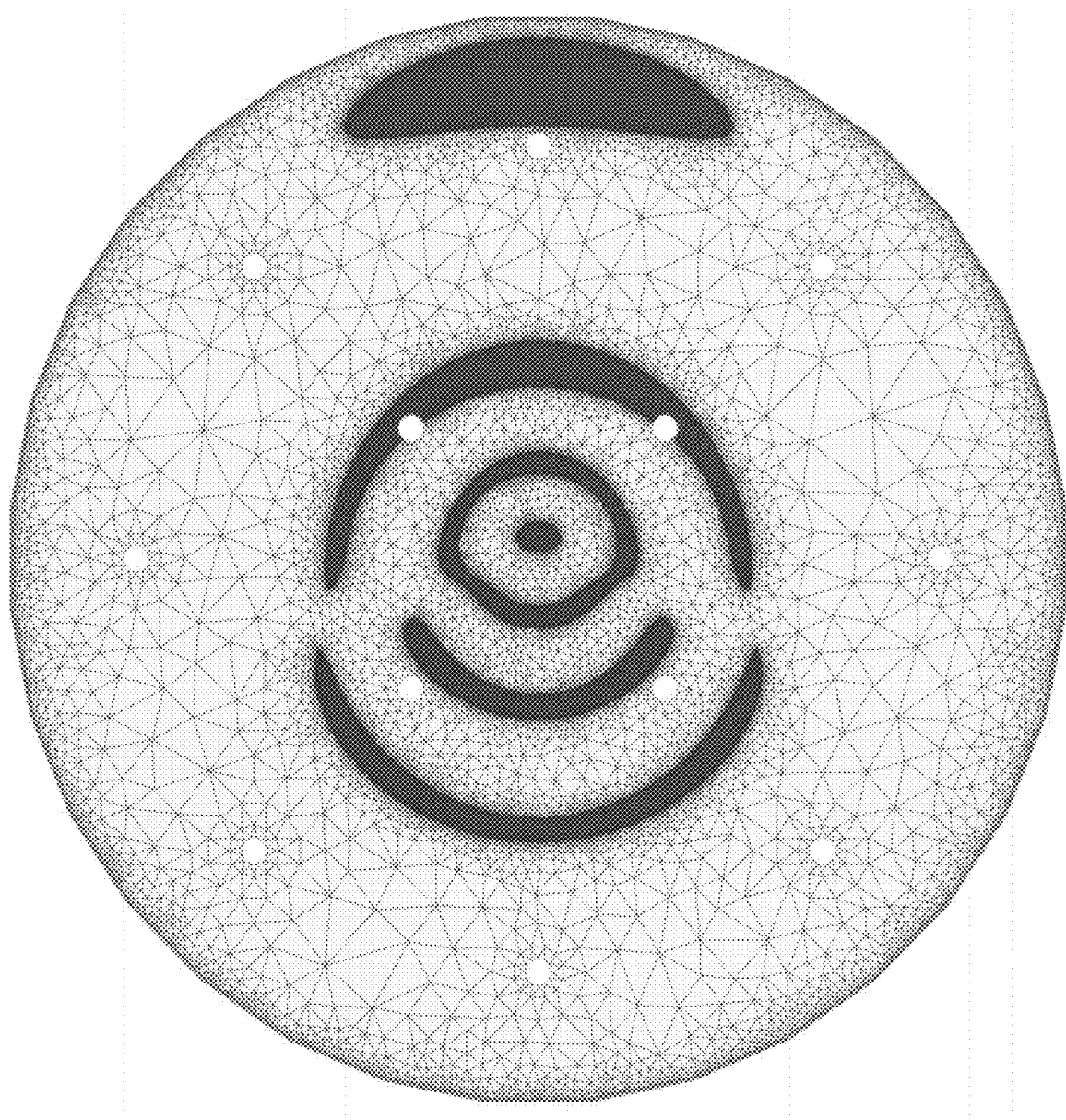

FIGS. 15A-E illustrate respective magnetic patterns produced over the course of five iterations, wherein the logical partition is refined on each iteration to improve the resolution (e.g., approximately 40 mm resolution in FIG. 15A, approximately 20 mm resolution in FIG. 15B, approximately 10 mm resolution in FIG. 15C, approximately 5 mm resolution in FIG. 15D and approximately 1 mm resolution in the final magnetic pattern illustrated in FIG. 15E). As shown, as the logical partitioning is refined, the optimization has increased degrees of freedom (e.g., by virtue of added control points in contributing areas) on each iteration and is therefore capable of finding a solution that assigns a boundary value (e.g., zero or one value) to most, if not all, partitioned regions. Thus, the resulting magnetic pattern is suitable for single polarity solutions capable of being applied to magnetic material having generally uniform thickness.

The exemplary optimization discussed above to produce the magnetic pattern illustrated in FIGS. 15A-15E is formulated to minimize the volume of magnetic material contributing to the corrective magnetic field. This may be particularly suitable for certain techniques of applying the magnetic pattern to magnetic material such as an automated magnetizing head or 3D printing, as it minimizes the number of regions that the head needs to traverse and magnetize in the former and reduces the amount of material additively applied in the latter. While the magnetic pattern illustrated in FIG. 15E is suitable for application using other techniques, such as by cutting or removing magnetic material in accordance with the magnetic pattern (e.g., via laser cutting, subtractive 3D printing techniques), it may be advantageous to use an optimization that seeks to maximize the volume of magnetized material. For example, a maximization optimization may reduce or eliminate isolated regions in the resulting magnetic pattern that complicate application of the magnetic pattern using some techniques, may reduce the amount of cutting required, etc. Additionally, a maximization approach may also facilitate providing certain types and/or combinations of corrections, as discussed in further detail below.

Figure 16:
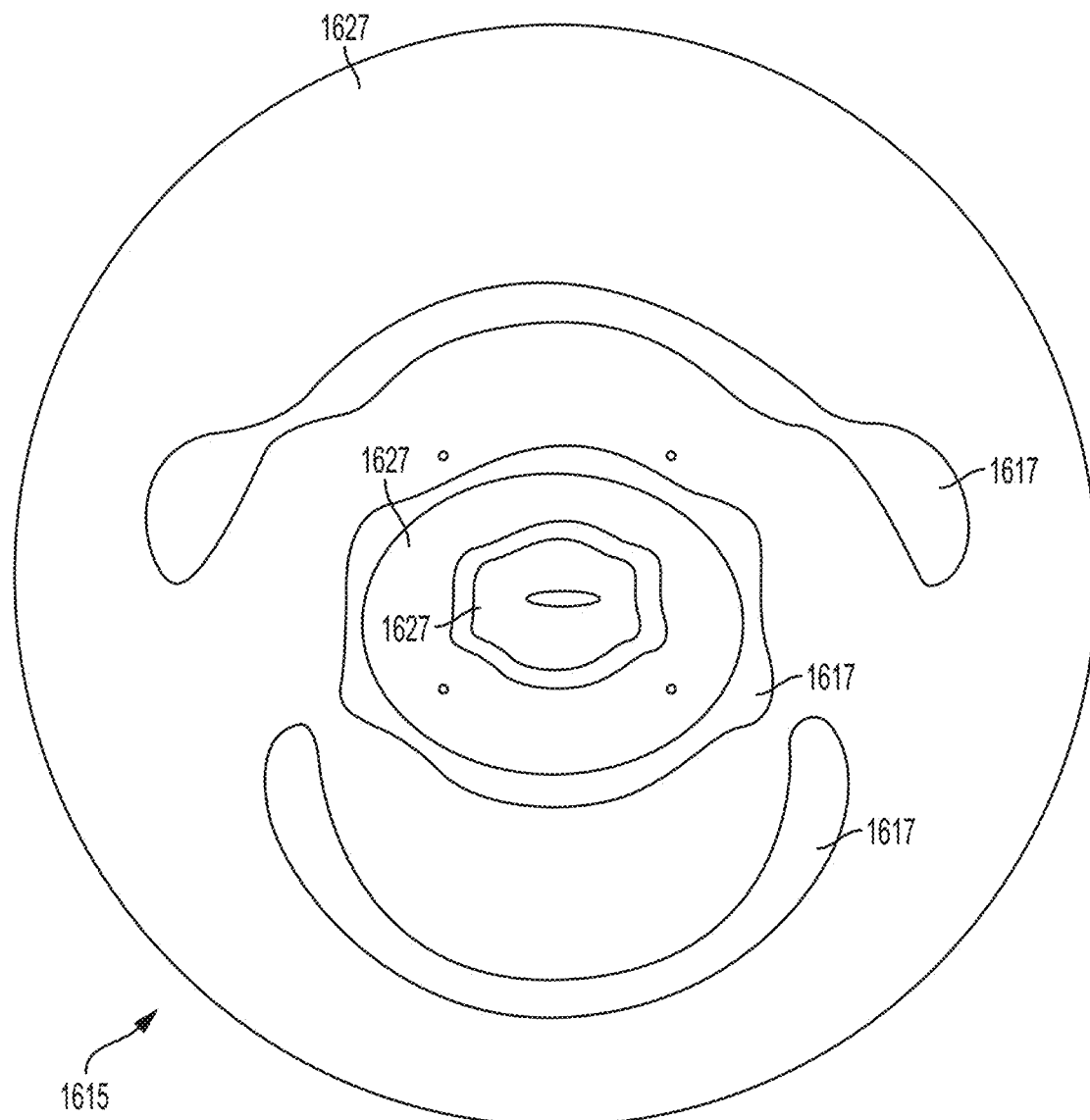
FIG. 16 illustrates a magnetic pattern determined using an optimization that maximizes the number of regions contributing to the magnetic field correction, in accordance with some embodiments.

FIG. 16 illustrates a magnetic pattern resulting from an optimization that seeks to maximize the volume of magnetized material. As shown in FIG. 16, the majority of the partitioned regions in magnetic pattern 1615 contribute to the magnetic field correction, as exemplified by magnetized regions 1627. Significantly fewer partitioned regions do not contribute to the magnetic field correction, as exemplified by non-magnetized regions 1617. Magnetic pattern 1615 may provide a simpler pattern to apply to magnetic material to produce a permanent magnet shim, for example, when the technique used to apply the magnetic pattern involves cutting away or removing the regions that do not contribute to the magnetic field correction. Magnetic pattern 1615 may produce substantially the same magnetic field correction as the magnetic pattern illustrated in FIG. 15E from a uniformity perspective, but with the addition of a $B_0$ offset that can be used to raise the field strength of the $B_0$ magnetic field, as discussed in further detail below. As a result, magnetic pattern 1615, when applied to magnetic material, may produce a magnetic field that corrects for at least some non-uniformity in the $B_0$ magnetic field produced by a $B_0$ magnetic field as well as correcting for a $B_0$ offset error. It should be appreciated that any combination of optimization to produce a magnetic pattern and any technique for applying the magnet pattern to magnetic material to produce a permanent magnet shim may be used, as the aspects are not limited in this respect.

Figure 17A:
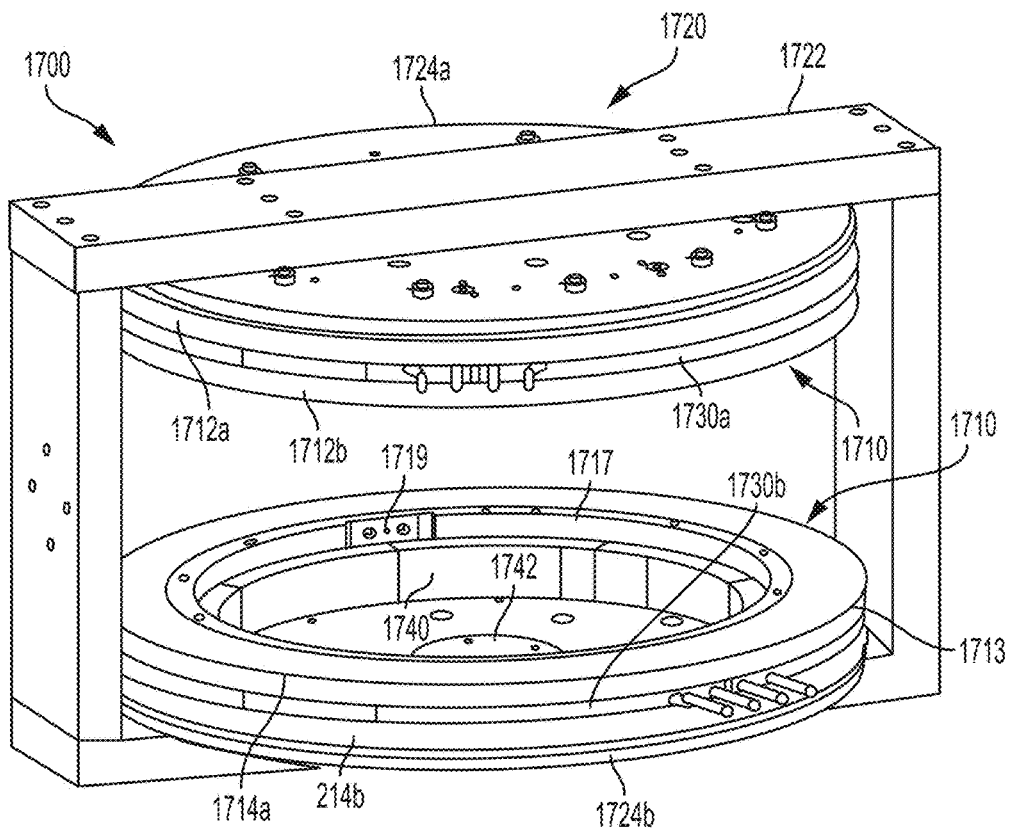
FIGS. 17A and 17B illustrate a B0 electromagnet for which a permanent magnet shim may be produced, in accordance with some embodiments.
Figure 17B:
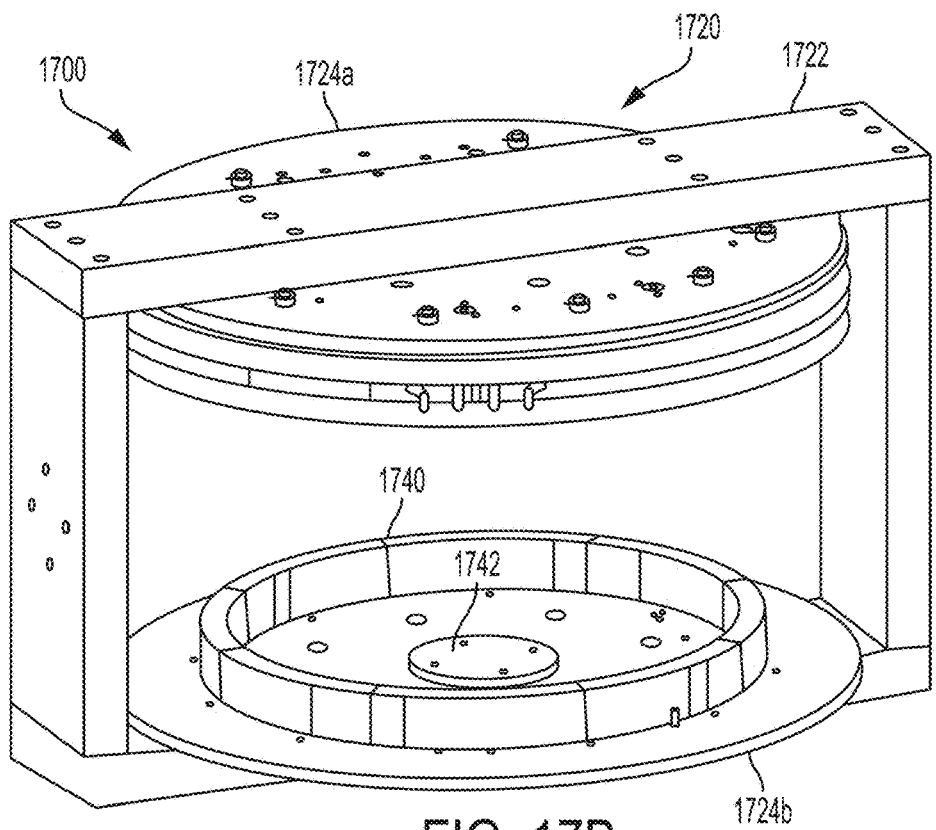

As discussed above, permanent magnet shims provided using the techniques described herein can be used to correct the $B_0$ magnetic field produced by any type of $B_0$ magnet, including, but not limited to electromagnets, permanent magnets and/or combinations of both, some examples of which are described in further detail below. For example, FIGS. 17A and 17B illustrate a $B_0$ magnet formed using an electromagnet and a ferromagnetic yoke. In particular, $B_0$ magnet 1700 is formed in part by an electromagnet 1710 arranged in a bi-planar geometry comprising electromagnetic coils 1712a and 1712b on an upper side and electromagnetic coils 1714a and 1714b on a lower side of $B_0$ magnet 1700. According to some embodiments, the coils forming electromagnet 1710 may be formed from a number of turns of a conductor 1713 (e.g., a copper wire or copper ribbon, or any other conductive material) suitable for producing a magnetic field when operated (e.g., when electrical current is driven through the conductor windings). While the exemplary electromagnet illustrated in FIGS. 17A and 17B comprises two pairs of coils, an electromagnet may be formed using any number of coils in any configuration, as the aspects are not limited in this respect. Conductor 1713 (e.g., a copper ribbon, wire, paint, etc. with suitable insulation to electrically isolate the multiple windings of the coil) may be wound about a fiberglass ring 1717 and a connector 1719 may be provided to allow for a power connection to provide current to operate coils 1714a and 1714b in series. A similar connector on the upper side of the electromagnet (not visible in FIGS. 17A and 17B) may be provided to operate coils 1712a and 1712b. It should be appreciated that the electromagnetic coils may be formed from any suitable material and dimensioned in any suitable way so as to produce or contribute to a desired $B_0$ magnetic field, as the aspects are not limited for use with any particular type of electromagnet.

In the exemplary $B_0$ magnet illustrated in FIGS. 17A and 17B, each coil pair 1712 and 1714 is separated by thermal management components 1730a and 1730b, respectively, to transfer heat produced by the electromagnetic coils and gradient coils (not illustrated in FIGS. 17A and 17B) away from the magnets to provide thermal management for the MRI device. In particular, thermal management components 1730a and 1730b may comprise a cooling plate having conduits that allow coolant to be circulated through the cooling plate to transfer heat away from the magnets. The cooling plate 1730a, 1730b may be constructed to reduce or eliminate eddy currents induced by operating the gradient coils that can produce electromagnetic fields that disrupt the $B_0$ magnetic field produced by the $B_0$ magnet 1700.

$B_0$ magnet 1700 further comprises a yoke 1720 that is magnetically coupled to the electromagnet to capture magnetic flux that, in the absence of yoke 1720, would be lost and not contribute to the flux density in the region of interest between the upper and lower electromagnetic coils. In particular, yoke 1720 forms a "magnetic circuit" connecting the coils on the upper and lower side of the electromagnet so as to increase the flux density in the region between the coils, thus increasing the field strength within the field of view of the $B_0$ magnet (i.e., the region between the coils where the $B_0$ magnetic field is suitable for imaging). Yoke 1720 comprises frame 1722 and plates 1724a, 1724b, which may be formed using any suitable ferromagnetic material (e.g., iron, steel, etc.). Plates 1724a, 1724b collect magnetic flux generated by the coil pairs of electromagnet 1710 and directs it to frame 1722 which, in turn, returns the flux back to the opposing coil pair, thereby increasing, by up to a factor of two, the magnetic flux density in the imaging region between the coil pairs (e.g., coil pair 1712a, 1712b and coil pair 1714a, 1714b) for the same amount of operating current provided to the coils. The imaging region, or field of view, refers to the volume of space wherein the profile of the $B_0$ magnetic field has sufficient field homogeneity and satisfactory field strength that detectable MR signals can be produced. Thus, yoke 1720 can be used to produce a higher $B_0$ magnetic field (resulting in higher SNR) without a corresponding increase in power requirements, or yoke 1720 can be used to lower the power requirements of $B_0$ magnet 1700 for a given $B_0$ magnetic field. It should be appreciated that the yoke 1720 may be made of any suitable material (e.g., low-carbon steel, silicon steel, cobalt steel, etc.) and may be dimensioned to provide desired magnetic flux capture while satisfying other design constraints such as weight, cost, magnetic properties, etc.

$B_0$ magnet 1710 further comprises shim rings 1740a, 1740b and shim disks 1742a, 1742b configured to augment the generated $B_0$ magnetic field to improve homogeneity in the field of view (e.g., in the region between the upper and lower coils of the electromagnet where the $B_0$ magnetic field is suitable for sufficient MR signal production), as best seen in FIG. 17B in which the lower coils have been removed. In particular, shim rings 1740 and shim disk 1742 are dimensioned and arranged to increase the uniformity of the magnetic field generated by the electromagnet at least within the field of view of the $B_0$ magnet. In particular, the height, thickness and material of shim rings 1740a, 1740b and the diameter, thickness and material of shim disks 1742a, 1742b may be chosen as appropriate.

Despite the use of shim rings, manufacturing tolerances and/or other errors in production of a $B_0$ electromagnet (e.g., $B_0$ magnet 1710) result in non-uniformities in the $B_0$ magnetic field. To correct for at least some non-uniformities in the $B_0$ magnetic field (e.g., post-production non-uniformities), a permanent magnet shim produced using any of the techniques described herein may be used. For example, method 600 illustrated in FIG. 6 may be performed to produce a permanent magnet shim that can be arranged proximate electromagnet 1712a and/or 1712b to improve the profile of the $B_0$ magnetic field. It should be appreciated that the techniques described herein may be used to improve the profile of a $B_0$ magnetic field produced by any $B_0$ electromagnet, and are not limited for use with the exemplary $B_0$ magnet described in FIGS. 17A and 17B.

Figure 18:
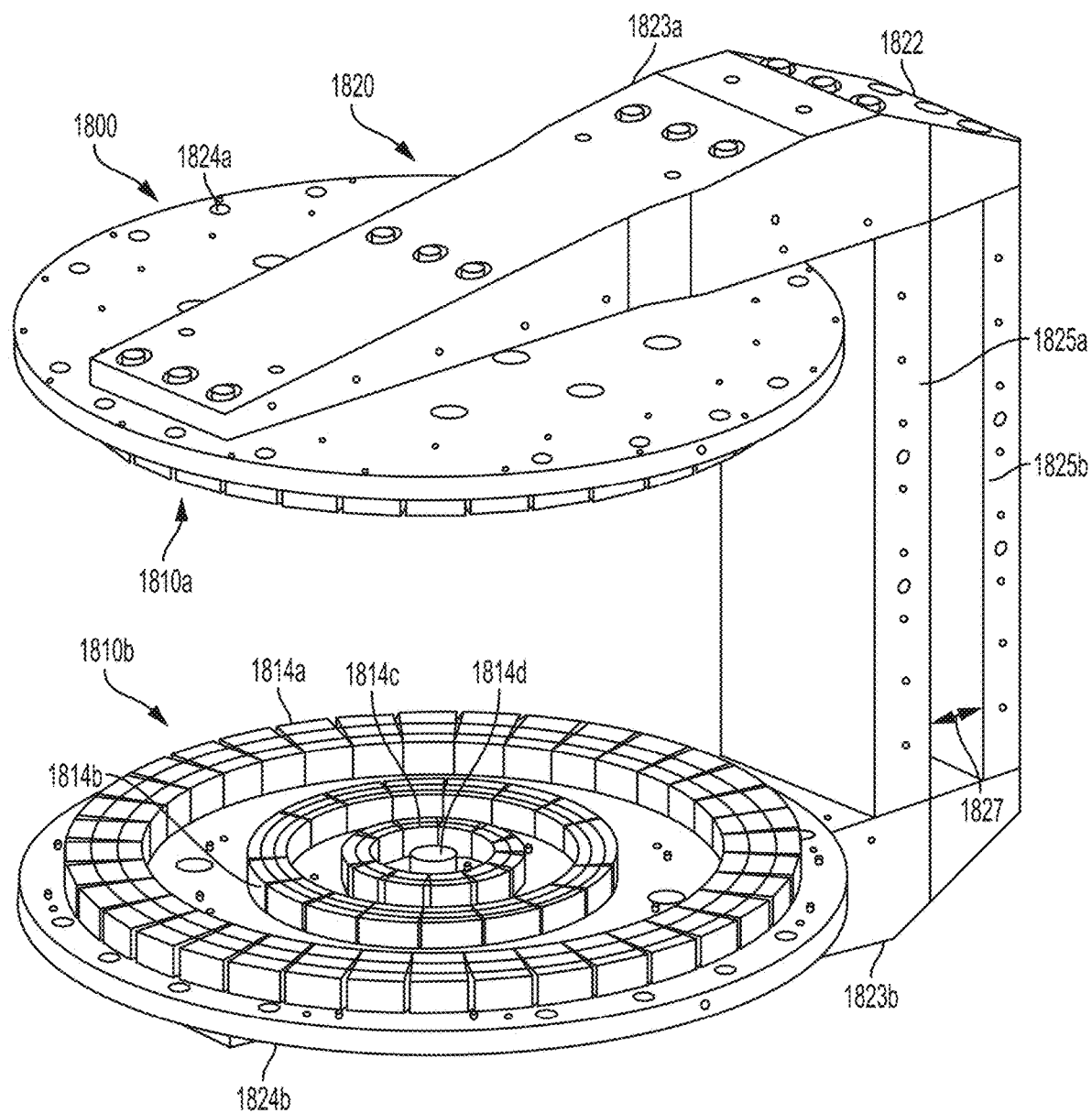
FIG. 18 illustrates an exemplary permanent B0 magnet for which a permanent magnet shim may be produced, in accordance with some embodiments.

Permanent magnet shims may also be used to improve the profile of a $B_0$ magnetic field produced by a permanent B0 magnet. For example, FIG. 18 illustrates a permanent $B_0$ magnet for which the shimming techniques described herein may be applied. $B_0$ magnet 1800 is formed by permanent magnets 1810a and 1810b arranged in a bi-planar geometry and a yoke 1820 that captures electromagnetic flux produced by the permanent magnets and transfers the flux to the opposing permanent magnet to increase the flux density between permanent magnets 1810a and 1810b. Each of permanent magnets 1810a and 1810b are formed from a plurality of concentric permanent magnets. In particular, as visible in FIG. 18, permanent magnetic 1810b comprises an outer ring of permanent magnets 1814a, a middle ring of permanent magnets 1814b, an inner ring of permanent magnets 1814c, and a permanent magnet disk 1814d at the center. Permanent magnet 1810a may comprise the same set of permanent magnet elements as permanent magnet 1810b. The permanent magnet rings are sized and arranged to produce a relatively homogenous field of a desired strength in the central region (field of view) between permanent magnets 1810a and 1810b. In the exemplary embodiment illustrated in FIG. 18, each permanent magnet ring comprises a plurality segments, each segment formed using a plurality of blocks that are stacked in the radial direction and positioned adjacent to one another about the periphery to form the respective ring.

$B_0$ magnet 1800 further comprises yoke 1820 configured and arranged to capture magnetic flux generated by permanent magnets 1810a and 1810b and direct it to the opposing side of the $B_0$ magnet to increase the flux density in between permanent magnets 1810a and 1810b, increasing the field strength within the field of view of the $B_0$ magnet. By capturing magnetic flux and directing it to the region between permanent magnets 1810a and 1810b, less permanent magnet material can be used to achieve a desired field strength, thus reducing the size, weight and cost of the $B_0$ magnet. Yoke 1820 comprises a frame 1822 and plates 1824a and 1824b that capture magnetic flux generated by permanent magnets 1810a and 1810b and direct it to frame 1822 to be circulated via the magnetic return path of the yoke to increase the flux density in the field of view of the $B_0$ magnet. Exemplary frame 1822 comprises arms 1823a and 1823b that attach to plates 1824a and 1824b, respectively, and supports 1825a and 1825b providing the magnetic return path for the flux generated by the permanent magnets.

Figure 19:
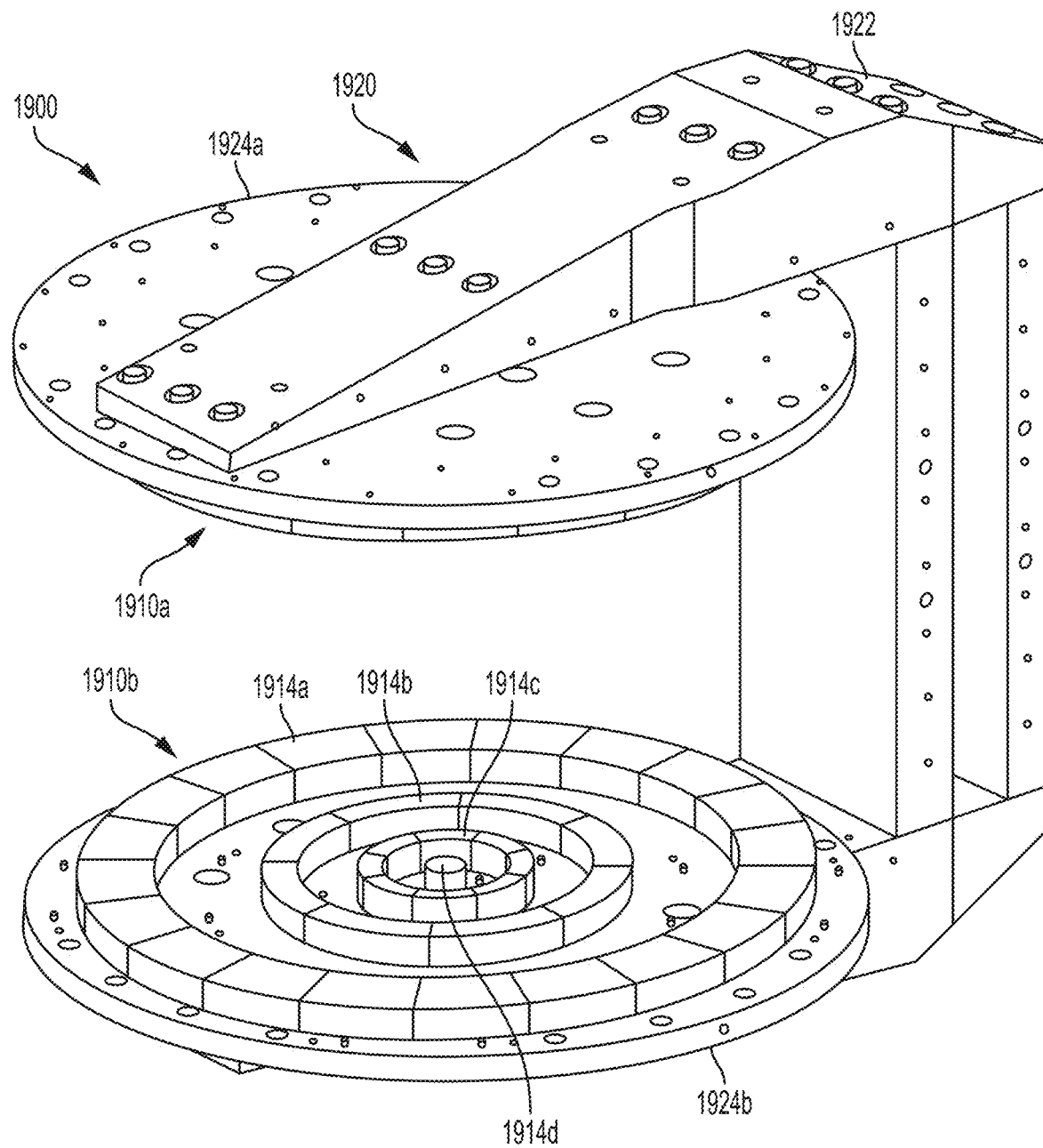
FIG. 19 illustrates another exemplary permanent B0 magnet for which a permanent magnet shim may be produced, in accordance with some embodiments.

As another example of a permanent magnet, FIG. 19 illustrates a $B_0$ magnet 1900 to which shimming techniques described herein may be applied. $B_0$ magnet 1900 may share design components with $B_0$ magnet 1800 illustrated in FIG. 18. In particular, $B_0$ magnet 1900 is formed by permanent magnets 1910a and 1910b arranged in a bi-planar geometry with a yoke 1920 coupled thereto to capture electromagnetic flux produced by the permanent magnets and transfer the flux to the opposing permanent magnet to increase the flux density between permanent magnets 1910a and 1910b. Each of permanent magnets 1910a and 1910b are formed from a plurality of concentric permanent magnets, as shown by permanent magnet 1910b comprising an outer ring of permanent magnets 1914a, a middle ring of permanent magnets 1914b, an inner ring of permanent magnets 1914c, and a permanent magnet disk 1914d at the center. Permanent magnet 1910a may comprise the same set of permanent magnet elements as permanent magnet 1910b. The permanent magnet material used may be selected depending on the design requirements of the system (e.g., NdFeB, SmCo, etc. depending on the properties desired).

The permanent magnet rings are sized and arranged to produce a relatively homogenous field of a desired strength in the central region (field of view) between permanent magnets 1910a and 1910b. In particular, in the exemplary embodiment illustrated in FIG. 19, each permanent magnet ring comprises a plurality of circular arc segments sized and positioned to produce a desired $B_0$ magnetic field, as discussed in further detail below. In a similar manner to yoke 1820 illustrated in FIG. 18, yoke 1920 is configured and arranged to capture magnetic flux generated by permanent magnets 1910a and 1910b and direct it to the opposing side of the $B_0$ magnet to increase the flux density in between permanent magnets 1910a and 1910b. Yoke 1920 thereby increases the field strength within the field of view of the $B_0$ magnet with less permanent magnet material, reducing the size, weight and cost of the $B_0$ magnet. Yoke 1920 also comprises a frame 1922 and plates 1924a and 1924b that, in a manner similar to that described above in connection with yoke 1920, captures and circulates magnetic flux generated by the permanent magnets 1910a and via the magnetic return path of the yoke to increase the flux density in the field of view of the $B_0$ magnet. The structure of yoke 1920 may be similar to that described above to provide sufficient material to accommodate the magnetic flux generated by the permanent magnets and providing sufficient stability, while minimizing the amount of material used to, for example, reduce the cost and weight of the $B_0$ magnet.

The $B_0$ magnets illustrated in FIGS. 18 and 19 includes yokes that are asymmetric (e.g., yokes 1820 and 1920), as opposed to the symmetric yoke 1720 of the $B_0$ magnet illustrated in FIG. 17. An asymmetric yoke will cause the magnetic field produced by the corresponding B0 magnet for which it captures and focuses magnetic flux to be likewise asymmetric, negatively impacting the uniformity of the $B_0$ magnetic field. For example, in FIGS. 18 and 19, the position of frame 1822/1922 (in particular, legs 1825a/1925a and 1825b/1925b) relative to the permanent magnets 1810a/1910a and 1810b/1910b results in magnetic flux being drawn away from regions proximate the frame, reducing the flux density in these regions. While the effect of the yoke on the magnetic field can be compensated for by varying the dimensions (e.g., the height) of selected permanent magnet circular arc segments, requiring the permanent magnet circular arc segments to be machine or produced at different heights is expensive, significantly increasing the cost of the $B_0$ magnet.

The inventors recognized that the techniques for producing a permanent magnet shim discussed herein may be used to produce a permanent magnet shim to compensate for the effects of the $B_0$ magnetic field by an asymmetric yoke. For example, method 600 illustrated in FIG. 6 and described in the foregoing may be performed to determine a magnet pattern that mitigates and/or substantially eliminates the non-uniformity in the $B_0$ magnet resulting from the yoke. It should be appreciated that correcting for magnetic field non-uniformities resulting from an asymmetric yoke and other non-uniformities, such as those resulting from manufacturing tolerances, may be compensated by the same permanent magnet shim. Specifically, characterizing the $B_0$ magnetic field produced by a $B_0$ magnet with an asymmetric yoke to determine deviation from a desired profile (e.g., performing act 610 of method 600 illustrated in FIG. 6) allows for a magnetic pattern to be determined that, when applied to produce one or more permanent magnet shims, can compensate for non-uniformities in the $B_0$ magnetic field whatever the source. Accordingly, compensating for yoke effects by manufacturing the permanent magnet segments at different heights can be eliminated, thereby reducing the cost and complexity of manufacturing a $B_0$ magnet.

According to some embodiments, one or more permanent magnet shims to compensate for the effects of an asymmetric yoke is produced independent from one or more permanent magnetic shims adapted to compensate for other non-uniformities, such as those resulting from manufacturing tolerances. A magnetic pattern that, when applied to a permanent magnet shim, that compensates for the effect of the yoke may be determined using techniques described above (e.g., by performing method 600). As discussed above, the deviation of the $B_0$ magnetic field from a desired profile may be computed by measuring the $B_0$ magnetic field produced by the $B_0$ magnet or by computing the deviation from the design specification of the $B_0$ magnet and yoke. The inventors have appreciated that there may be some advantages in positioning a permanent magnet shim directly over and on top of the permanent magnets of the $B_0$ coil. For example, for B0 magnets 1800 and 1900, a permanent magnet shim may be placed directly over the permanent magnet rings forming one or both of permanent magnets 1810a/1910a and 1810b/1910b.

FIG. 20 illustrates a magnet pattern 2015 determined for a permanent magnet shim to compensate for the effects of the yoke on the $B_0$ magnetic field. As shown, by tessellating a model having a geometry that corresponds to the permanent magnet rings, a magnetic pattern can be determined that is constrained to area of the underlying permanent magnets. It should be appreciated that this technique can be used to determine a magnetic pattern that is constrained to any desired geometry. Magnetic pattern 2015 includes regions 2027 that contribute to the magnetic field correction and regions 2017 that do not contribute to the magnetic field correction. A potential advantage to independently producing a permanent magnet shim to compensate for yoke effects is that for a given $B_0$ magnet design, the yoke effect will be substantially the same for each manufactured $B_0$ magnet. As a result, permanent magnet shims to compensate for the yoke effect can be pre-made and placed onto the permanent magnetic shim at the manufacturing stage, resulting in cost savings efficiencies.

Figure 21:
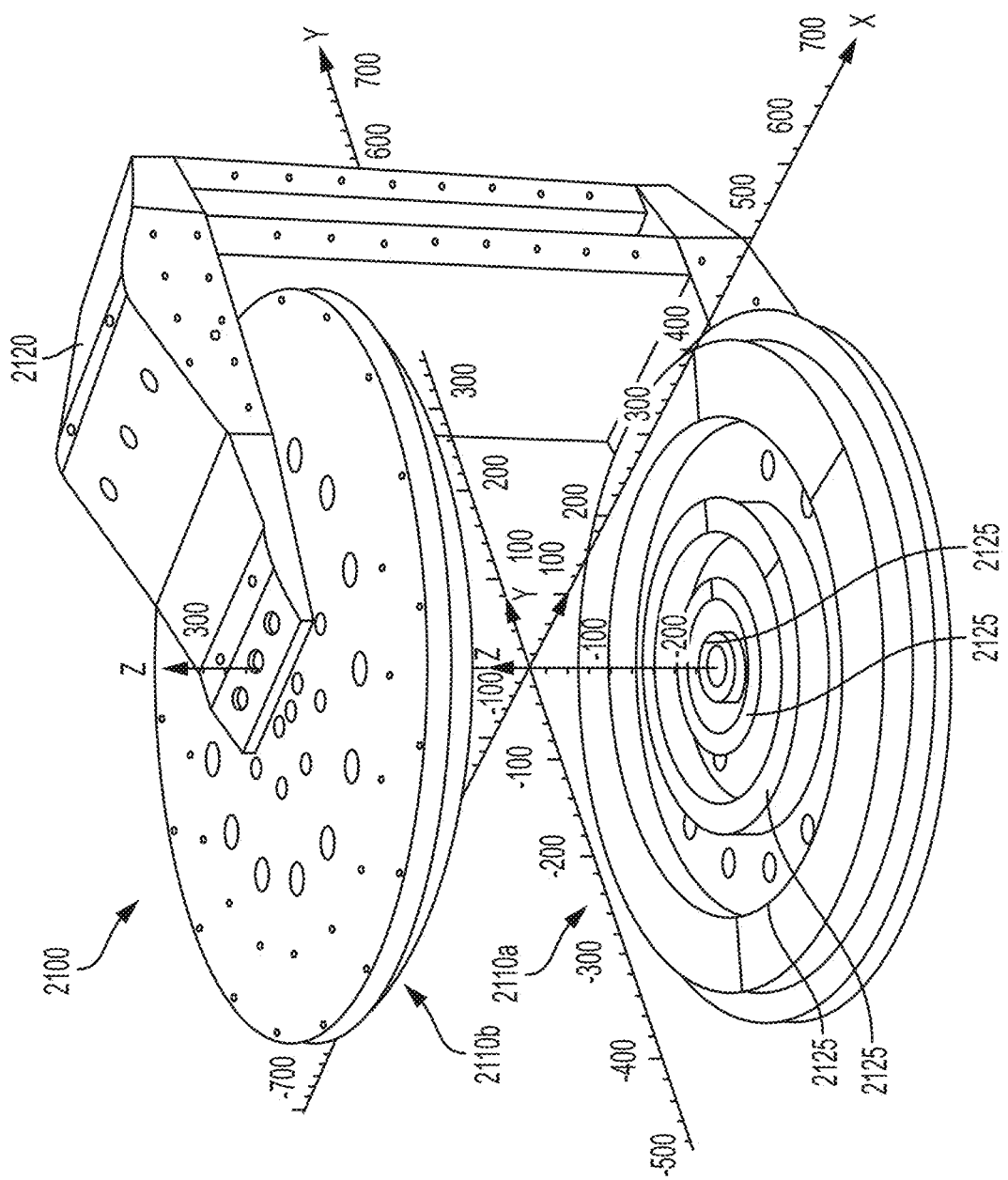
FIG. 21 illustrates a permanent magnet shim, produced by applying the magnetic pattern illustrated in FIG. 20, positioned over the permanent magnet rings of a permanent B0 magnet to compensate for yoke effects, in accordance with some embodiments.
Figure 22:
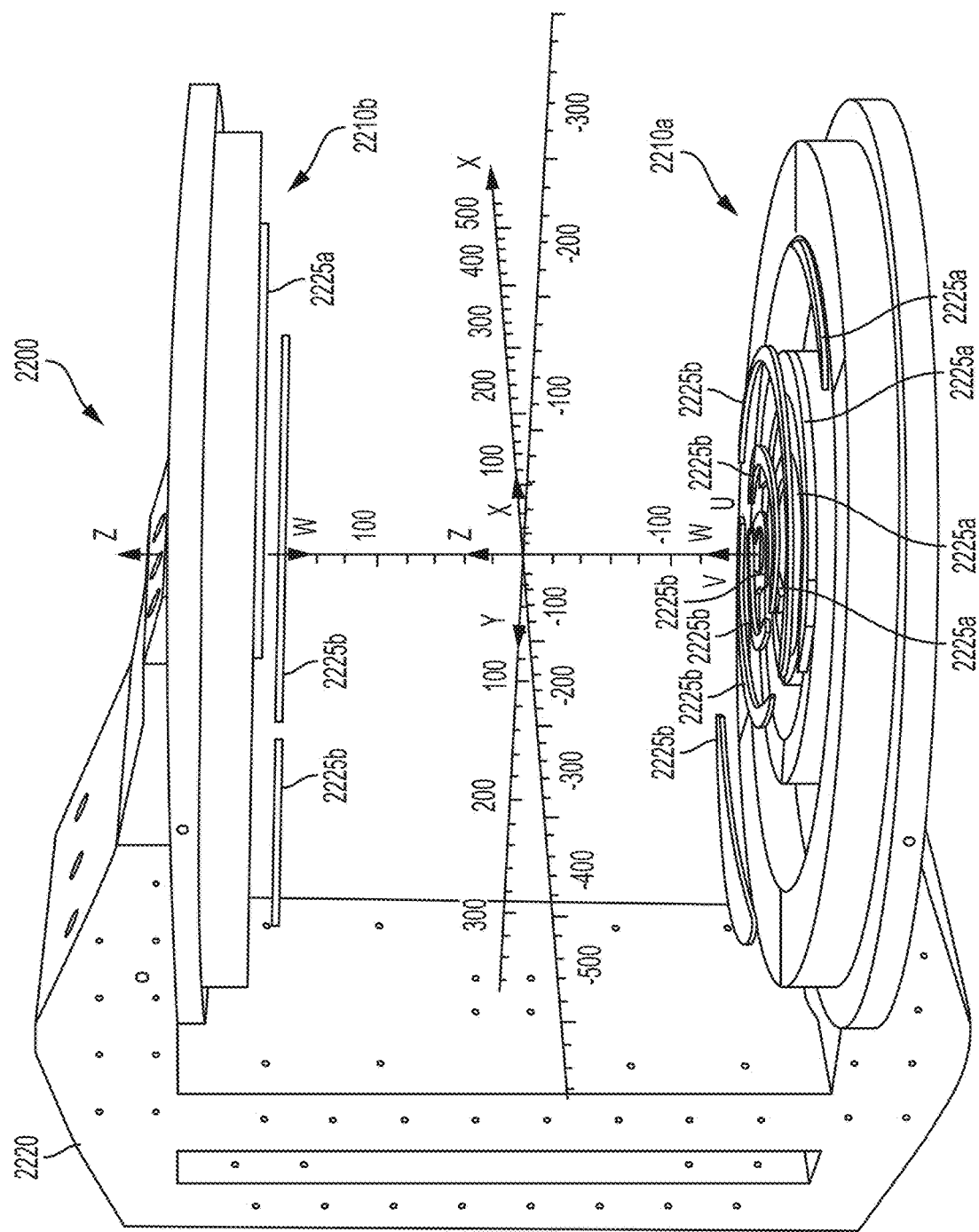
FIG. 22 illustrates a permanent magnet shim, produced by applying the magnetic pattern illustrated in FIG. 20, positioned over the permanent magnet rings of a permanent B0 magnet to compensate for yoke effects and a permanent magnet shim, produced by applying the magnetic pattern in FIG. 15E to correct at least some non-uniformity, in accordance with some embodiments.

FIG. 21 illustrates a permanent magnet shim 2125 produced by applying magnetic pattern 2015 and positioned over permanent magnet rings of $B_0$ magnet 2100 to compensate for non-uniformities resulting from asymmetric yoke 2120. As shown, permanent magnetic shim 2125 aligns with the permanent magnet rings of permanent magnet 2110a. Depending on how the magnetic pattern is determined, a permanent magnet shim may be positioned over permanent magnet 2110b in the manner illustrated. As discussed above, permanent magnet shim 2125 may be pre-made (but need not be) and installed as part of the manufacturing process. Post-manufacturing non-uniformities, which typically vary from magnet to magnet, may then be corrected by producing one or more further permanent magnet shims using the techniques described herein. For example, FIG. 22 illustrates permanent magnet shim 2225a adapted to compensate for yoke effects and permanent magnet shim 2225b adapted to correct for post-manufacturing non-uniformities. Permanent magnet shims 2225a and 2225b are positioned proximate permanent magnets 2210a and 2210b of B0 magnet 2200 to improve the profile of the $B_0$ magnetic field produced.

In addition to non-uniformity in the $B_0$ magnetic field produced by a $B_0$ magnet, manufacturing variability can also result in an offset in the field strength of the $B_0$ magnetic field. For example, the $B_0$ magnetic field may deviate from the desired field strength by being either too low or too high, resulting in a corresponding shift in the Larmor frequency. Accordingly, significant $B_0$ offsets resulting from variability in manufacturing need compensation so that the Larmor frequency better matches the intended operating frequency of the MRI device incorporating the $B_0$ magnet. Conventionally, $B_0$ offsets were frequently corrected using shim coils, typically one or more coils that, when operated, contributed to the $B_0$ magnetic field to either raise or lower the field strength. However, operating shims coils requires power, a disadvantage particularly for portable MRI systems that may be operating on a very limited power budget. The inventors appreciated that $B_0$ offsets may be corrected using one or more permanent magnet shims produced using the techniques described herein. Such permanent magnet shims may be used alone, together and/or in conjunction with, or in replacement of one or more shim coils.

According to some embodiments, method 600 may be performed on a $B_0$ magnet post-production to compensate for a $B_0$ offset in the $B_0$ magnetic field produced by the manufactured $B_0$ magnet. For example, the $B_0$ magnetic field produced by the $B_0$ magnet after manufacturing is characterized to determine a deviation from a desired profile (e.g., by performing act 610 of method 600 illustrated in FIG. 6). A magnetic pattern may be determined based on the determined deviation and the determined magnetic pattern may be applied to produce one or more permanent magnet shims (e.g., by performing acts 620 and 630 in method 600 of FIG. 6.).

It should be appreciated that when the $B_0$ magnetic field is characterized after manufacture and prior to performing other shimming techniques (compensating for yoke effects, $B_0$ offset shim coils, etc.), the magnetic pattern that is determined by performing method 600 may compensate for multiple deficiencies in the profile of a $B_0$ magnetic field. That is, when the $B_0$ magnetic field is characterized will, according to some embodiments, dictate what deviations the determined magnetic pattern provides compensation for. For example, if the $B_0$ magnetic field is characterized prior to other compensation measures, the determined magnetic field may compensate, at least in part, for $B_0$ offset, non-uniformities inherent in or introduced by the design of the $B_0$ magnet (e.g., yoke effects), and non-uniformities arising from the manufacturing process. If the $B_0$ magnetic field is characterized after certain non-uniformities inherent in and/or introduced by the design of the $B_0$ magnet (e.g., yoke effects) have been corrected, but prior to other compensation measures, the determined magnetic pattern may compensate, at least in part, for $B_0$ offset, certain other non-uniformities inherent in or introduced by the design of the $B_0$ magnet, and non-uniformities resulting from manufacturing tolerances. If the $B_0$ magnetic field is characterized after the $B_0$ offset is compensated for (e.g., by measuring the $B_0$ magnetic field while operating one or more shim coils), the determined magnetic pattern may compensate, at least in part, non-uniformities inherent or introduced by the design of the $B_0$ magnet (e.g., yoke effects) and/or non-uniformities caused by manufacturing variability. Accordingly, any one or combination of $B_0$ magnetic field deviations may be at least partially compensated for using the techniques described herein, either separately (by determining separate magnetic patterns for each correction made) or together (e.g., by determining a magnetic pattern that compensates for a combination of deviations).

According to some embodiments, multiple sheets of material are magnetized to produce a desired corrective magnetic field. The inventors have appreciated that magnetizing multiple sheets facilitates producing a magnetic pattern at increased granularity. For example, a given material will have a corresponding remanence that governs the strength of the magnetic field that persists after the material is magnetized. As a result, when a region having a unit volume is magnetized, the resulting magnetic field strength will correspond to the material's remanence. Each additional unit volume will add a discrete amount of additional field strength in relation to the material's remanence. As discussed above, a region of material may be magnetized either positively or negatively or not at all, so that each magnetized region will provide a certain positive or negative magnetic field. By magnetizing multiple sheets and then stacking them on top of one another, finer control of the magnetic field generated may be provided. That is, regions can be magnetized on the multiple sheets such that the effect at a given location can be a desired fraction of the contribution resulting from magnetizing a single sheet. Multiple sheets may also be used to improve the magnetic field correction that results by iteratively magnetizing respective sheets of the multiple sheets to correct for the field produced by the one or more sheets patterned on previous iterations.

Additionally, when multiple layers are utilized, one or more layers (e.g., one or more sheets of magnetic material) may be produced wherein magnetized regions are either magnetized substantially in alignment or substantially in anti-alignment with the $B_0$ magnetic field, and one or more layers may be produced wherein magnetized regions are magnetized substantially in transverse direction(s) to the $B_0$ magnetic field. In this manner, greater and more granular control of the corrective field may be achieved. It should be appreciated that one or more layers (or a single layer in embodiments that utilize a single layer) may be magnetized such that magnetized regions include region(s) magnetized substantially in alignment, substantially in anti-alignment and substantially transverse to the $B_0$ magnetic field, as the pattern of directions of magnetization is not limited in this respect.

As discussed above, the shimming techniques described herein may be applied to produce shims for single-sided planar or bi-planar $B_0$ magnet geometries by, for example, magnetizing a substantially planar sheet of material in a desired pattern. However, the techniques described herein are not limited for use with any particular geometry. For example, shims can be produced using the techniques described herein for use with cylindrical geometries where the imaging region is formed on the inside of a cylindrical bore. According to some embodiments, a flexible magnetic material is used that can be generally shaped to the contour of a desired surface (e.g., a cylindrical surface). In this respect, the flexible magnetic material may be magnetized using any of the techniques described herein to apply a magnetization pattern to the flexible material. The flexible material, once magnetized, can be applied to the desired surface to improve the profile of the $B_0$ magnetic field of the $B_0$ magnet to which it is applied. It should be appreciated that more complicated geometries may be accommodated in this respect by appropriate cutting of the flexible sheets into desired shapes and sizes.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. For example, methods 600, 1100 and/or 1300 may be performed by a computer executing program instructions (e.g., software) that perform one or more of the acts described therein.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of producing a permanent magnet shim configured to improve a profile of a $B_0$ magnetic field produced by a $B_0$ magnet, the method comprising:
   obtaining a deviation of the $B_0$ magnetic field from a desired $B_0$ magnetic field;
   determining a magnetic pattern that, when applied to magnetic material, produces a corrective magnetic field that corrects for at least some of the deviation; and
   applying the magnetic pattern to the magnetic material to produce the permanent magnet shim.

2. The method of claim 1, wherein determining the magnetic pattern comprises logically partitioning the magnetic material into a plurality of regions.

3. The method of claim 2, wherein determining the magnetic pattern comprises determining a magnetic pattern that indicates which of the plurality of regions contribute to the corrective magnetic field.

4. The method of claim 3, wherein determining the magnetic pattern comprises determining a magnetic pattern that indicates a magnetization polarity of regions indicated as contributing to the corrective magnetic field.

5. The method of claim 3, wherein determining the magnetic pattern comprises determining a magnetic pattern that indicates a magnetization strength of regions indicated as contributing to the corrective magnetic field.

6. The method of claim 5, wherein applying the magnetic pattern comprises at least one additive process that provides magnetic material to regions indicated as contributing to the corrective magnetic field in an amount corresponding to the respective indicated magnetization strength.

7. The method of claim 3, wherein determining the magnetic pattern comprises determining a magnetic pattern that indicates which of the plurality of regions do not contribute to the corrective magnetic field.

8. The method of claim 7, wherein applying the magnetic pattern comprises performing at least one subtractive process that removes magnetic material corresponding to regions indicated as not contributing to the corrective magnetic field.

9. The method of claim 8, wherein applying the magnetic pattern comprising cutting the magnetic material to remove regions indicated as not contributing to the corrective magnetic field.

10. The method of claim 3, wherein applying the magnetic pattern comprises performing at least one additive process that provides magnetic material to regions indicated as contributing to the corrective magnetic field.

11. The method of claim 3, wherein applying the magnetic pattern comprises traversing the magnetic material with a magnetizing head that magnetizes each region indicated as contributing to the corrective magnetic field.

12. The method of claim 3, wherein determining the magnetic pattern comprises obtaining a model of the magnetic material, and wherein logically partitioning the magnetic material comprises logically partitioning the model into the plurality of regions.

13. The method of claim 12, wherein determining the magnetic pattern comprises performing an optimization using the model that determines the magnetic pattern.

14. The method of claim 13, wherein logically partitioning the model comprises tessellating the model.

15. The method of claim 14, wherein determining the magnetic pattern comprises repeating the optimization over a plurality of iterations, and wherein for each iteration at least a portion of the model is tessellated at a higher resolution than a previous iteration.

16. The method of claim 2, wherein applying the magnetic pattern to the magnetic material results in at least one of the plurality of regions having a magnetization of a first polarity and at least one of the plurality of regions having a magnetization of a second polarity.

17. The method of claim 16, wherein the first polarity is opposite the second polarity.

18. The method of claim 2, wherein applying the magnetic pattern to the magnetic material results in at least one of the plurality of regions being magnetized in a direction substantially parallel to the $B_0$ magnetic field.

19. The method of claim 2, wherein applying the magnetic pattern to the magnetic material results in at least one of the plurality of regions being magnetized in a direction substantially aligned with the $B_0$ magnetic field.

20. The method of claim 2, wherein applying the magnetic pattern to the magnetic material results in at least one of the plurality of regions being magnetized in a direction substantially opposite to the $B_0$ magnetic field.

21. The method of claim 2, wherein applying the magnetic pattern to the magnetic material results in at least one of the plurality of regions being magnetized in a direction substantially opposite to the $B_0$ magnetic field and at least one of the plurality of regions being magnetized in a direction substantially aligned with the $B_0$ magnetic field.

22. The method of claim 2, wherein the magnetic material comprises a substantially planar surface that is logically partitioned into the plurality of regions, and wherein applying the magnetic pattern to the magnetic material results in at least one of the plurality of regions being magnetized in a direction substantially perpendicular to the planar surface.

23. The method of claim 2, wherein the magnetic material comprises a substantially planar surface that is logically partitioned into the plurality of regions, and wherein applying the magnetic pattern to the magnetic material results in at least one of the plurality of regions being magnetized in a direction substantially parallel to the planar surface.

24. The method of claim 1, wherein the corrective magnetic field corrects for at least some non-uniformities resulting from variability in manufacturing the $B_0$ magnet.

25. The method of claim 1, wherein the corrective magnetic field corrects for at least some non-uniformities inherent in and/or introduced by a design of the B0 magnet.

26. The method of claim 25, wherein the corrective magnetic field corrects for at least some non-uniformities resulting from a presence of a ferromagnetic yoke.

27. The method of claim 1, wherein the corrective magnetic field corrects, at least in part, a $B_0$ offset.

28. The method of claim 1, wherein obtaining the deviation of the $B_0$ magnetic field comprises measuring the $B_0$ magnetic field produced by the $B_0$ magnetic field.

29. The method of claim 1, wherein obtaining the deviation of the $B_0$ magnetic field comprises computing the deviation based on one or more properties of $B_0$ magnet's design.

30. The method of claim 1, wherein obtaining the deviation of the $B_0$ magnetic field comprises retrieving a previously determined deviation.

31. The method of claim 1, wherein the magnetic pattern applied to the magnetic material includes a first plurality of regions having a first magnetization and a second plurality of regions having a second magnetization, different from the first magnetization.

32. The method of claim 31, wherein at least some regions of the first plurality of regions are adjacent to regions of the second plurality of regions.

33. A low-field magnetic resonance imaging system comprising:
- a $B_0$ magnet configured to produce a $B_0$ magnetic field at a field strength of greater than or equal to 50 mT and less than or equal to 100 mT; and
- at least one shim comprising permanent magnet material having a predetermined magnetic pattern applied thereto that produces a corrective magnetic field to improve a profile of the $B_0$ magnetic field.

34. The low-field magnetic resonance imaging system of claim 33, wherein the corrective magnetic field corrects for at least some non-uniformities resulting from variability in manufacturing the $B_0$ magnet.

35. The low-field magnetic resonance imaging system of claim 33, wherein the corrective magnetic field corrects for at least some non-uniformities inherent in and/or introduced by a design of the $B_0$ magnet.

36. The low-field magnetic resonance imaging system of claim 35, wherein the corrective magnetic field corrects for at least some non-uniformities resulting from a presence of a ferromagnetic yoke.

37. The low-field magnetic resonance imaging system of claim 33, wherein the corrective magnetic field corrects, at least in part, a $B_0$ offset.

38. The low-field magnetic resonance imaging system of claim 37, wherein the shim produces a corrective magnetic field to improve the profile of the $B_0$ magnetic field produced by a bi-planar $B_0$ magnet of a low-field magnetic resonance imaging system.

39. The low-field magnetic resonance imaging system of claim 33, wherein the permanent magnet material is logically partitioned into a plurality of regions.

40. The low-field magnetic resonance imaging system of claim 39, wherein at least one of the plurality of regions has a magnetization of a first polarity and at least one of the plurality of regions has a magnetization of a second polarity.

41. The low-field magnetic resonance imaging system of claim 40, wherein the first polarity is opposite the second polarity.

42. The low-field magnetic resonance imaging system of claim 39, wherein at least one of the plurality of regions is magnetized to produce a different field strength than at least one other of the plurality of regions.

43. The low-field magnetic resonance imaging system of claim 39, wherein at least one of the plurality of regions is magnetized in a direction substantially parallel to the $B_0$ magnetic field.

44. The low-field magnetic resonance imaging system of claim 39, wherein at least one of the plurality of regions is magnetized in a direction substantially aligned with the $B_0$ magnetic field.

45. The low-field magnetic resonance imaging system of claim 39, wherein at least one of the plurality of regions is magnetized in a direction substantially opposite to the $B_0$ magnetic field.

46. The low-field magnetic resonance imaging system of claim 39, wherein at least one of the plurality of regions is magnetized in a direction substantially aligned with the $B_0$ magnetic field and at least one of the plurality of regions is magnetized in a direction substantially opposite to the $B_0$ magnetic field.

47. The low-field magnetic resonance imaging system of claim 39, wherein the permanent magnet material comprises a substantially planar surface that is logically partitioned into the plurality of regions, and wherein at least one of the plurality of regions is magnetized in a direction substantially perpendicular to the planar surface.

48. The low-field magnetic resonance imaging system of claim 39, wherein the permanent magnet material comprises a substantially planar surface that is logically partitioned into the plurality of regions, and wherein at least one of the plurality of regions is magnetized in a direction substantially parallel to the planar surface.

49. The low-field magnetic resonance imaging system of claim 39, wherein the plurality of regions are uniform in size.

50. The low-field magnetic resonance imaging system of claim 33, wherein the plurality of regions are not uniform in size.

51. The low-field magnetic resonance imaging system of claim 33, wherein the predetermined magnetic pattern applied to the permanent magnet material includes a first plurality of regions having a first magnetization and a second plurality of regions having a second magnetization, different from the first magnetization.

52. The low-field magnetic resonance imaging system of claim 51, wherein at least some regions of the first plurality of regions are adjacent to regions of the second plurality of regions.

* * * * *